(12) United States Patent
Parkinson et al.

(10) Patent No.: US 12,148,459 B2
(45) Date of Patent: Nov. 19, 2024

(54) CROSS-POINT ARRAY IHOLD READ MARGIN IMPROVEMENT

(71) Applicant: SanDisk Technologies LLC, Addison, TX (US)

(72) Inventors: Ward Parkinson, Boise, ID (US); James O'Toole, Boise, ID (US); Thomas Trent, Tucson, AZ (US); Nathan Franklin, Belmont, CA (US); Michael Grobis, Campbell, CA (US); James W. Reiner, Palo Alto, CA (US); Hans Jurgen Richter, Palo Alto, CA (US); Michael Nicolas Albert Tran, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 249 days.

(21) Appl. No.: 17/677,666

(22) Filed: Feb. 22, 2022

(65) Prior Publication Data
US 2023/0267981 A1    Aug. 24, 2023

(51) Int. Cl.
*G11C 11/16* (2006.01)
*G11C 13/00* (2006.01)
(Continued)

(52) U.S. Cl.
CPC ........ *G11C 11/1673* (2013.01); *G11C 11/161* (2013.01); *G11C 11/1657* (2013.01);
(Continued)

(58) Field of Classification Search
None
See application file for complete search history.

(56) References Cited

U.S. PATENT DOCUMENTS

| 5,506,816 | A | * | 4/1996 | Hirose | ........... G11C 8/14 365/230.06 |
| 6,483,768 | B2 | | 11/2002 | Bohm et al. | |

(Continued)

FOREIGN PATENT DOCUMENTS

| NO | 2012033884 A1 | 3/2012 |
| TW | I625726 B | 6/2018 |
| TW | 202040754 A | 11/2020 |

OTHER PUBLICATIONS

Hughes, A.J., et al., "Control of Holding Currents in Amorphous Threshold Switches," Journal of Non-Crystalline Solids 17, Apr. 1974, 11 pages.

*Primary Examiner* — Huan Hoang
*Assistant Examiner* — Justin Bryce Heisterkamp
(74) *Attorney, Agent, or Firm* — Vierra Magen Marcus LLP

(57) ABSTRACT

Technology for read in a cross-point memory array. Drive transistors pass read and write currents to the cross-point memory array. The read current charges a selected word line to turn on a threshold switching selector of a selected memory cell. While the threshold switching selector is on, the current (read or write) passes through the selected memory cell. The memory system applies a smaller overdrive voltage to a drive transistor when the drive transistor is passing the read current than when the drive transistor is passing the write current. A smaller overdrive voltage increases the resistance of the drive transistor. Increasing the resistance of the drive transistor increases the resistance seen by the threshold switching selector in the selected memory cell, which reduces the Ihold of the threshold switching selector.

20 Claims, 22 Drawing Sheets

(51) Int. Cl.
  *H10N 50/10* (2023.01)
  *H10N 70/20* (2023.01)
(52) U.S. Cl.
  CPC ...... *G11C 11/1659* (2013.01); *G11C 11/1675* (2013.01); *G11C 13/0004* (2013.01); *G11C 13/0028* (2013.01); *G11C 13/003* (2013.01); *G11C 13/004* (2013.01); *G11C 13/0069* (2013.01); *H10N 50/10* (2023.02); *H10N 70/20* (2023.02); *G11C 2013/0045* (2013.01); *G11C 2013/0057* (2013.01); *G11C 2013/0078* (2013.01); *G11C 2213/72* (2013.01); *G11C 2213/76* (2013.01)

(56) References Cited

U.S. PATENT DOCUMENTS

| | | | |
|---|---|---|---|
| 6,639,830 B1 * | 10/2003 | Heide | G11C 11/005 365/158 |
| 6,950,369 B2 | 9/2005 | Kunikiyo et al. | |
| 7,974,116 B2 | 7/2011 | Choi et al. | |
| 7,986,549 B1 | 7/2011 | Tang et al. | |
| 8,120,968 B2 | 2/2012 | Reohr et al. | |
| 9,607,675 B1 * | 3/2017 | Huang | G11C 11/1655 |
| 9,966,123 B2 | 5/2018 | Matsuoka | |
| 10,192,616 B2 | 1/2019 | O'Toole et al. | |
| 10,311,921 B1 * | 6/2019 | Parkinson | G11C 13/0004 |
| 10,460,781 B2 | 10/2019 | Berger et al. | |
| 11,145,737 B2 | 10/2021 | Sharma et al. | |
| 2009/0180310 A1 | 7/2009 | Shimomura et al. | |
| 2010/0165724 A1 | 7/2010 | Pellizzer et al. | |
| 2011/0260232 A1 * | 10/2011 | Scott | H01L 29/7881 438/257 |
| 2014/0112066 A1 | 4/2014 | Chow et al. | |
| 2016/0307625 A1 * | 10/2016 | Lee | G11C 13/0026 |
| 2017/0301396 A1 | 10/2017 | Dhori et al. | |
| 2019/0267082 A1 * | 8/2019 | Parkinson | G11C 11/1693 |
| 2020/0066988 A1 * | 2/2020 | Lee | H01L 21/02417 |
| 2020/0135250 A1 * | 4/2020 | Nobunaga | G11C 13/004 |
| 2021/0027829 A1 * | 1/2021 | Kim | G11C 13/0061 |
| 2021/0027835 A1 * | 1/2021 | Lee | G11C 13/0026 |
| 2021/0151101 A1 | 5/2021 | Lee et al. | |
| 2021/0295890 A1 * | 9/2021 | Takizawa | G11C 11/1693 |
| 2021/0295910 A1 * | 9/2021 | Pellizzer | G11C 13/0028 |
| 2022/0157376 A1 * | 5/2022 | Franklin | G11C 11/1659 |

\* cited by examiner

CROSS-POINT ARRAY IHOLD READ MARGIN IMPROVEMENT

BACKGROUND

Memory is widely used in various electronic devices such as cellular telephones, digital cameras, personal digital assistants, medical electronics, mobile computing devices, non-mobile computing devices, and data servers. Memory may comprise non-volatile memory or volatile memory. A non-volatile memory allows information to be stored and retained even when the non-volatile memory is not connected to a source of power (e.g., a battery).

The memory cells may reside in a cross-point memory array. In a memory array with a cross-point type architecture, one set of conductive lines run across the surface of a substrate and another set of conductive lines are formed over the other set of conductive lines, running over the substrate in a direction perpendicular to the other set of conductive lines. The memory cells are located at the cross-point junctions of the two sets of conductive lines.

A programmable resistance memory cell is formed from a material having a programmable resistance. In a binary approach, the programmable resistance memory cell at each cross-point can be programmed into one of two resistance states: high and low. In some approaches, more than two resistance states may be used. One type of programmable resistance memory cell is a magnetoresistive random access memory (MRAM) cell. An MRAM cell uses magnetization to represent stored data, in contrast to some other memory technologies that use electronic charges to store data. A bit of data is written to an MRAM cell by changing the direction of magnetization of a magnetic element ("the free layer") within the MRAM cell, and a bit is read by measuring the resistance of the MRAM cell (low resistance typically represents a "0" bit and high resistance typically represents a "1" bit).

In a cross-point memory array, each memory cell may contain a threshold switching selector in series with the material having the programmable resistance. The threshold switching selector has a high resistance (in an off or non-conductive state) until it is biased to a voltage higher than its threshold voltage (Vt) or current above its threshold current, and until its voltage bias falls below Vhold ("Voffset") or current below a holding current Ihold. After the Vt is exceeded and while Vhold is exceeded across the threshold switching selector, the threshold switching selector has a low resistance (in an on or conductive state). The threshold switching selector remains on until its current is lowered below a holding current Ihold, or the voltage is lowered below a holding voltage, Vhold. When this occurs, the threshold switching selector returns to the off (higher) resistance state. Accordingly, to program a memory cell at a cross-point, a voltage is applied which is sufficient to turn on the associated threshold switching selector and set or reset the memory cell. To read a memory cell, the threshold switching selector similarly is activated by being turned on before the resistance state of the memory cell can be determined. One example of a threshold switching selector is an Ovonic Threshold Switch (OTS).

One technique for reading a programmable resistance memory cell having a series threshold switching selector in cross-point memory array is a current-force read. A current-force read forces a read current through the memory cell and measures a voltage that appears across the memory cell (including the threshold switching selector) as a result. The measured voltage is representative of the resistance of the memory cell.

To properly read a programmable resistance memory cell, the read current should exceed the hold current Ihold of the threshold switching selector. Otherwise, the resistance of the threshold switching selector may oscillate between on (low resistance) to off (high resistance), thereby making the memory cell's resistance to appear to have high(er) resistance. There can be considerable variations of the Ihold of the threshold switching selector from one memory cell to the next, which can reduce read margin.

One technique to improve the read margin is to increase the read current, which will increase the margin between the read current and Ihold. The read current results in a voltage across the programmable resistance memory cell, which will be referred to as a cell voltage. If the cell voltage is not large enough then the bit error rate can be higher than can be corrected by error correction circuitry. However, if the cell voltage is too high then the programmable resistance memory cell state might be disturbed, resulting in a read error. Therefore, there are constraints on how high the read current can be. If the read current is not adequately greater than Ihold to keep the OTS on during read, the resulting oscillations can make the state of the selected bit appear to be in the high resistance state instead of the low resistance state, resulting in a read error.

Another technique to improve the read margin is to change the semiconductor fabrication process in order to lower Ihold of the threshold switching selector. However, there are limits to how low Ihold can be made to reliably go. Moreover, there may still be considerable variation of the Ihold of the threshold switching selector from one memory cell to the next, which can reduce read margin.

Thus, challenges exist in providing a sufficient read margin for a programmable resistance memory cell having a series threshold switching selector in a cross-point memory array.

BRIEF DESCRIPTION OF THE DRAWINGS

Like-numbered elements refer to common components in the different figures.

DETAILED DESCRIPTION

Figure 1:
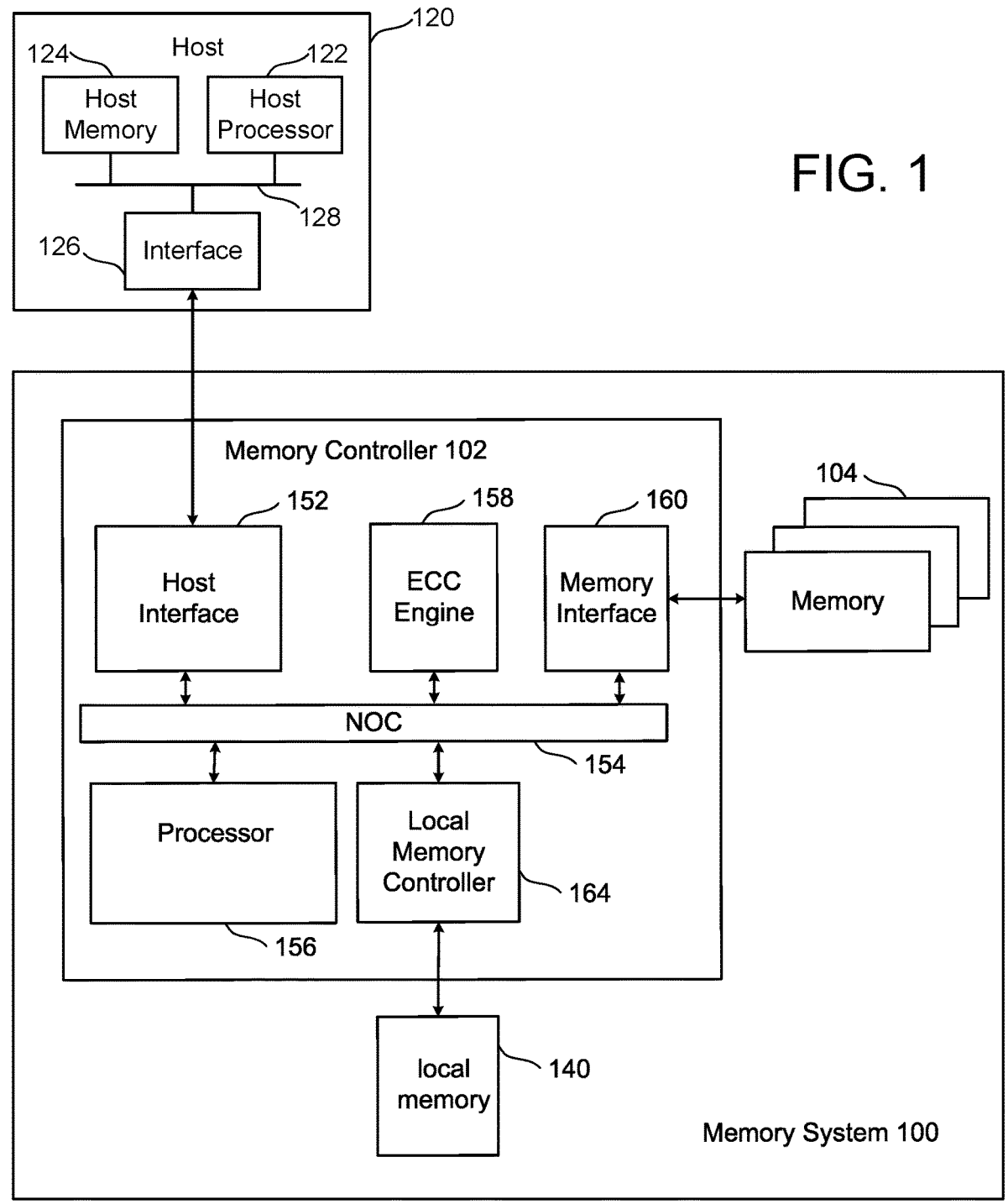
FIG. 1 is a block diagram of one embodiment of a non-volatile memory system connected to a host.

Technology is disclosed herein for operating a cross-point memory array having programmable resistance memory cells. Each programmable resistance memory cell has a programmable resistance memory element in series with a threshold switching selector. The threshold switching selector may be, but is not limited to, an Ovonic Threshold Switch (OTS). In an embodiment, the programmable resistance memory element comprises a magnetoresistive random access memory (MRAM) element. As used herein, direction of magnetization is the direction that the magnetic moment is oriented with respect to a reference direction set by another element of the MRAM ("the reference layer"). In some embodiments, the low resistance is referred to as a parallel or P-state and the high resistance is referred to as an anti-parallel or AP-state. MRAM can use the spin-transfer torque effect to change the direction of the magnetization from P-state to AP-state and vice-versa, which typically requires bipolar (bi-directional write) operation for writes.

In an embodiment, the programmable resistance memory cells are read and written using a current-force technique. The memory system has current generation circuitry that generates a read current and a write current. The read current should not change the state of the memory cell. The write current will program the memory cell to a target state, by which it is meant that the memory cell will be in the target state after programming. In some cases the memory cell may already be in the target state before the write current is applied. For example, applying a write current to an MRAM cell could change the cell from the P-state to the AP-state. However, if the MRAM cell is already in the AP-state, then applying the write current will result in the MRAM cell staying in the AP-state (target state). The write current may be larger than the read current. For example, the read current could be 15 micro-Amperes ($\mu A$) and the write current could be 30 $\mu A$. The Ihold of the threshold switching selectors may be around 10 $\mu A$. These example currents will vary on factors such as the critical dimension (CD). Moreover, there could be variation in the Ihold between the threshold switching selectors due to, for example, unwanted variation of the semiconductor fabrication process or differences in the local resistive or capacitive environment near the OTS.

The memory system has drive transistors that pass the read current and the write current to the cross-point memory array. In an embodiment, the read current will charge up the voltage on a selected word line in order to turn on the threshold switching selector of the selected memory cell. While the threshold switching selector is on, the current (read or write) may pass through a selected memory cell. The selected memory cell is connected between a selected word line and a selected bit line. For example, a selected drive transistor may drive a read current into the selected word line, through the selected memory cell, and through the selected bit line. In an embodiment, the memory system applies a smaller overdrive voltage (Von) to the selected drive transistor when the selected drive transistor is passing the read current than when the selected drive transistor is passing the write current. For example, the memory system may apply a 2.3V overdrive voltage to the selected drive transistor when the write current is passed by the selected drive transistor, whereas the memory system may apply a 1.3V overdrive voltage to the selected drive transistor when the read current is passed by the selected drive transistor.

Using a smaller overdrive voltage on the WL select drive transistor in connection with passing the read current increases the resistance of the drive transistor which improves read margin. For example, increasing the resistance of the drive transistor may increase the resistance seen by the threshold switching selector in the selected memory cell, which may reduce the Ihold of the threshold switching selector. Reducing the Ihold of the threshold switching selector improves read margin. For example, reducing the Ihold will increase the difference between the read current and Ihold, thereby improving read margin. Also note that improving the read margin allows a smaller magnitude read current to be used, which reduces stress on the programmable resistance memory cell.

In one embodiment, one or more word lines that neighbor the selected word line are floated during a read operation of a programmable resistance memory cell, which improves read margin. Floating the neighbor word line(s) decreases the capacitance seen by the threshold switching selector in the selected memory cell, which reduces the Ihold of the threshold switching selector. As noted above, reducing the Ihold of the threshold switching selector improves read margin.

As noted, the reads may be current-force reads. In an embodiment of a current-force read, a memory cell is accessed by forcing a current through the selected word line while applying a select voltage (e.g., high or low power suppl) to a selected bit line, such as a high or low power supply. The access current flows through a portion of the selected word line, through the selected memory cell, and also through a portion of the selected bit line; and through each of the respective decode circuitry. A voltage will appear across the selected memory cell in response to the access current. The voltage across the selected memory cell will depend on the magnitude of the access current and the resistance of the memory cell. Hence, the voltage across the selected memory cell is representative of the resistance of the memory cell.

One conventional approach forces a voltage across a memory cell and samples a resulting memory cell current to read programmable resistance memory cells such as MRAM cells. Using such a voltage-force approach to read an MRAM cell in series with a threshold switching selector can be problematic. One problem is the voltage-force read technique does not compensate for variations in the voltage drops across threshold switching selectors when they are in the on-state. The on-state voltage drop is also called the "offset voltage". A current-force approach can compensate for offset voltage variations in such threshold switching selectors. A current-force approach can also compensate for issues such as voltage drop across the selected word line and the selected bit line due to variation in resistances of the word line and bit line depending on decoded position in the array.

As noted, issues such as variations of the OTS (electrical properties) can reduce read margin. One way to deal with this issue is to use a larger current to read the memory cell. For example, in order to successfully read an MRAM cell, there should be a sufficiently large current forced through the memory cell. Alternatively, there should be a sufficiently large voltage forced across the memory cell to successfully read an MRAM cell. Both the current-force and the voltage-force techniques result in a voltage across the memory cell, which will now be referred to as a cell voltage. If the cell voltage is not large enough then the bit error rate can be higher than can be corrected by error correction circuitry. However, if the cell voltage is too high then undue stress is placed on the programmable resistance memory cell and reduces endurance, or even flips the bit into the opposite state (read disturb). In some embodiment, the current-force read limits the voltage that can appear across the memory cell by clamping the voltage that can appear across the MRAM cell.

As noted above, in an embodiment, the memory system applies a smaller overdrive voltage (Von) to the selected drive transistor when the selected drive transistor is passing the read current than when the selected drive transistor is passing the write current. The read current may be used during a referenced read or a self-referenced read (SRR). In an embodiment of a current force referenced read, the voltage that appears across the programable resistance memory cell as a result of forcing the read current through the memory cell is sampled. The sampled voltage is compared to a reference voltage. The memory cell's state is determined based on whether the sample voltage is higher or lower than the reference voltage. An embodiment of a current force SRR, includes a first read, a write to a known state, and a second read. The first read will sample the voltage that appears across the programable resistance memory cell as a result of forcing a read current through the memory cell. The sampled voltage is stored. The stored voltage may be adjusted (for example up or down by 150 mv) for comparison to a later read. Then, the memory cell is written to a known state. For example, an MRAM memory cell may be written to the AP state. The second read will sample the voltage that appears across the programable resistance memory cell as a result of forcing the read current through the memory cell. The second sampled voltage compared to the adjusted first sampled voltage to determine the original state of the memory cell. If the write to the known state changed the state of the cell, then the memory cell is written back to its original state unless a subsequent write command is to the existing state after SRR.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable tolerance for a given application.

FIG. 1 is a block diagram of one embodiment of a non-volatile memory system (or more briefly "memory system") 100 connected to a host system 120. Memory system 100 can implement the technology presented herein for improving read margin in a cross point array. In an embodiment, the memory cells have a programmable resistance memory element (e.g., MRAM element) in series with a threshold switching selector such as an OTS. Many different types of memory systems can be used with the technology proposed herein. Example memory systems include dual in-line memory modules (DIMMs), solid state drives ("SSDs"), memory cards and embedded memory devices; however, other types of memory systems can also be used.

Memory system 100 of FIG. 1 comprises a memory controller 102, memory 104 for storing data, and local memory 140 (e.g., MRAM, ReRAM, DRAM). The local memory 140 may be non-volatile and retain data after power off. Or local memory 140 may be volatile or non-volatile and not be expected to retain data after power off by reloading it from data after power-up, e.g. DRAM or a DRAM replacement. Here, for example, the local memory 140 may be MRAM but it may not be required to retain data after power-off, or may if additional circuitry is added to the chip. In one embodiment, memory controller 102 and/or local memory controller 164 provides access to programmable resistance memory cells in a cross-point array in local memory 140. For example, memory controller 102 may provide for access in a cross-point array of MRAM cells in local memory 140. In another embodiment the memory controller 102 or interface 126 or both are eliminated and the memory packages are connected directly to the host 120 through a bus such as DDRn. Or they are connected to a Host memory management unit (MMU). In another instance, the memory controller 102 or portions are moved onto the Memory 104 for direct connection of the Memory 104 to the Host, such as by providing parity bits, ECC, and wear level on the Memory along with an DDRn interface to/from the Host or MMU. The term memory system, as used throughout this document, is not limited to memory system 100. For example, the local memory 140 or the combination of local memory 140 and memory controller 164 could be considered to be a memory system. Likewise, host memory 124 or the combination of host processor 122 and host memory 124 considered to be a memory system.

The components of memory system 100 depicted in FIG. 1 are electrical circuits. The memory controller 102 has host interface 152, processor 156, ECC engine 158, memory interface 160, and local memory controller 164. The host interface 152 is connected to and in communication with host 120. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., MRAM). In other embodiments, local high speed memory 140 can be DRAM, SRAM or another type of volatile memory.

ECC engine 158 performs error correction services. For example, ECC engine 158 performs data encoding and decoding for error correction of the data fetched from memory 140 or 104. In one embodiment, ECC engine 158 is an electrical circuit programmed by software. For example, ECC engine 158 can be a processor that can be programmed. In other embodiments, ECC engine 158 is a custom and dedicated hardware circuit without any software. In one embodiment, the function of ECC engine 158 is implemented by processor 156. In one embodiment, local memory 140 has an ECC engine with or without a wear level engine. In one embodiment, memory 104 has an ECC engine with or without a wear level engine.

Processor 156 performs the various controller memory operations, such as programming, erasing, reading, and memory management processes including wear level. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 102 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory 104 and a subset of the L2P tables are cached (L2P cache) in the local high speed memory 140.

Memory interface 160 communicates with non-volatile memory 104. In an embodiment, non-volatile memory 104 contains programmable resistance memory cells in a cross-point array. In one embodiment, memory interface provides a Toggle Mode interface. Other interfaces can also be used. In some example implementations, memory interface 160 (or another portion of controller 102) implements a scheduler and buffer for transmitting data to and receiving data from one or more memory die.

In one embodiment, local memory 140 has an ECC engine. Local memory 140 may perform other functions such as wear leveling. Further details of on-chip memory maintenance are described in U.S. Pat. No. 10,545,692, titled "Memory Maintenance Operations During Refresh Window", and U.S. Pat. No. 10,885,991, titled "Data Rewrite During Refresh Window", both of which are hereby incorporated by reference in their entirety. If the time allowed for reading the local memory 140 is consistently less than a worst case limit (and therefore allows for both first read/sample/store/and SRR), the memory is synchronous. If a handshake is used, the memory is asynchronous and requires a handshake so that faster or slower latency of forced current referenced read can be signaled for latency. In another embodiment, the forced current referenced read is always used with a fixed reference without the added write and read of SRR cycles, so the chip can be used synchronously at this faster latency in direct replacement of DRAM in DDRn interface directly to host. With the fixed level read (Fast Read) or self-referenced read (SRR), the BER must be adequately low after ECC on or off-chip so that all errors are within the capacity to correct of the ECC engine(s) applied on or off chip, or both.

In one embodiment, memory 104 comprises a plurality of memory packages. Each memory package includes one or more memory die. Therefore, memory controller 102 is connected to one or more memory die. In one embodiment, the memory package can include types of memory, such as storage class memory (SCM) based on programmable resistance random access memory (such as ReRAM, MRAM, FeRAM or RRAM) or a phase change memory (PCM). In one embodiment, memory controller 102 provides access to memory cells in a cross-point array in a memory package 104.

Memory controller 102 communicates with host system 120 via an interface 152 that implements a protocol such as, for example, Compute Express Link (CXL). Or such controller can be eliminated and the memory packages can be placed directly on the host bus, DDRn for example. For working with memory system 100, host system 120 includes a host processor 122, host memory 124, and interface 126 connected along bus 128. Host memory 124 is the host's physical memory, and can be DRAM, SRAM, ReRAM, MRAM, non-volatile memory, or another type of storage. In an embodiment, host memory 124 contains a cross-point array of programmable resistance memory cells, with each memory cell comprising a programmable resistance memory element and a two terminal threshold selector element in series with the memory element.

Host system 120 is external to and separate from memory system 100. In one embodiment, memory system 100 is embedded in host system 120. Host memory 124 may be referred to herein as a memory system. The combination of the host processor 122 and host memory 124 may be referred to herein as a memory system. In an embodiment, such host memory can be cross-point memory using MRAM.

Figure 2A:
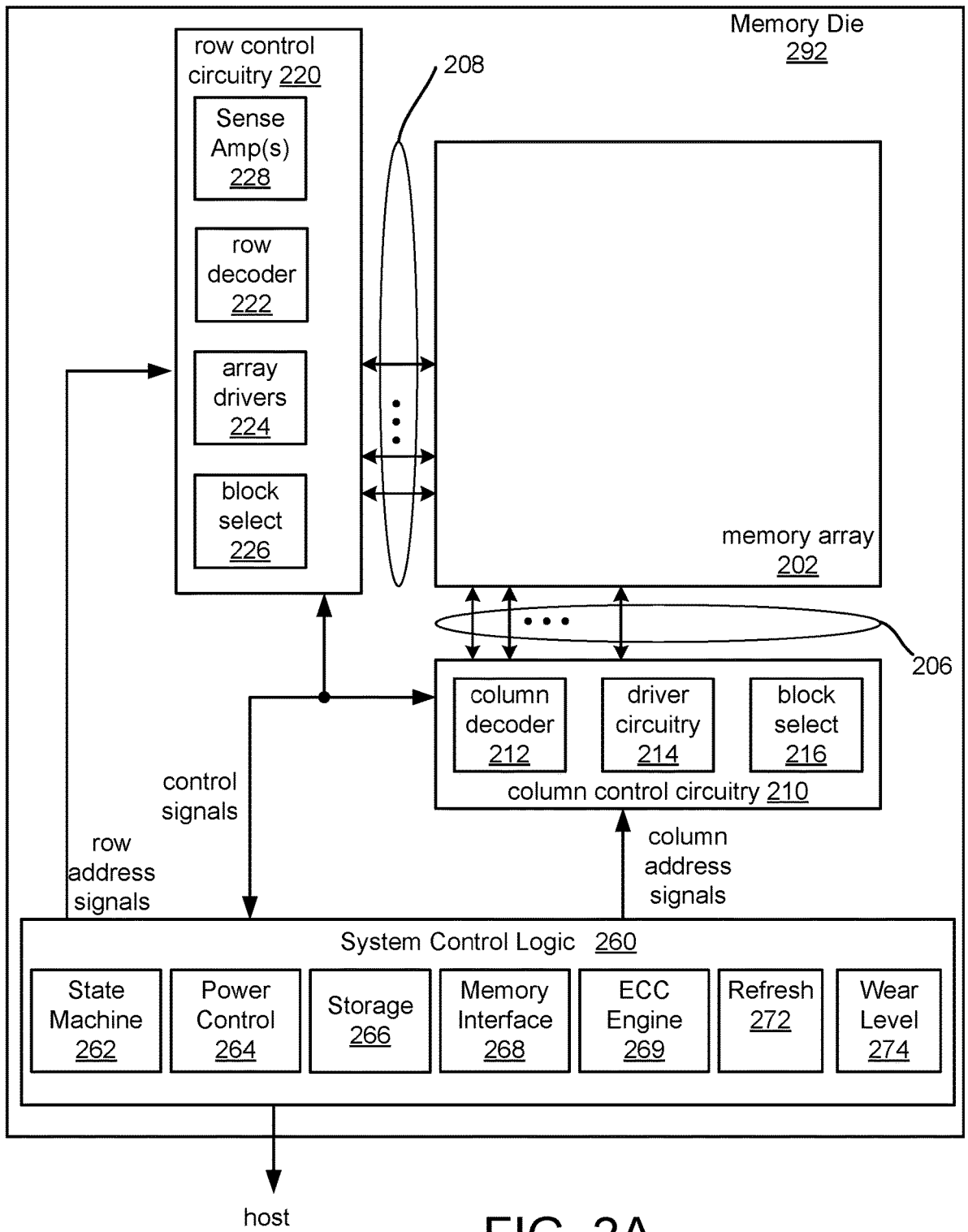
FIG. 2A is a block diagram of one embodiment of a memory die.

FIG. 2A is a block diagram that depicts one example of a memory die 292 that can implement the technology described herein. In one embodiment, memory die 292 is included in local memory 140, and in embodiment another in Memory 104. In one embodiment, memory die 292 is included in host memory 124. Memory die 292 includes a memory array 202 that can include any of memory cells described in the following. The array terminal lines of memory array 202 include the various layer(s) of word lines organized as rows, and the various layer(s) of bit lines organized as columns. However, other orientations can also be implemented. Memory die 292 includes row control circuitry 220, whose outputs 208 are connected to respective word lines of the memory array 202. Row control circuitry 220 receives a group of M row address signals and one or more various control signals from System Control Logic circuit 260, and typically may include such circuits as row decoders 222, row drivers 224, and block select circuitry 226 for both reading and writing operations. Row control circuitry 220 may also include read/write circuitry. In an embodiment, row decode and control circuitry 220 has sense amplifiers 228, which each contain circuitry for sensing a condition (e.g., voltage) of a word line of the memory array 202. In an embodiment, by sensing a word line voltage, a condition of a memory cell in a cross-point array is determined. Memory die 292 also includes column decode and control circuitry 210 whose input/outputs 206 are connected to respective bit lines of the memory array 202. Although only single block is shown for array 202, a memory die can include multiple arrays or "tiles" that can be individually accessed. Column control circuitry 210 receives a group of N column address signals and one or more various control signals from System Control Logic 260, and typically may include such circuits as column decoders 212, column decoders and drivers 214, block select circuitry 216, as well as read/write circuitry, and I/O multiplexers.

System control logic 260 receives data and commands from a host system and provides output data and status to the host system. In other embodiments, system control logic 260 receives data and commands from a separate controller circuit and provides output data to that controller circuit, with the controller circuit communicating with the host system. Such controller system implement an interface such as DDR, DIMM, CXL, PCIe and others. In another embodiment those data and commands are sent and received directly from the memory packages to the Host without a separate controller, and any controller needed is within each die or within a die added to a multi-chip memory package. In some embodiments, the system control logic 260 can include a state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor. The system control logic 260 can also include a power control module 264 that controls the power, current source currents, and voltages supplied to the rows and columns of the memory 202 during memory operations and may include charge pumps and regulator circuit for creating regulating voltages, and on/off control of each for word line bit line selection of the memory cells. System control logic 260 includes storage 266, which may be used to store parameters for operating the memory array 202. System control logic 260 also includes refresh logic 272 and wear leveling logic 274. Such system control logic may be commanded by the host 120 or memory controller 102 to refresh logic 272, which shall load an on-chip stored row and column address (Pointer) which may be incremented after refresh. Such address bit(s) may be selected only (to refresh the OTS). Or such address may be read, corrected by steering through ECC engine 269, and then stored in a "spare" location which is also being incremented (so all codewords are periodically read, corrected, and relocated in the entire chip under control of wear leveling logic 274) to in effect wear level so use of each bit across the chip is more uniform. Such operation may be more directly controlled by the host of an external controller, for example a PCIe or CXL controller located separately from the memory chip or on the memory die.

Commands and data are transferred between the memory controller 102 and the memory die 292 via memory controller interface 268 (also referred to as a "communication interface"). Such interface may be PCIe, CXL, DDRn for example. Memory controller interface 268 is an electrical interface for communicating with memory controller 102. Examples of memory controller interface 268 also include a Toggle Mode Interface. Other I/O interfaces can also be used. For example, memory controller interface 268 may implement a Toggle Mode Interface that connects to the Toggle Mode interfaces of memory interface 228/258 for memory controller 102. In one embodiment, memory controller interface 268 includes a set of input and/or output (I/O) pins that connect to the controller 102. In another embodiment, the interface is JEDEC standard DDRn or LPDDRn, such as DDR5 or LPDDR5, or a subset thereof with smaller page and/or relaxed timing.

System control logic 260 located in a controller on the memory die in the memory packages may include Error Correction Code (ECC) engine 269. ECC engine 269 may be referred to as an on-die ECC engine, as it is on the same semiconductor die as the memory cells. That is, the on-die ECC engine 269 may be used to encode data that is to be stored in the memory array 202, and to decode the decoded data and correct errors. The encoded data may be referred to herein as a codeword or as an ECC codeword. ECC engine 269 may be used to perform a decoding algorithm and to perform error correction. Hence, the ECC engine 269 may decoded the ECC codeword. In an embodiment, the ECC engine 269 is able to decode the data more rapidly by direct decoding without iteration.

Having the ECC engine 269 on the same die as the memory cells allows for faster decoding. The ECC engine 269 can use a wide variety of decoding algorithms including, but not limited to, Reed Solomon, a Bose-Chaudhuri-Hocquenghem (BCH), and low-density parity check (LDPC). In an embodiment, the ECC engine 269 is able to determine or estimate a number of bit errors in a codeword prior to decoding the codeword. In an embodiment, the ECC engine 269 calculates the syndrome of the codeword in order to estimate the number of bit errors in the codeword. In an embodiment, the ECC engine 269 is capable of decoding a codeword provided that there are no more than a certain number of bits in error in the codeword.

In some embodiments, all of the elements of memory die 292, including the system control logic 260, can be formed as part of a single die. In other embodiments, some or all of the system control logic 260 can be formed on a different die.

In one embodiment, memory structure 202 comprises a three-dimensional memory array of non-volatile or volatile memory cells in which multiple memory levels are formed above a single substrate, such as a wafer. The memory structure may comprise any type of non-volatile or volatile memory that are monolithically formed in one or more physical levels of memory cells having an active area disposed above a silicon (or other type of) substrate. In another embodiment, memory structure 202 comprises a two-dimensional memory array of non-volatile memory cells.

The exact type of memory array architecture or memory cell included in memory structure 202 is not limited to the examples above. Many different types of memory array architectures or memory technologies can be used to form memory structure 326. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM or MRAM cross-point memory includes programmable resistance switching elements in series with and OTS selector arranged in cross-point arrays accessed by X lines and Y lines (e.g., word lines and bit lines). In another embodiment of cross-point is PCM in series with and OTS selector. In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive random access memory (MRAM) stores data using magnetic storage elements. The elements are formed from two ferromagnetic layers, each of which can hold a magnetization, separated by a thin insulating layer. For a field-controlled MRAM, one of the two layers is a permanent magnet set to a particular polarity; the other layer's magnetization can be changed to match that of an external field to store memory. Other types of MRAM cells are possible. A memory device may be built from a grid of MRAM cells. In one embodiment for programming, each memory cell lies between a pair of write lines arranged at right angles to each other, parallel to the cell, one above and one below the cell. For some MRAM cells, when current is passed through them, an induced magnetic field is created. MRAM based memory embodiments will be discussed in more detail below.

Phase change memory (PCM) exploits the unique behavior of chalcogenide glass. One embodiment uses a GeTe-Sb2Te3 super lattice to achieve non-thermal phase changes by simply changing the co-ordination state of the Germanium atoms with a laser pulse (or light pulse from another source). The memory cells are programmed by current pulses that can change the co-ordination of the PCM material or switch it between amorphous and crystalline states. Note that the use of "pulse" in this document does not require a square pulse but includes a (continuous or non-continuous) vibration or burst of sound, current, voltage light, or other wave. And the current forced for write can, for example, be driven rapidly to a peak value and then linearly ramped lower with, for example, a 200 ns edge rate. Such peak current force may be limited by a zoned voltage compliance that varies by position of the memory cell along the word line or bit line. In an embodiment, a phase change memory cell has a phase change memory element in series with a threshold switching selector such as an OTS.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts, the memory structure 202 and the peripheral circuitry, including all of the other elements. An important characteristic of a memory circuit is its capacity, which can be increased by increasing the area of the memory die 292 that is given over to the memory structure 202; however, this reduces the area of the memory die available for the peripheral circuitry or increases cost which is related to chip area. This can place quite severe restrictions on these peripheral elements. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die 292 is the amount of area to devote to the memory structure 202 and the amount of area to devote to the peripheral circuitry. Such tradeoffs may result in more IR drop from use of larger x-y arrays of memory between driving circuits on the word line and bit line, which in turn may be benefit more from use of voltage limit and zoning of the voltage compliance by memory cell position along the word line and bit line.

Another area in which the memory structure 202 and the peripheral circuitry are often at odds is in the processing involved in forming these regions, since these regions often involve differing processing technologies and the trade-off in having differing technologies on a single die. For example, elements such as sense amplifier circuits, charge pumps, logic elements in a state machine, and other peripheral circuitry in system control logic 260 often employ PMOS devices. In some cases, the memory structure will be based on CMOS devices. Processing operations for manufacturing a CMOS die will differ in many aspects from the processing operations optimized for NMOS-only technologies.

Figure 2B:
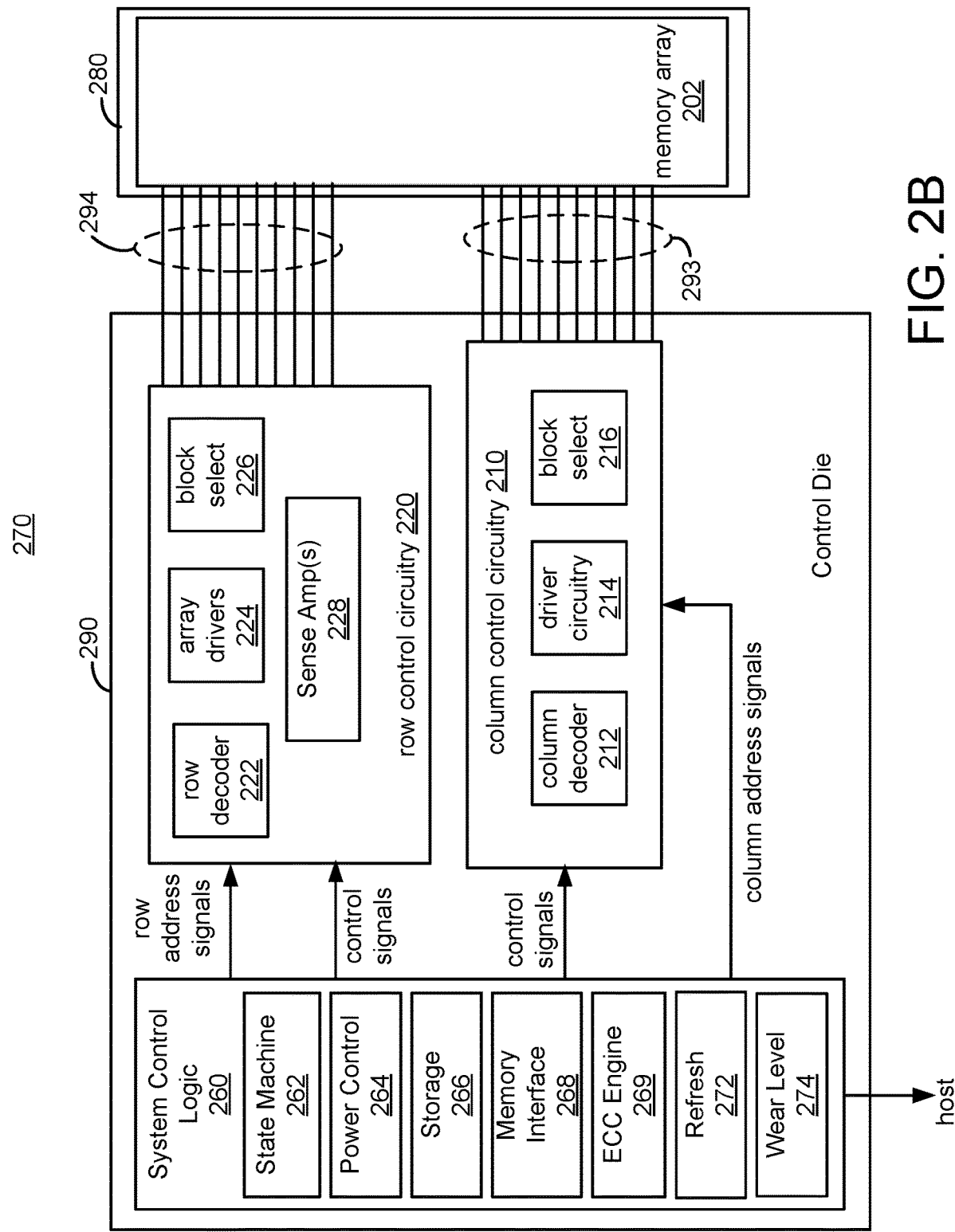
FIG. 2B is a block diagram of one embodiment of an integrated memory assembly containing a control die and a memory structure die.

To improve upon these limitations, embodiments described below can separate the elements of FIG. 2A onto separately formed die that are then bonded together. FIG. 2B depicts an integrated memory assembly 270 having a memory structure die 280 and a control die 290. The memory structure 202 is formed on the memory structure die 280 and some or all of the peripheral circuitry elements, including one or more control circuits, are formed on the control die 290. For example, a memory structure die 280 can be formed of just the memory elements, such as the array of memory cells of MRAM memory, PCM memory, ReRAM memory, or other memory type. Some or all of the peripheral circuitry, even including elements such as decoders and sense amplifiers, can then be moved on to the control die. This allows each of the semiconductor die to be optimized individually according to its technology. This allows more space for the peripheral elements, which can now incorporate additional capabilities that could not be readily incorporated were they restricted to the margins of the same die holding the memory cell array. The two die can then be bonded together in a bonded multi-die integrated memory assembly, with the array on the one die connected to the periphery elements on the other die. Although the following will focus on an integrated memory assembly of one memory die and one control die, other embodiments can use additional die, such as two memory die and one control die, for example.

As with 202 of FIG. 2A, the memory structure die 280 in FIG. 2B can include multiple independently accessible arrays or "tiles." System control logic 260, row control circuitry 220, and column control circuitry 210 are located in control die 290. In some embodiments, all or a portion of the column control circuitry 210 and all or a portion of the row control circuitry 220 are located on the memory structure die 280. In some embodiments, some of the circuitry in the system control logic 260 is located on the on the memory structure die 280.

FIG. 2B shows column control circuitry 210 on the control die 290 coupled to memory structure 202 on the memory structure die 280 through electrical paths 293. For example, electrical paths 293 may provide electrical connection between column decoder 212, column driver circuitry 214, and block select 216 and bit lines of memory structure 202. Electrical paths may extend from column control circuitry 210 in control die 290 through pads on control die 290 that are bonded to corresponding pads of the memory structure die 280, which are connected to bit lines of memory structure 202. Each bit line of memory structure 202 may have a corresponding electrical path in electrical paths 293, including a pair of bond pads, which connects to column control circuitry 210. Similarly, row control circuitry 220, including row decoder 222, row drivers 224, block select 226, and sense amplifiers 228 are coupled to memory structure 202 through electrical paths 294. Each of electrical path 294 may correspond to, for example, a word line. Additional electrical paths may also be provided between control die 290 and memory structure die 280.

For purposes of this document, the phrase "a control circuit" can include one or more of memory controller 102 (or one or more of local memory controller 164, processor 156 ECC engine 158, host interface 152 and/or memory interface 160), system control logic 260, column control circuitry 210, row control circuitry 220, host processor 122, a micro-controller, a state machine, and/or other control circuitry, or other analogous circuits that are used to control non-volatile memory. The control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit. Such control circuitry may include drivers such as direct drive via connection of a node through fully on transistors (gate to the power supply) driving to a fixed voltage such as a power supply. Such control circuitry may include a current source driver.

For purposes of this document, the term "apparatus" can include, but is not limited to, one or more of host system 120, the combination of host processor 122 and host memory 124, host memory 124, memory system 100, memory controller 102, local memory 140, the combination of local memory controller 164 and/or memory controller 102 and local memory 140, memory package 104, memory die 292, integrated memory assembly 270, and/or control die 290.

In the following discussion, the memory array 202 of FIGS. 2A and 2B will be discussed in the context of a cross-point architecture. In a cross-point architecture, a first set of conductive lines or wires, such as word lines, run in a first direction relative to the underlying substrate and a second set of conductive lines or wires, such a bit lines, run in a second direction relative to the underlying substrate. The memory cells are sited at the intersection of the word lines and bit lines. The memory cells at these cross-points can be formed according to any of a number of technologies, including those described above. The following discussion will mainly focus on embodiments based on a cross-point architecture using MRAM memory cells, each in series with a threshold switching selector such as Ovonic Threshold Switch (OTS) to comprise a selectable memory bit. However, embodiments are not limited to a cross-point architecture having MRAM cells each with a series OTS selector.

Figure 3A:
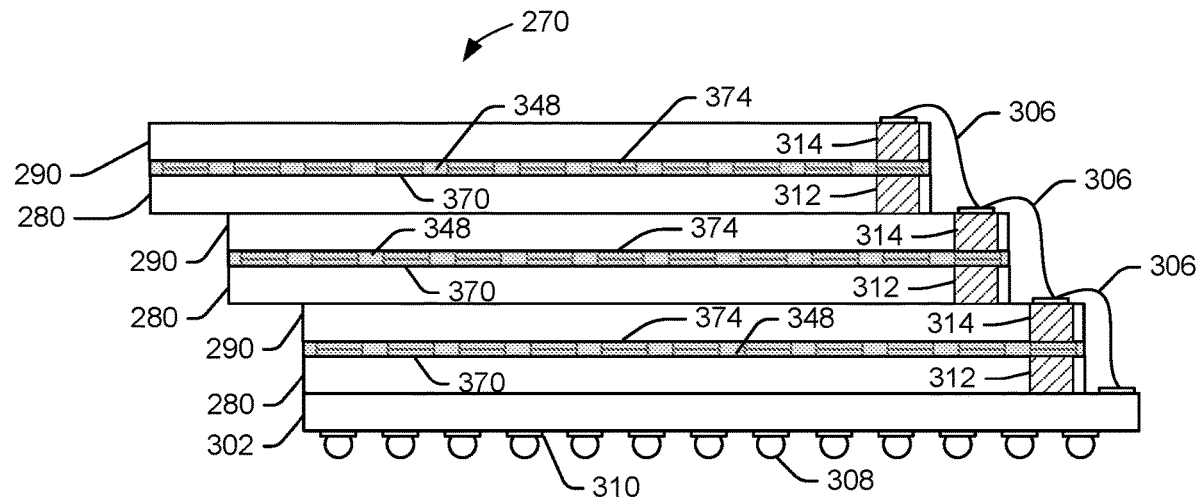
FIG. 3A depicts a side view of an embodiment of an integrated memory assembly stacked on a substrate.

In some embodiments, there is more than one control die 290 and more than one memory structure die 280 in an integrated memory assembly 270. In some embodiments, the integrated memory assembly 270 includes a stack of multiple control die 290 and multiple memory structure die 280. FIG. 3A depicts a side view of an embodiment of an integrated memory assembly 270 stacked on a substrate 302 (e.g., a stack comprising control die 290 and memory structure die 280). The integrated memory assembly 270 has three control die 290 and three memory structure die 280. In some embodiments, there are more than three memory structure die 280 and more than three control die 290.

Each control die 290 may be affixed (e.g., bonded) to at least one of the memory structure die 280. Each control die 290 has a number of bond pads 374 on a major surface of the control die 290. Each memory structure die 280 has a number of bond pads 370 on a major surface of the memory structure die 280. Note that there are bond pad pairs 370/674. In one embodiment, the pattern of bond pads 370 matches the pattern of bond pads 374. In some embodiments, bond pads 370 and/or 374 are flip-chip bond pads. Thus, the bond pads 370, 374 electrically and physically couple the memory structure die 280 to the control die 290. Also, the bond pads 370, 374 permit internal signal transfer between the memory structure die 280 and the control die 290. Thus, the memory structure die 280 and the control die 290 are bonded together with bond pads.

The bond pads 370, 374 may be formed for example of copper, aluminum, and alloys thereof. There may be a liner 348 between the bond pads 370, 374 and the major surfaces. The liner may be formed for example of a titanium/titanium nitride stack. The bond pads 370, 374 and liner may be applied by vapor deposition and/or plating techniques. The bond pads and liners together may have a thickness of 720 nm, though this thickness may be larger or smaller in further embodiments.

The bond pads allow for internal signal transfer. Herein, "internal signal transfer" means signal transfer between the control die 290 and the memory structure die 280. The internal signal transfer permits the circuitry on the control die 290 to control memory operations in the memory structure die 280. Therefore, the bond pads 370, 374 may be used for memory operation signal transfer. Herein, "memory operation signal transfer" refers to any signals that pertain to a memory operation in a memory structure die 280. A memory operation signal transfer could include, but is not limited to, providing a voltage, providing a current, receiving a voltage, receiving a current, sensing a voltage, and/or sensing a current.

There may be many more bond pads than depicted in FIG. 3A. A space between two die 280, 290 that are bonded together is filled with a solid layer 348, which may be formed from epoxy or other resin or polymer. This solid layer 348 protects the electrical connections between the die 280, 290, and further secures the die together. Various materials may be used as solid layer 348, but in embodiments, it may be Hysol epoxy resin from Henkel Corp., having offices in California, USA.

The integrated memory assembly 270 may for example be stacked with a stepped offset, leaving the bond pads at each level uncovered and accessible from above. Wire bonds 306 connected to the bond pads connect the control die 290 to the substrate 302. A number of such wire bonds may be formed across the width of each control die 290 (i.e., into the page of FIG. 3A).

A memory structure die through silicon via (TSV) 312 may be used to route signals through a memory structure die 280. A control die through silicon via (TSV) 314 may be used to route signals through a control die 290. The TSVs 312, 314 may be formed before, during or after formation of the integrated circuits in the semiconductor die 280, 290. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 308 may optionally be affixed to contact pads 310 on a lower surface of substrate 302. The solder balls 308 may be used to electrically and mechanically couple the integrated memory assembly 270 to a host device such as a printed circuit board. Solder balls 308 may be omitted where the integrated memory assembly 270 is to be used as an LGA package. The solder balls 308 may form a part of the interface between the integrated memory assembly 270 and the memory controller 102.

Figure 3B:
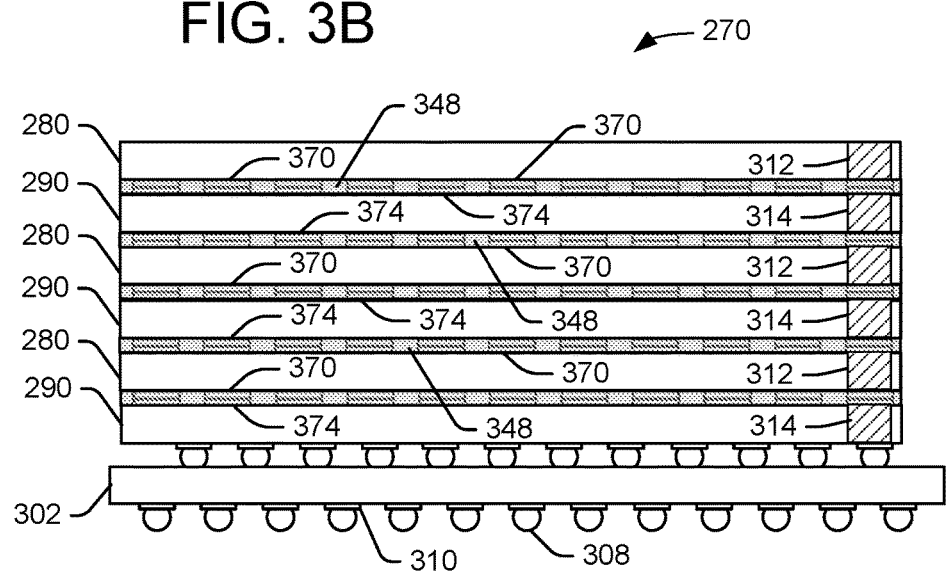
FIG. 3B depicts a side view of an embodiment of an integrated memory assembly stacked on a substrate.

FIG. 3B depicts a side view of an embodiment of an integrated memory assembly 270 stacked on a substrate 302. The integrated memory assembly 270 has three control die 290 and three memory structure die 280. In some embodiments, there are many more than three memory structure die 280 and many more than three control die 290. In this example, each control die 290 is bonded to at least one memory structure die 280. Optionally, a control die 290 may be bonded to two memory structure die 280.

Some of the bond pads 370, 374 are depicted. There may be many more bond pads. A space between two die 280, 290 that are bonded together is filled with a solid layer 348, which may be formed from epoxy or other resin or polymer. In contrast to the example in FIG. 3A, the integrated memory assembly 270 in FIG. 3B does not have a stepped offset. A memory structure die through silicon via (TSV) 312 may be used to route signals through a memory structure die 280. A control die through silicon via (TSV) 314 may be used to route signals through a control die 290.

Solder balls 308 may optionally be affixed to contact pads 310 on a lower surface of substrate 302. The solder balls 308 may be used to electrically and mechanically couple the integrated memory assembly 270 to a host device such as a printed circuit board. Solder balls 308 may be omitted where the integrated memory assembly 270 is to be used as an LGA package.

As has been briefly discussed above, the control die 290 and the memory structure die 280 may be bonded together. Bond pads on each die 280, 290 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 3 µm square and spaced from each other with a pitch of 3 µm to 3 µm. While this process is referred to herein as Cu-to-Cu bonding, this term may also apply even where the bond pads are formed of materials other than Cu.

When the area of bond pads is small, it may be difficult to bond the semiconductor die together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 3 µm square and spaced from each other with a pitch of 1 µm to 3 µm. Bonding techniques may be used providing bond pads with even smaller sizes and pitches.

Some embodiments may include a film on surface of the die 280, 290. Where no such film is initially provided, a space between the die may be under filled with an epoxy or other resin or polymer. The under-fill material may be applied as a liquid which then hardens into a solid layer. This under-fill step protects the electrical connections between the die 280, 290, and further secures the die together. Various materials may be used as under-fill material, but in embodiments, it may be Hysol epoxy resin from Henkel Corp., having offices in California, USA.

Figure 4A:
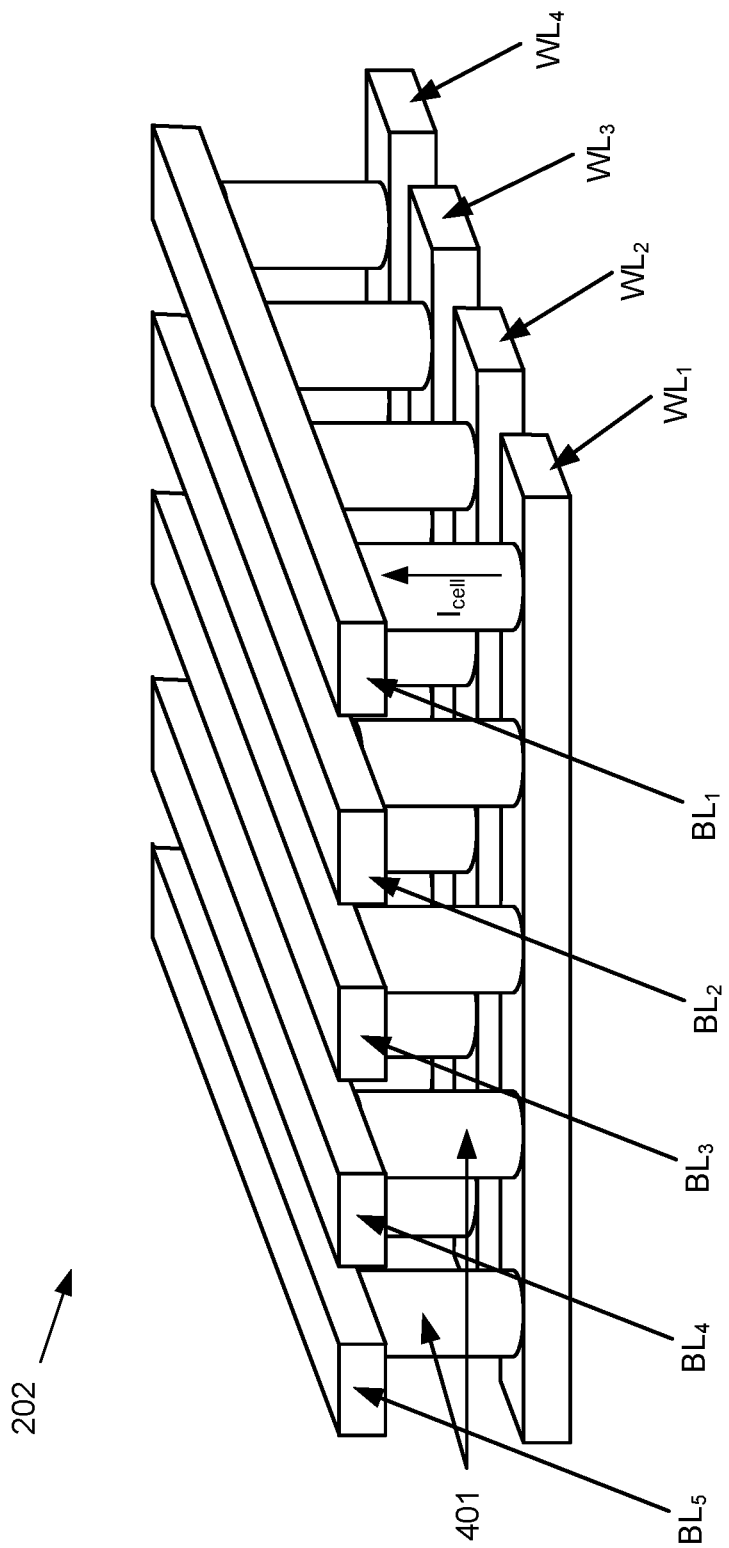
FIG. 4A depicts one embodiment of a portion of a memory array that forms a cross-point architecture in an oblique view.

FIG. 4A depicts one embodiment of a portion of a memory array that forms a cross-point architecture in an oblique view. Memory array 202 of FIG. 4A is one example of an implementation for memory array 202 in FIG. 2A or 2B, where a memory die 292 or memory structure die 280 can include multiple such array structures. The memory array 202 may be included in local memory 140 or host memory 124. The bit lines $BL_1$-$BL_5$ are arranged in a first direction (represented as running into the page) relative to an underlying substrate (not shown) of the die and the word lines $WL_1$-$WL_5$ are arranged in a second direction perpendicular to the first direction. FIG. 4A is an example of a horizontal cross-point structure in which word lines $WL_1$-$WL_5$ and $BL_1$-$BL_5$ both run in a horizontal direction relative to the substrate, while the memory cells, two of which are indicated at 401, are oriented so that the current through a memory cell (such as shown at $I_{cell}$) runs in the vertical direction. In a memory array with additional layers of memory cells, such as discussed below with respect to FIG. 4D, there would be corresponding additional layers of bit lines and word lines.

As depicted in FIG. 4A, memory array 202 includes a plurality of memory cells 401. The memory cells 401 may include re-writeable memory elements, such as can be implemented using ReRAM, MRAM, PCM, or other material with a programmable resistance. A memory cell that includes a MRAM memory element will be simply denoted as an MRAM memory cell. The memory cells 401 may also include selector elements, such as can be implemented using an Ovonic Threshold Switch (OTS), Volatile Conductive Bridge (VCB), Metal-Insulator-Metal (MIM), or other material that provides a highly non-linear dependence of current on select voltage. The following discussion will focus on memory cells composed of an MRAM memory elements combined in series with an Ovonic Threshold switch, although much of the discussion can be applied more generally. The current in the memory cells of the first memory level is shown as flowing upward as indicated by arrow $I_{cell}$, but current can flow in either direction, as is discussed in more detail in the following.

Figure 4B:
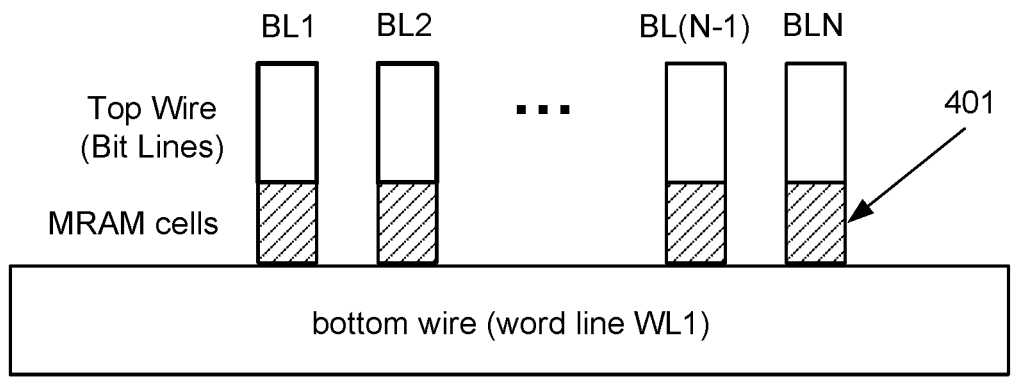
FIGS. 4B and 4C respectively present side and top views of the cross-point structure in FIG. 4A.
Figure 4C:
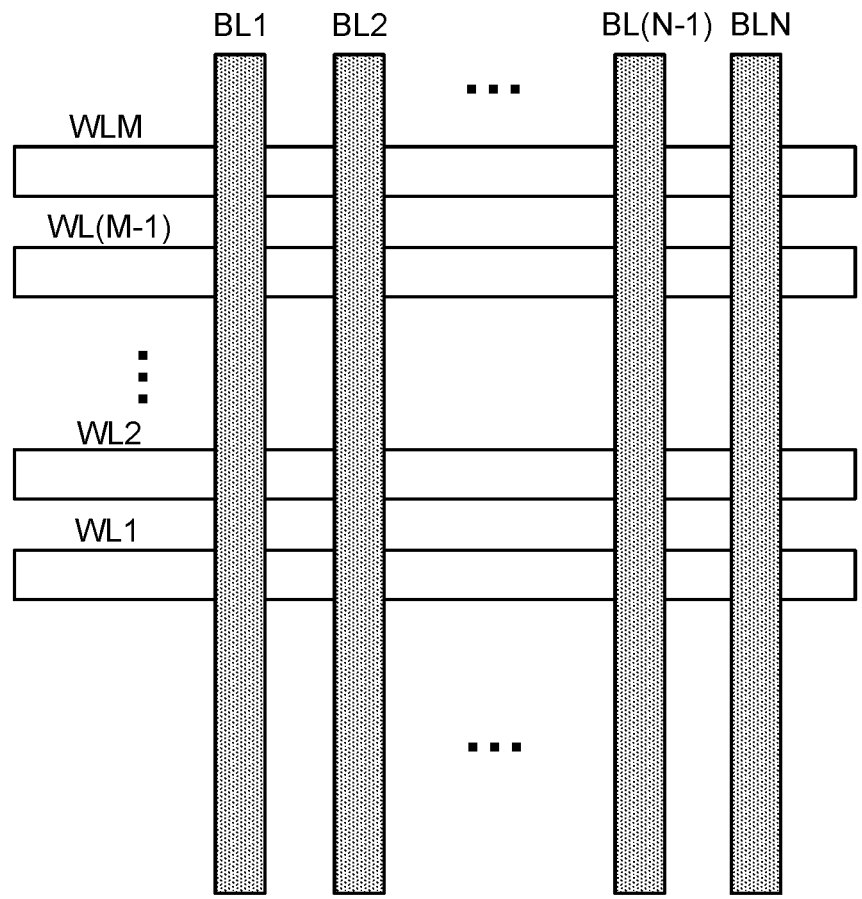

FIGS. 4B and 4C respectively present side and top views of the cross-point structure in FIG. 4A. The sideview of FIG. 4B shows one bottom wire, or word line, $WL_1$ and the top wires, or bit lines, $BL_1$-$BL_n$. At the cross-point between each top wire and bottom wire is an MRAM memory cell 401, although PCM, ReRAM, FeRAM, or other technologies can be used as the memory element. FIG. 4C is a top view illustrating the cross-point structure for M bottom wires $WL_1$-$WL_M$ and N top wires $BL_1$-$BL_N$. In a binary embodiment, the MRAM cell at each cross-point can be programmed into one of two resistance states: high and low. More detail on embodiments for an MRAM memory cell design and techniques for their reading are given below. In some embodiments, sets of these wires are arrayed continuously as a "tile", and such tiles may be paired adjacently in the Word Line (WL) direction and orthogonally in the Bit Line direction to create a module. Such a module may be composed of 2x2 tiles to form a four tile combination wherein the WL drivers between the tiles is "center driven" between the tiles with the WL running continuously over the driver at the approximate center of the line. Similarly, BL drivers may be located between the pair of tiles paired in the BL direction to be center driven, whereby the driver and its area is shared between a pair of tiles.

The cross-point array of FIG. 4A illustrates an embodiment with one layer of word lines and bits lines, with the MRAM or other memory cells sited at the intersection of the two sets of conducting lines. To increase the storage density of a memory die, multiple layers of such memory cells and conductive lines can be formed. A two-layer example is illustrated in FIG. 4D.

Figure 4D:
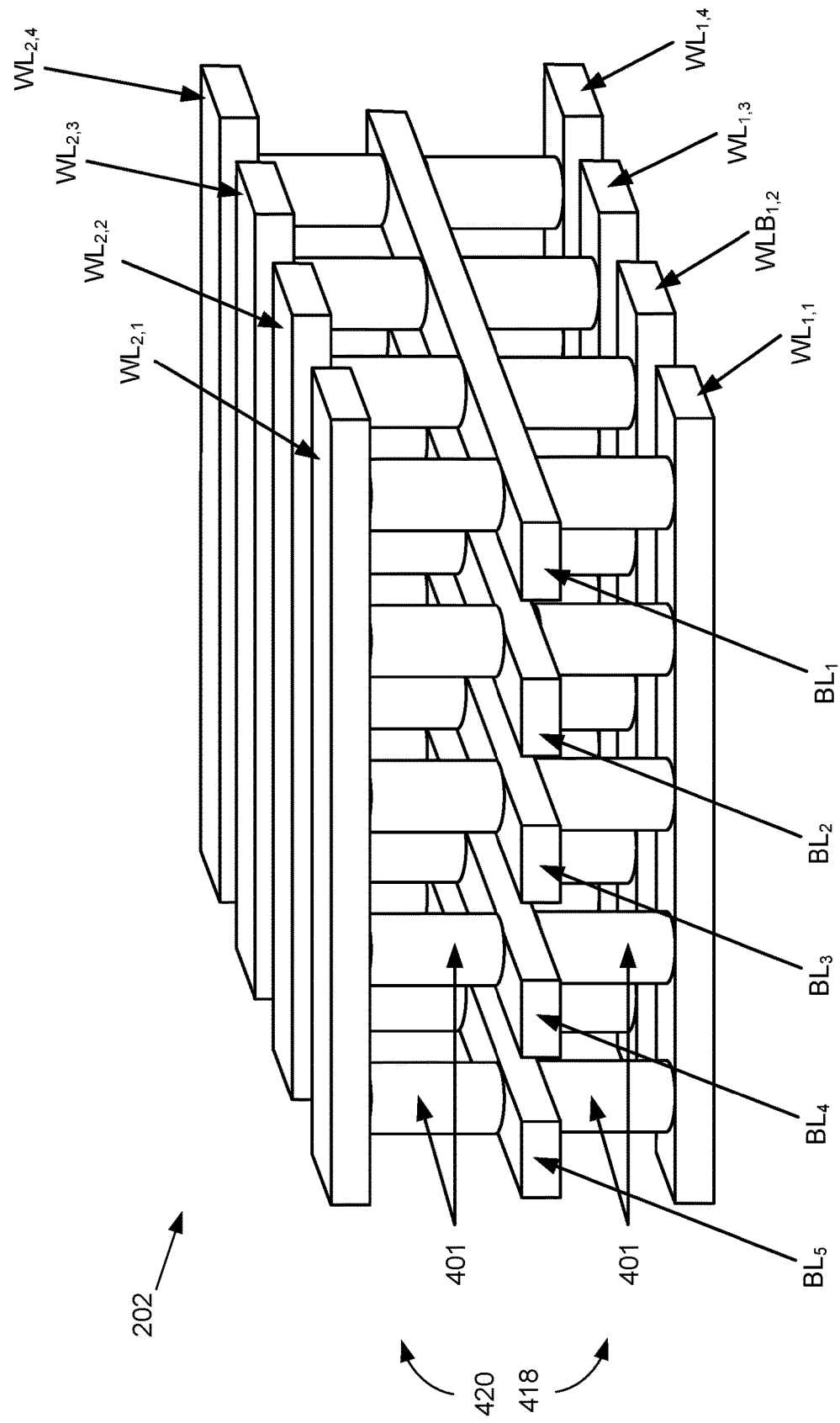
FIG. 4D depicts an embodiment of a portion of a two-level memory array that forms a cross-point architecture in an oblique view.

FIG. 4D depicts an embodiment of a portion of a two-level memory array that forms a cross-point architecture in an oblique view. As in FIG. 4A, FIG. 4D shows a first layer 418 of memory cells 401 of an array 202 connected at the cross-points of the first layer of word lines $WL_{1,1}$-$WL_{1,4}$ and bit lines $BL_1$-$BL_5$. A second layer of memory cells 420 is formed above the bit lines $BL_1$-$BL_5$ and between these bit lines and a second set of word lines $WL_{2,1}$-$WL_{2,4}$. Although FIG. 4D shows two layers, 418 and 420, of memory cells, the structure can be extended upward through additional alternating layers of word lines and bit lines. Depending on the embodiment, the word lines and bit lines of the array of FIG. 4D can be biased for read or program operations such that current in each layer flows from the word line layer to the bit line layer or the other way around. The two layers can be structured to have current flow in the same direction in each layer for a given operation or to have current flow in the opposite directions by driver selection in the positive or negative direction.

The use of a cross-point architecture allows for arrays with a small footprint and several such arrays can be formed on a single die. The memory cells formed at each cross-point can be a resistive type of memory cell, where data values are encoded as different resistance levels. Depending on the embodiment, the memory cells can be binary valued, having either a low resistance state or a high resistance state, or multi-level cells (MLCs) that can have additional resistance intermediate to the low resistance state and high resistance state. The cross-point arrays described here can be used in the memory die 292 of FIG. 2A, the local memory 140 in FIG. 1, and/or the host memory 124 in FIG. 1. Resistive type memory cells can be formed according to many of the technologies mentioned above, such as ReRAM, PCM, FeRAM, or MRAM. The following discussion is presented mainly in the context of memory arrays using a cross-point architecture with binary valued MRAM memory cells, although much of the discussion is more generally applicable.

Figure 5:
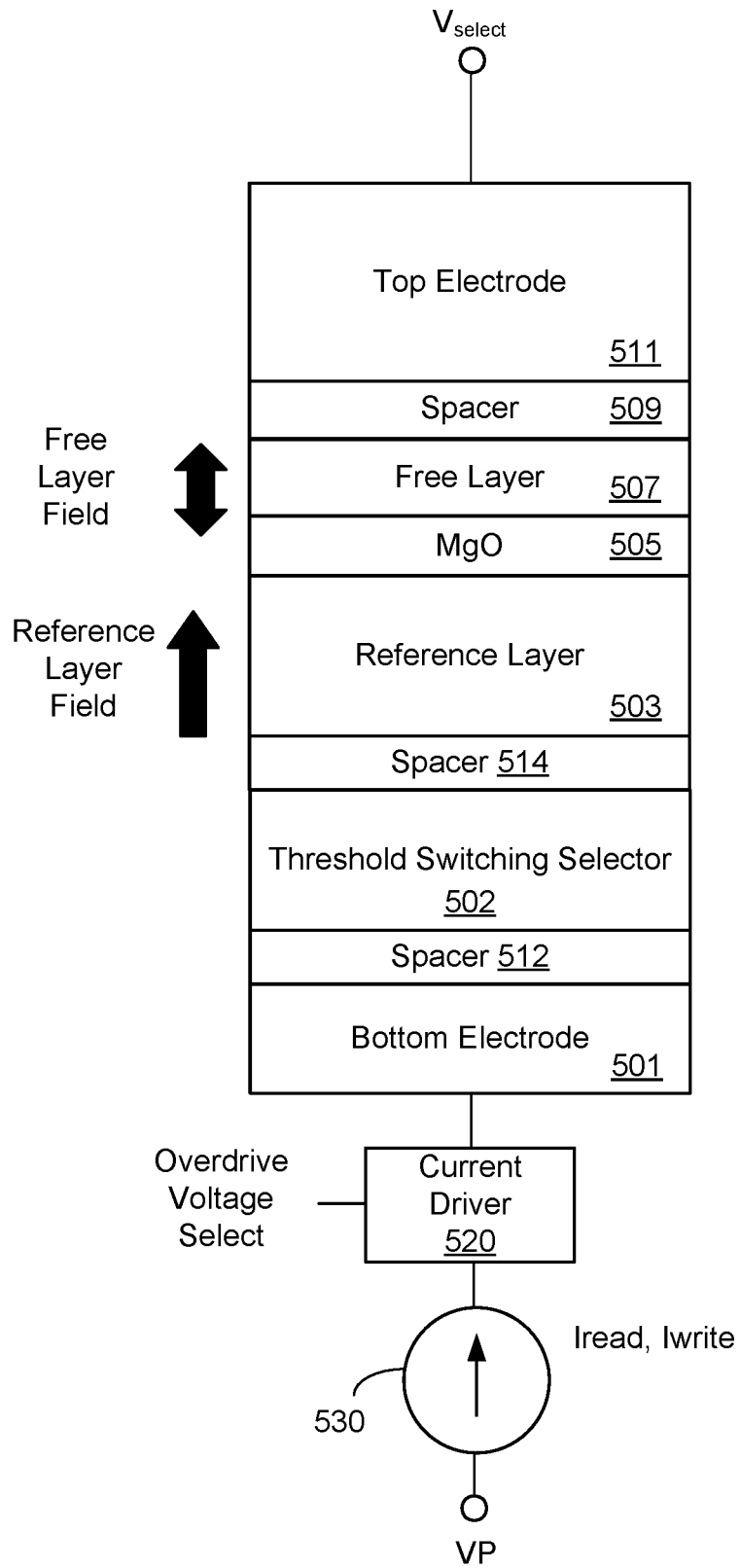
FIG. 5 illustrates an embodiment for the structure of an MRAM memory cell, here for example the selected cell is driven by a current source to read or write.

FIG. 5 illustrates an embodiment for the structure of an MRAM cell. The MRAM cell includes a bottom electrode 501, spacer 512, a threshold switching selector 502, spacer 514, a pair of magnetic layers (reference layer 503 and free layer 507) separated by a separation or tunneling layer of, in this example, magnesium oxide (MgO) 505, and then a top electrode 511 separated from the free layer 507 by a spacer 509. The spacer 509 can consist of an MgO capping layer in contact with the free layer 507. The spacer 509 can also contain additional metal layers. In another embodiment, the locations of the reference layer 503 and free layer 507 are switched, with the reference layer 503 on top of MgO 505, and the free layer 507 below MgO 505. In another embodiment, the location of the threshold switching selector 502 is between the free layer 507 and the top electrode 511.

The bottom electrode 501 of the MRAM cell connected to a current driver 520. The current driver 520 is connected to a current source 530, which is capable of providing a read current (Iread) or a write current (Iwrite). Thus, the current driver 520, when selected, will drive either the read current or the write current to the bottom electrode 501. The current may flow in either direction, depending on the technique being used. Throughout this document, the current driver 520 will be described as driving a current from the current source 530 to the conductive line (e.g., electrode) regardless of the direction of the current.

The overdrive voltage select is used to select the overdrive voltage applied to the current driver 520. In an embodiment, a lower overdrive voltage is used when the read current is being driven than when the write current is being driven to the bottom electrode 501. The lower overdrive voltage increases the resistance of the current driver 520, which improves read margin. Increasing the resistance of the current driver 520, as seen by the threshold switching selector 502, may have the effect of lowering Ihold of the threshold switching selector 502, which improves read margin.

In some embodiments, the bottom electrode 501 is referred to as a word line and the top electrode 511 is referred to as a bit line. In other embodiments, the bottom electrode 501 is referred to as a bit line and the top electrode 511 is referred to as a word line. The state of the memory cell is based on the relative orientation of the magnetizations of the reference layer 503 and the free layer 507: if the two layers are magnetized in the same direction, the memory cell will be in a parallel (P) low resistance state (LRS); and if they have the opposite orientation, the memory cell will be in an anti-parallel (AP) high resistance state (HRS). An MLC embodiment would include additional intermediate states. The orientation of the reference layer 503 is fixed and, in the example of FIG. 5, is oriented upward. Reference layer 503 is also known as a fixed layer or pinned layer. The reference layer 503 can be composed of multiple ferromagnetic layers coupled anti-ferromagnetically in a structure commonly referred to a synthetic anti-ferromagnet or SAF for short.

Data is written to an MRAM memory cell by programming the free layer 507 to either have the same orientation or opposite orientation relative to that of reference layer 503. An array of MRAM memory cells may be placed in an initial, or erased, state by setting all of the MRAM memory cells to be in the low resistance state in which all of their free layers have a magnetic field orientation that is the same as their reference layers. Each of the memory cells is then selectively programmed (also referred to as "written") by placing its free layer 507 to be in the high resistance state by reversing the magnetic field to be opposite that of the reference layer 503. The reference layer 503 is formed so that it will maintain its orientation when programming the free layer 507. The reference layer 503 can have a more complicated design that includes synthetic anti-ferromagnetic layers and additional reference layers. For simplicity, the figures and discussion omit these additional layers and focus only on the fixed magnetic layer primarily responsible for tunneling magnetoresistance in the cell.

The threshold switching selector 502 has a high resistance (in an off or non-conductive state) until it is biased to a voltage higher than its threshold voltage or current above its threshold current, and until its voltage bias falls below Vhold ("Voffset") or current below Ihold. After Vt is exceeded and while Vhold is exceeded across the switching selector, the switching selector has a low resistance (in an on or conductive state). The threshold switching selector remains on until its current is lowered below a holding current Ihold, or the voltage is lowered below a holding voltage, Vhold. When this occurs, the threshold switching selector returns to the off (higher) resistance state. Accordingly, to program a memory cell at a cross-point, a voltage is applied which is sufficient to turn on the associated threshold switching selector and set or reset the memory cell; and to read a memory cell, the threshold switching selector similarly is activated by being turned on before the resistance state of the memory cell can be determined. One set of examples for a threshold switching selector is an ovonic threshold switching material of an Ovonic Threshold Switch (OTS). Example threshold switching materials include Ge—Se, Ge—Se—N, Ge—Se—As, Ge—Se—Sb—N, Ge58Se42, GeTe$_6$, Si—Te, Zn—Te, C—Te, B—Te, Ge—As—Te—Si—N, Ge—As—Se—Te—Si and Ge—Se—As—Te, with atomic percentages ranging from a few percent to more than 90 percent for each element. In an embodiment, the threshold switching selector is a two terminal device. The threshold switching selector 502 can also contain additional conducting layers on the interface with the reference layer 503. For example, spacer 514 is depicted between switching selector 502 and reference layer 503. The spacer layer 514 on the interface with reference layer 503 can be a single conducting layer or composed of multiple conducting layers. The threshold switching selector 502 can also contain additional conducting layers on the interface with the bottom electrode 501. For example, spacer 512 is depicted between switching selector 502 and reference layer 503. The spacer layer 512 on the interface with bottom electrode 501 can be a single conducting layer or composed of multiple conducting layers. Examples of conducting layers adjacent to the OTS include carbon, carbon nitride, carbon silicide, carbon tungsten, titanium, titanium nitride, tungsten, tungsten nitride, tantalum, tantalum nitride, and others. Threshold voltage switches have a Threshold Voltage (Vt) above which the resistance of the device changes substantially from insulating, or quasi insulating, to conducting.

In the embodiment of FIG. 5, a current-force approach is used to access the MRAM cell. The current-force approach may be used to read or write the MRAM cell. In the current-force approach, an access current (e.g., $I_{read}$ or $I_{write}$) is driven through the electrode 501 by a current driver 520. The current will be provided by a current source 530. The current driver 520 is a part of the row driver circuitry (e.g., array drivers 224) for the electrode 501. However, alternatively the current driver 520 may a part of the column driver circuitry (e.g., driver circuity 214) for the electrode 501. A voltage (e.g., $V_{select}$) is provided to the electrode 511. While the threshold switching selector 502 is on, the access current is driven through a portion of a first conductive line (e.g., word line), through a selected memory cell, and through a portion of a second conductive line (e.g., bit line). Herein, the terms "read current" ($I_{read}$) and "write current" ($I_{write}$) will be used in connection with access currents that are driven through MRAM cells (or other programmable resistance cells). The write current may change the state of the MRAM cell. As an example, a write current of about 30 uA for 50 ns may be used for an MRAM cell with a Critical Dimension (CD) of approximately 20 nanometers with RA10 Ωμm$^2$ to switch the MRAM state from the P-state to the AP-state. Read currents may be about half the write current if applied for a limited time, such as <20 ns. A write current that flows in one direction through the MRAM cell will change an AP-state MRAM cell from the AP-state to the P-state. A write current that flows in the other direction through the MRAM cell will change a P-state MRAM cell from the P-state to the AP-state. In general, a read current will preferably be set low enough and the read duration short enough so as not to change the state of an MRAM cell from the P-state to the AP-state or from the AP-state to the P-state during read. Typically the write current required to switch the MRAM state from the P-state to the AP-state is larger in absolute magnitude than the write current required to switch the MRAM state from the AP-state to the P-state.

As discussed more fully below in connection with FIG. 7B, in some embodiments, a read current may be applied in an P2AP direction or, alternatively, in a AP2P direction. In some embodiments, the MRAM cell is read by performing an SRR (self-referenced-read). The SRR operation can include two read operations and one or two write operations that allow direct comparison of the initial bit state resistance to the bit's resistance in a known programmed state, followed by a recovery of the initial bit state by re-writing if it was different from the initial state after first write; however, if the read operation is followed by a commanded write to the state of the bit after SRR read, the bit need not be written. In one embodiment, an SRR has a first read (Read1 in the P2AP direction), a first write (Write 1 to the AP-state), and a second read (Read2 in the P2AP direction), followed by optional second write (Write 2 to the P-state for bits initially in the P-state). The voltage level of the memory cell due to Read1 in the P2AP direction is stored, for example on a capacitor; or by conversion to digital bits by an Analog to Digital converter and the bits stored in memory, for example in SRAM until after use in Read2. The state stored on a capacitor can be adjusted, for example, 150 mv positive or negative by forcing a voltage on one terminal of a capacitor connected to the storage capacitor. Or the digital stored level can be adjusted by digitally adding or subtracting 150 mV to the stored bits. The 150 mV can be adjusted to be more or less dependant on the typical bit resistance. For example, if the bit low resistance state is 25K ohms and the high resistance 50K, the difference is 25K. If the read current is 15 ua, the difference voltage between the states if 25K×15 ua=375 mV, making a choice of 150 mv acceptable but perhaps suggesting 187 mV is more optimum, for example.

Next the memory cell is written to the AP-state (Write 1). The sensed voltage level due to Read2 in the P2AP direction (after a Write 1) is compared with the voltage level stored and adjusted from Read1, both Read1 and Read2 done in the P2AP direction. An adequate change in the voltage level between Read2 and Read1, for example more than 150 mV, indicates that the MRAM cell was originally in the P-state. If the change in voltage is less than 150 mV, the MRAM cell was originally in the AP state (to which write was directing the bit state). An optional Write 2 of the bit AP2P is performed if the bit was originally in the P state and switched to the AP state by Write 1. Alternatively, the SRR has a first read (Read1 in the AP2P direction), a first (Write 1 to the P-state, and a second read (Read2 in the AP2P direction). The voltage level of the memory cell due to Read1 in the AP2P direction is stored and adjusted by, for example −150 mV. Next the memory cell is written to the P-state (Write 1). The voltage level due to Read2 in the AP2P direction is compared with the adjusted voltage level due to Read1 in the AP2P direction. An adequate change in the voltage level indicates that the MRAM cell was originally in the AP-state. An optional Write 2 is performed if the bit was originally in the AP state and switched to the P state by Write 1. In some embodiments, the same polarity is used for Read1, Write1, and Read2, which avoids switching the selector off between Read1 and Read2. In some embodiments Write 2 is delayed and performed only after other operations are performed. In some embodiments the Write 1 is performed by extending the duration of the read current applied during Read 1.

In one embodiment, the MRAM cell is read by applying, for example, 0V to the electrode 511, while driving a current of, for example, 15 micro-Amperes (μA) through the electrode 501. This read current will flow from the electrode 501 to the electrode 511. Note that the read may be Read1 or Read2 in the P2AP direction. P2AP means current flows in the direction that would write the bit from P to AP or AP to AP. In some embodiments, data is written to the MRAM cell using a bipolar write operation. In one embodiment, the MRAM cell is written from the AP-state to the P-state by applying, for example, 3V to the electrode 511, while driving a write current of, for example, −30 μA through the electrode 501. This write current will flow from the top electrode 511 to the bottom electrode 501. In one embodiment, the MRAM cell is written from the P-state to the AP-state by applying, for example, 0V to the top electrode 511, while driving a current of, for example, 30 μA through the bottom electrode 501. This write current will flow from electrode 501 to the electrode 511.

As an alternative to the approach in FIG. 5, the select voltage can be applied to the electrode 501, with the access current applied through the electrode 511. In one such embodiment, the MRAM cell is read by applying, for example, 3V to the bottom electrode 501, while driving a read current of, for example, −15 μA through the top electrode 511. This read current will flow from the bottom electrode 501 to the top electrode 511.

Figure 6:
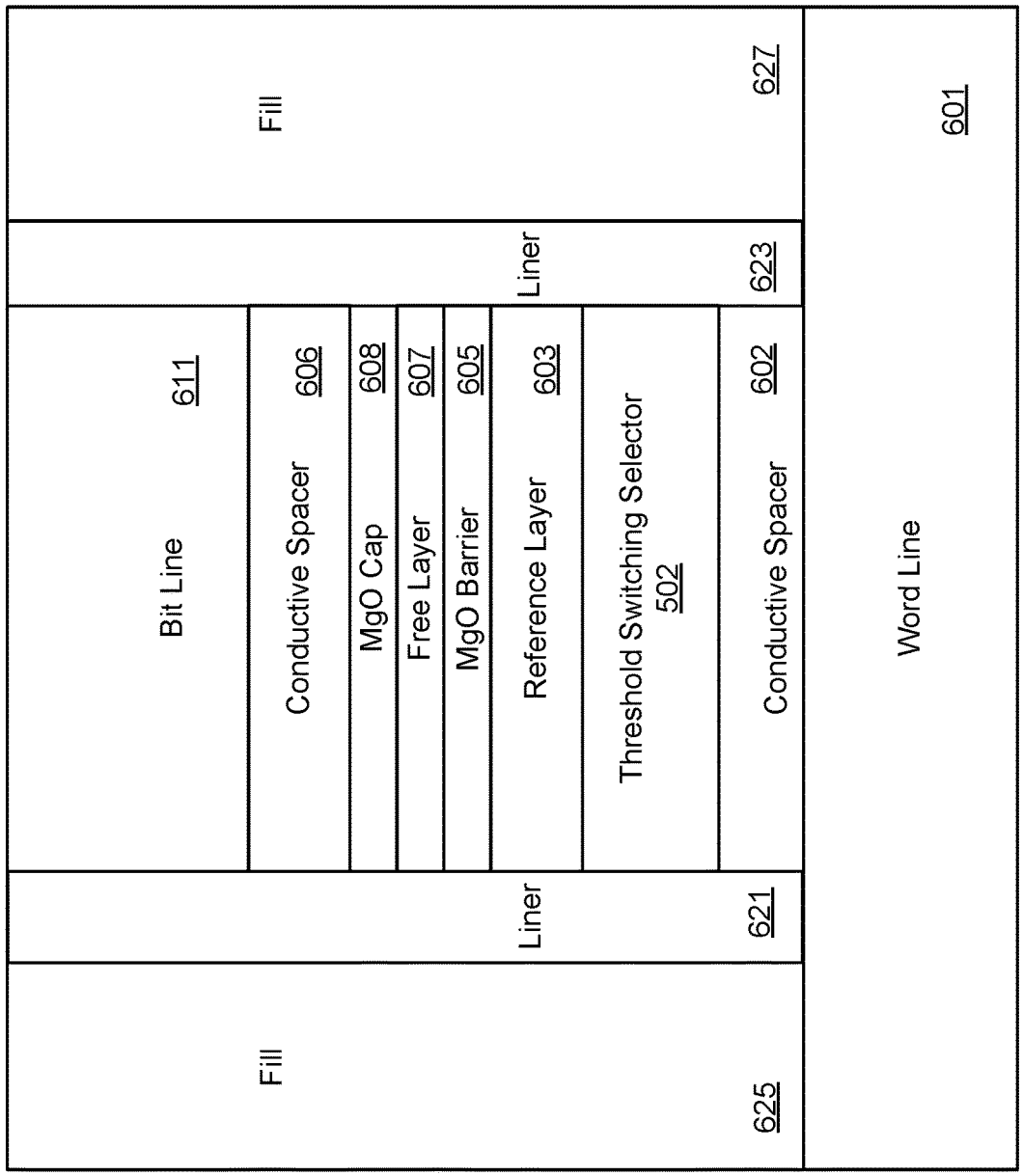
FIG. 6 illustrates an embodiment for an MRAM memory cell design as it would be implemented in a cross-point array in more detail.

In one embodiment, the MRAM cell is written from the AP-state to the P-state by applying, for example, −3V to the bottom electrode 501, while driving a write current of, for example, 30 μA through the top electrode 511. The electron current will flow from the bottom electrode 501 to the top electrode 511. In one embodiment, the MRAM cell is written from the P-state to the AP-state by applying, for example, 0V to the bottom electrode 501, while driving a current of, for example, −30 μA through the top electrode 511. The electron current will flow from the top electrode 511 to the bottom electrode 501 The duration that the read current is applied can be substantially different from the duration that the write current is applied. For example, the read current can be applied for 20 ns, while the write current can be applied for 50 ns, before the current through the cell is reduced to zero or an amount that has a negligible chance of disturbing the cell for the duration it will be applied. The durations of the write and read current can also be the same or substantially similar, such as 20 ns, for example. The write time can be reduced by increasing the write current. Each Read can be performed at considerably lower applied current than Write, such as 10 μa and 40 μa, respectively. Reducing the read current reduces read signal difference at the sense amp (Read current×Higher Resistance−Read Current×Low Resistance). In this discussion it is also understood that the direction of the current polarity to switch the magnetization of the bit into the P or AP state can vary based on reference layer design and the location of the reference layer with respect the free layer FIG. 6 illustrates an embodiment for an MRAM memory cell design as it may be implemented in a cross-point array in more detail. When placed in a cross-point array, the top and bottom electrodes of the MRAM memory cells will be the top and bottom wires of the array. In the embodiment shown here, the bottom electrode is the word line 601 and the top electrode is the bit line 611 of the memory cell, but these can be reversed in other embodiments. Between the word line 601 and bit line 611 are the reference layer 603 and free layer 607, which are again separated MgO barrier 605. In the embodiment shown in FIG. 6, an MgO cap 608 is also formed on top of the free layer 607 and a conductive spacer 606 is formed between the bit line 611 and the MgO cap 608. The reference layer 603 is separated from the word line 601 by another conductive spacer 602. A threshold switching selector 502 may reside between the reference layer 603 and the conductive spacer 602. On either side of the memory cell structure is a liner 621 and 623, where these can be part of the same structure, but appear separate in the cross-section of FIG. 6. To either side of the liner 621, 623 is shown some of fill material 625, 627 used to fill in the otherwise empty regions of the cross-point structure.

With respect to the free layer design 607, embodiments include CoFe or CoFeB Alloy with a thickness on the order ~1-2 nm, where an Ir layer can be interspersed in the free layer close to MgO barrier 605 and the free layer 607 can be doped or interspersed with Ta, W, or Mo. Embodiments for the reference layer 603 can include a bilayer of CoFeB and Co/Pt multilayer coupled with an Ir or Ru spacer, or a combination or alloy of both 602. The MgO cap 608 is optional but can be used to increase anisotropy and reduce the critical switching current of free layer 607. The conductive spacers can be conductive metals such as Ta, W, Ru, CN, TiN, and TaN, among others. The free-layer can also be a composite free layer composed of multiple free-layers with conductive layers in between, such as W, Ta, W, or tunneling layers in between, such as MgO.

Figure 7A:
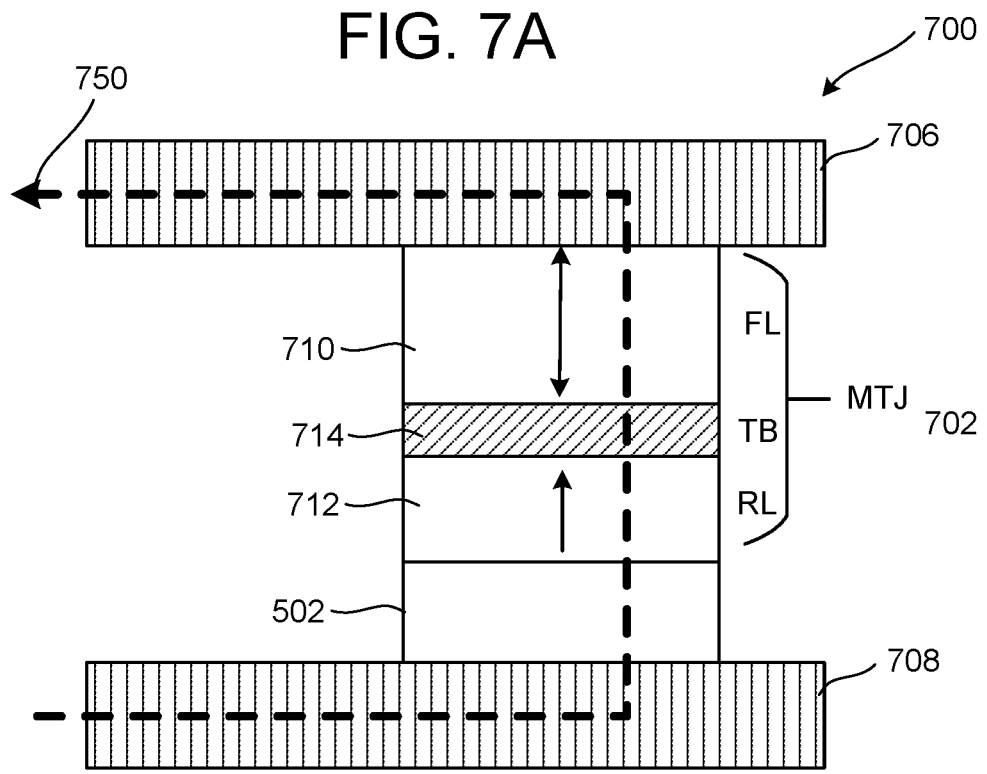
FIGS. 7A and 7B illustrate the writing of an MRAM memory cell by flowing current that generates spin torque transfer (STT).

The following discussion will mainly be discussed with respect to a perpendicular spin transfer torque MRAM memory cell, where the free layer 507/607 of FIGS. 5 and 6 comprises a switchable direction of magnetization that is perpendicular to the plane of the free layer. Spin transfer torque ("STT") is an effect in which the orientation of a magnetic layer in a magnetic tunnel junction (MJT) can be modified using a spin-polarized current. Charge carriers (such as electrons) have a property known as spin which is a small quantity of angular momentum intrinsic to the carrier. An electric current is generally unpolarized (e.g., consisting of 50% spin-up and 50% spin-down electrons). A spin polarized current is one with more electrons of either spin (e.g., a majority of spin-up electrons or a majority of spin-down electrons). By passing a current through a thick magnetic layer (the reference layer), a spin-polarized current can be produced. If this spin-polarized current is injected into a second magnetic layer (the free layer), angular momentum can be transferred to this second magnetic layer, changing the direction of magnetization of the second magnetic layer. This is referred to as spin transfer torque. FIGS. 7A and 7B illustrate the use of spin transfer torque to program or write to MRAM memory. Spin transfer torque magnetic random access memory (STT MRAM) has the advantages of lower power consumption and better scalability over other MRAM variations. Compared to other MRAM implementations, such as toggle MRAM, the STT switching technique requires relatively low power, virtually eliminates the problem of adjacent bit disturbs, and has more favorable scaling for higher memory cell densities (reduced MRAM cell size). The latter issue also favors STT MRAM where the free and reference layer magnetizations are orientated perpendicular to the film plane, rather than in-plane.

Figure 7B:
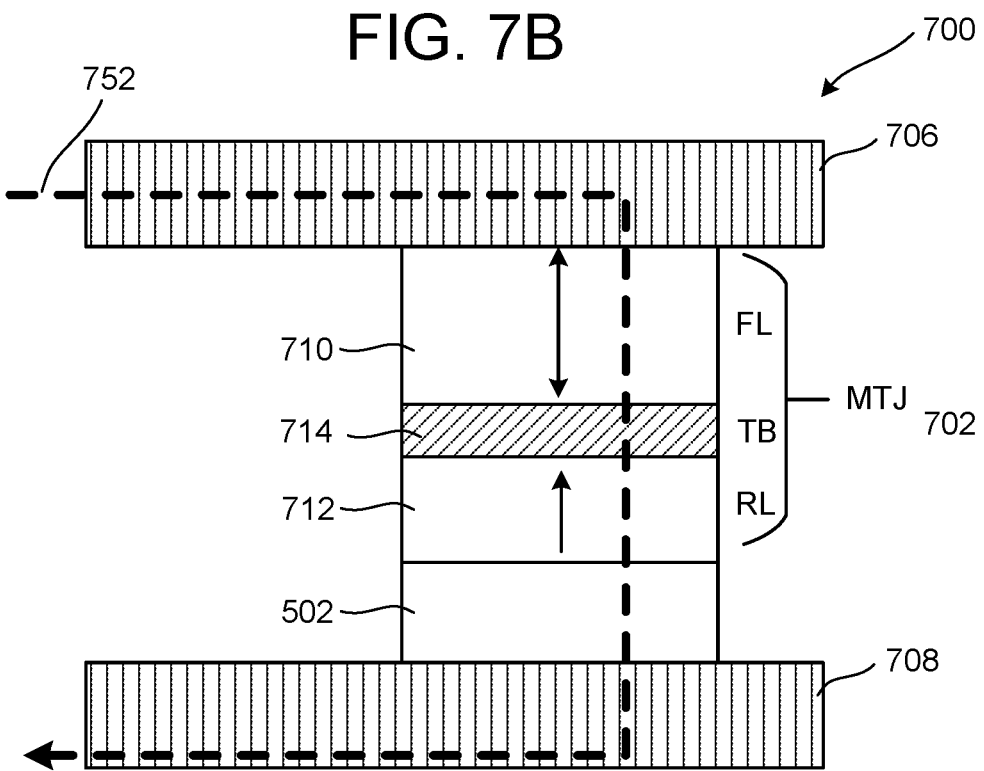

As the STT phenomenon is more easily described in terms electron behavior, FIGS. 7A and 7B and their discussion is given in terms of electron current, where the direction of the write current is defined as the direction of the electron flow. Therefore, the term write current in reference to FIGS. 7A and 7B refers to an electron current. As electrons are negatively charged, the electron current will be in the opposite direction from the conventionally defined current, so that an electron current will flow from a lower voltage level towards a higher voltage level instead the conventional current flow of from a higher voltage level to a lower voltage level.

FIGS. 7A and 7B illustrate the writing of an MRAM memory cell by the STT mechanism, depicting a simplified schematic representation of an example of an STT-switching MRAM memory cell 700 in which both the reference and free layer magnetization are in a perpendicular direction. Memory cell 700 includes a magnetic tunnel junction (MTJ) 702 comprising an upper ferromagnetic layer 710, a lower ferromagnetic layer 712, and a tunnel barrier (TB) 714 as an insulating layer between the two ferromagnetic layers. In this example, upper ferromagnetic layer 710 is the free layer FL and the direction of its magnetization can be switched. Lower ferromagnetic layer 712 is the reference (or fixed) layer RL and the direction of its magnetization cannot be switched. When the magnetization in free layer 710 is parallel to the magnetization in reference layer RL 712, the resistance across the memory cell 700 is relatively low. When the magnetization in free layer FL 710 is anti-parallel to the magnetization in reference layer RL 712, the resistance across memory cell 700 is relatively high. The data ("0" or "1") in memory cell 700 is read by measuring the resistance of the memory cell 700, such as by forcing. In this regard, electrical conductors 706/708 attached to memory cell 700 are utilized to read the MRAM data. By design, both the parallel and antiparallel configurations remain stable in the quiescent state and/or during a read operation (at sufficiently low read current).

For both the reference layer RL 712 and free layer FL 710, the direction of magnetization is in the perpendicular direction (i.e. perpendicular to the plane defined by the free layer and perpendicular to the plane defined by the reference layer). FIGS. 7A and 7B show the direction of magnetization of reference layer RL 712 as up and the direction of magnetization of free layer FL 710 as switchable between up and down, which is perpendicular to the plane.

In one embodiment, tunnel barrier 714 is made of Magnesium Oxide (MgO); however, other materials can also be used. Free layer 710 is a ferromagnetic metal that possess the ability to change/switch its direction of magnetization. Multilayers based on transition metals like Co, Fe and their alloys can be used to form free layer 710. In one embodiment, free layer 710 comprises an alloy of Cobalt, Iron and Boron. Reference layer 712 can be many different types of materials including (but not limited to) multiple layers of Cobalt and Platinum and/or an alloy of Cobalt and Iron.

To "set" the MRAM memory cell bit value (i.e., choose the direction of the free layer magnetization), an electron current 750 is applied from conductor 708 to conductor 706, as depicted in FIG. 7A (hence current flows in the opposite direction). To generate the electron current 750, the top conductor 706 is placed at a higher voltage level than bottom conductor 708, due the negative charge of the electron. The electrons in the electron current 750 become spin-polarized as they pass through reference layer 712 because reference layer 712 is a ferromagnetic metal. When the spin-polarized electrons tunnel across the tunnel barrier 714, conservation of angular momentum can result in the imparting of a spin transfer torque on both free layer 710 and reference layer 712, but this torque is inadequate (by design) to affect the magnetization direction of the reference layer 712. Contrastingly, this spin transfer torque is (by design) sufficient to switch the magnetization orientation in the free layer 710 to become parallel (P) to that of the reference layer 712 if the initial magnetization orientation of the free layer 710 was anti-parallel (AP) to the reference layer 712, referred to as an anti-parallel-to-parallel (AP2P) write. The parallel magnetizations will then remain stable before and after such electron current is turned off.

In contrast, if free layer 710 and reference layer 712 magnetizations are initially parallel, the direction of magnetization of free layer 710 can be switched to become antiparallel to the reference layer 712 by application of an electron current of opposite direction to the aforementioned case. For example, electron current 752 is applied from conductor 706 to conductor 708, as depicted in FIG. 7B, by placing the higher voltage level on the lower conductor 708. This will write a free layer 710 in a P state to an AP state, referred to as a parallel-to-anti-parallel (P2AP) write. Thus, by way of the same STT physics, the direction of the magnetization of free layer 710 can be deterministically set into either of two stable orientations by judicious choice of the electron current direction (polarity).

The data ("0" or "1") in memory cell 700 can read by measuring the resistance of the memory cell 700. Low resistance typically represents a "0" bit and high resistance typically represents a "1" bit, although sometimes the alternate convention occurs. A read current can be applied across the memory cell (e.g., across the MJT 702) by applying an electron current from conductor 708 to conductor 706, flowing as shown for 750 in FIG. 7A (the "AP2P direction"); alternatively, the electron current can be applied from conductor 706 to conductor 708, flowing as shown for 752 in FIG. 7B (the "P2AP direction"). As is well-understood, the electron current flows in the opposite direction as conventionally defined current. In a read operation, if the electron current is too high, this can disturb data stored in a memory cell and change its state. For example, if electron current Read1 uses the P2AP direction of FIG. 7B, too high of a current or voltage level can switch any memory cells in the low resistance P state into the high resistance AP state before the bit voltage during Read1 is stored. Consequently, although the MRAM memory cell can be read in either direction, the directional nature of the write operation may make one read direction preferable over the other in various embodiments. For example, for a given read current, the error rate may be less doing SRR in the P2AP direction.

Although the discussion of FIGS. 7A and 7B was in the context of electron current for the read and write currents, the subsequent discussion will be in the context of conventional current unless otherwise specified.

Whether to read or write selected memory cells in the array structures of FIGS. 4A-4D, the bit line and word line corresponding a selected memory cell is biased to place a voltage across the selected memory cell, or a current through, and induce the flow of electrons as illustrated with respect to FIG. 7A or 7B. Note that herein, a "selected memory cell" means that the memory cell is selected for access (e.g., read access, write access). An "unselected memory cell" means that the memory cell is not selected for access by, for example, placing either its WL or BL or both at a voltage approximately midway between the maximum positive and minimum negative voltages across the memory cell. Note that in one embodiment, an unselected WL that neighbors the selected WL is floated during read, which improves read margin by reducing the capacitance seen by the threshold switching selector in the selected memory cell. A given process may result in write currents that are about the same for forward versus reverse write of the MRAM, or it may be that writing from low resistance state (LRS) to high resistance state (HRS) requires 20% or more current for a CD of approximately 20 nm and RA10 $\Omega\mu m^2$.

Some biasing techniques may result in voltage across non-selected memory cells of the array, which can induce currents in non-selected memory cells. Although this wasted power consumption can be mitigated to some degree by designing the memory cells to have relatively high resistance levels for both high and low resistance states, this will still result in increased current and power consumption as well as placing additional design constraints on the design of the memory cells and the array. One approach to address this unwanted current leakage is to place a selector element in series with each MRAM or other resistive (e.g., ReRAM, PCM) memory cell. For example, a select transistor can be placed in series with each resistive memory cell element in FIGS. 4A-4D so that the memory cells 401 is now a composite of a select transistor and a programmable resistance. Use of a select transistor, however, requires the introduction of additional control lines and cell area to be able to turn on the corresponding transistor of a selected memory cell. Additionally, transistors will often not scale in the same manner as the resistive memory element write current, so that as memory arrays move to smaller sizes the use of transistor based selectors can be a limiting factor in reducing cost, for example. An alternate approach to select transistors is the use of a threshold switching selector (e.g., threshold switching selector 502) in series with the programmable resistive element. A two terminal threshold switching selector does not require the aforementioned additional control lines and cell area to be able to turn on the corresponding select transistor of a selected memory cell.

Figure 8A:
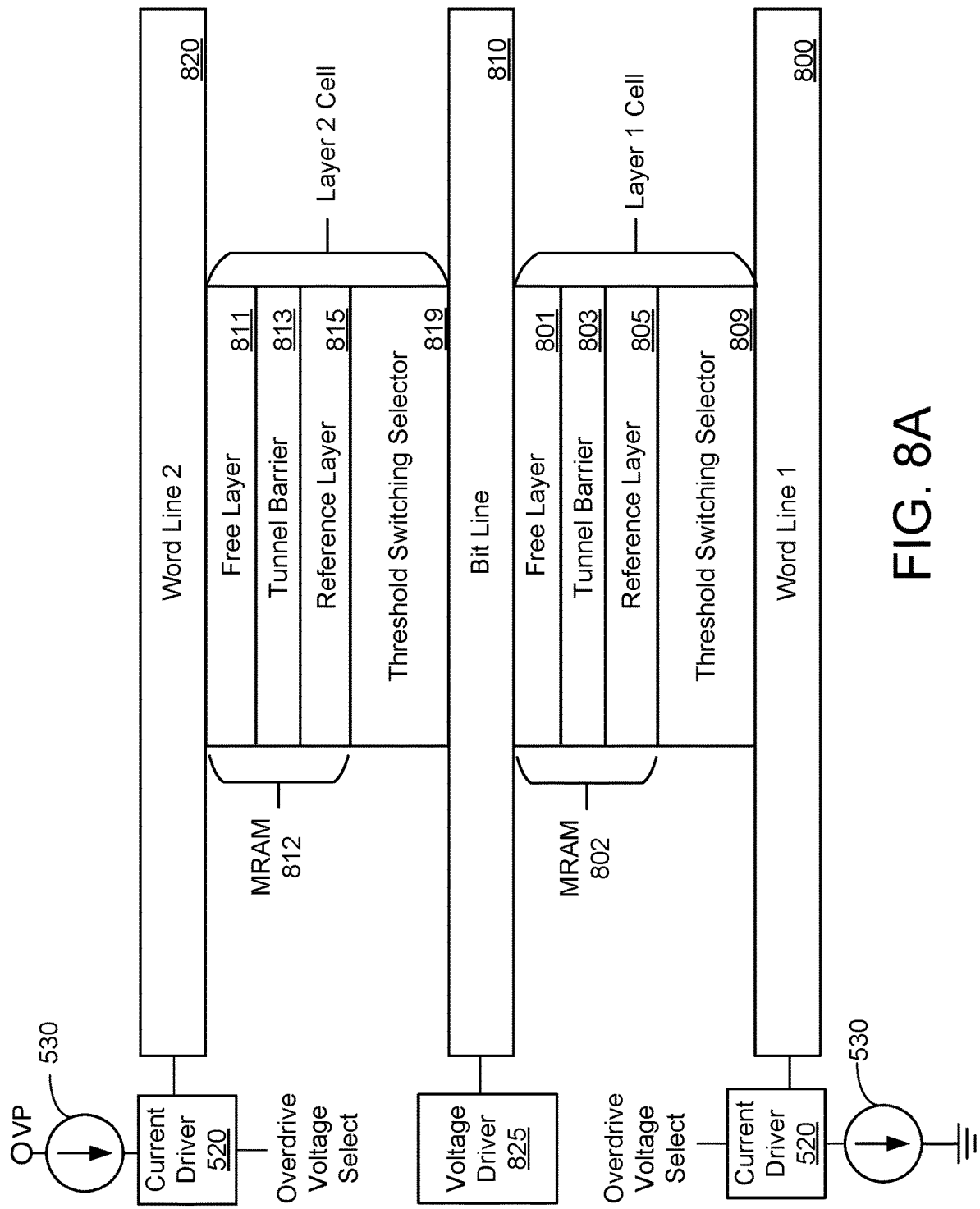
FIGS. 8A and 8B illustrate embodiments for the incorporation of threshold switching selectors into an MRAM memory array having a cross-point architecture.
Figure 8B:
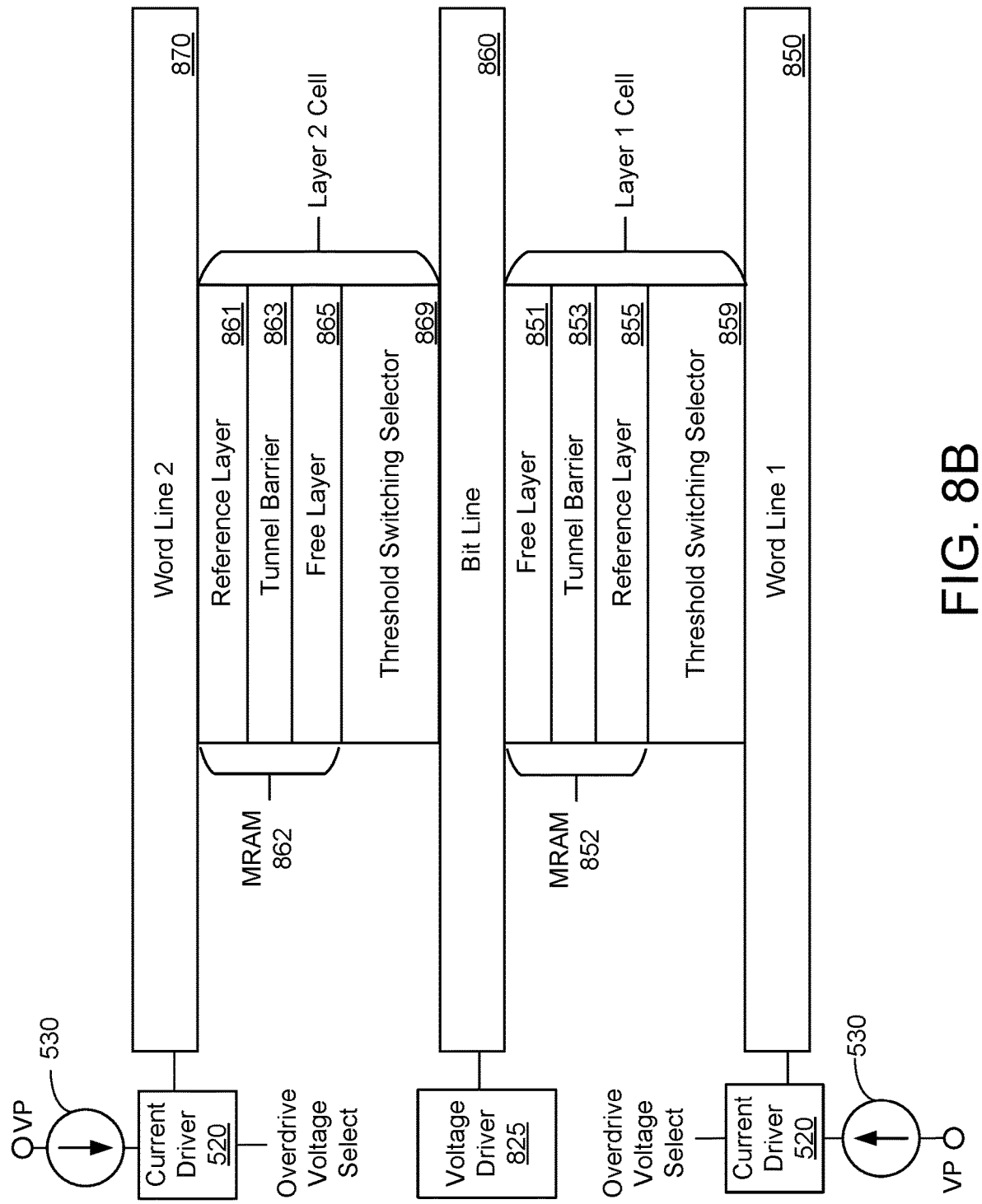

FIGS. 8A and 8B illustrate embodiments for the incorporation of threshold switching selectors into an MRAM memory array having a cross-point architecture. FIGS. 8A and 8B also depict current drivers 520 for providing currents to the word lines 800, 820, as well as a voltage driver 825 for applying a voltage to the bit line 810. The examples of FIGS. 8A and 8B show two MRAM cells (Layer 1 Cell, Layer 2 Cell) in a two layer cross-point array, such as shown in FIG. 4D, but in a side view. Keeping the orientation of the MRAM layers the same in the Layer 1 Cell and the Layer 2 Cell, as depicted in FIG. 8A, allows the fabrication process to be the same for each layer. FIGS. 8A and 8B show a lower first conducting line of word line 1 800, an upper first conducting line of word line 2 820, and an intermediate second conducting line of bit line 810. In these figures, all of these lines are shown running left to right across the page for ease of presentation, but in a cross-point array they would be more accurately represented as in the oblique view of FIG. 4D where the word lines, or first conducting lines or wires, run in one direction parallel to the surface of the underlying substrate and the bit lines, or second conducting lines or wires, run in a second direction parallel to the surface to the substrate that is largely orthogonal to the first direction. The MRAM memory cells are also represented in a simplified form, showing only the reference layer, free layer, and the intermediate tunnel barrier, but in an actual implementation would typically include the additional structure described above with respect to FIGS. 5 and 6.

An MRAM element 802 including free layer 801, tunnel barrier 803, and reference layer 805 is formed above the threshold switching selector 809, where this series combination of the MRAM element 802 and the threshold switching selector 809 together form the layer 1 cell between the bit line 810 and word line 1 800. The series combination of the MRAM element 802 and the threshold switching selector 809 operate largely as described above with respect to FIGS. 7A and 7B when the threshold switching selector 809 is turned on. Initially, though, the threshold switching selector 809 needs to be turned on by applying a voltage above the threshold voltage Vth of the threshold switching selector 809, and then the biasing current or voltage needs to be maintained high enough above the holding current or holding voltage of the threshold switching selector 809 so that it stays on during the subsequent read or write operation.

On the second layer, an MRAM element 812 includes free layer 811, tunnel barrier 813, and reference layer 815 is formed above the threshold switching selector 819, with the series combination of the MRAM element 812 and the threshold switching selector 819 together forming the layer 2 cell between the bit line 810 and word line 2 820. The layer 2 cell will operate as for the layer 1 cell, although the lower conductor now corresponds to a bit line 810 and the upper conductor is now a word line, word line 2 820. Additional paired layers may similarly share another bit line between them, having a pattern of WL1, BL1, WL2; WL3, BL2, WL4; or have separate bit lines in a pattern such as WL1, BL1, WL2, BL2.

In the embodiment of FIG. 8A, the threshold switching selector 809/819 is formed below the MRAM element 802/812, but in alternate embodiments the threshold switching selector can be formed above the MRAM element for one or both layers. As discussed with respect to FIGS. 7A and 7B, the MRAM memory cell is directional. In FIG. 8A, the MRAM elements 802 and 812 have the same orientation, with the free layer 801/811 above (relative to the unshown substrate) the reference layer 805/815. Forming the layers between the conductive lines with the same structure can have a number of advantages, particularly with respect to processing as each of the two layers, as well as subsequent layers in embodiments with more layers, can be formed according to the same processing sequence.

FIG. 8B illustrates an alternate embodiment that is arranged similarly to that of FIG. 8A, except that in the layer 2 cell the locations of the reference layer and free layer are reversed. More specifically, between word line 1 850 and bit line 860, as in FIG. 8A the layer cell 1 includes an MRAM element 1 having a free layer 851 formed over tunnel barrier 853, that is turn formed over the reference layer 855, with the MRAM element 852 formed over the threshold switching selector 859. The second layer of the embodiment of FIG. 8B again has an MRAM element 862 formed over a threshold switching selector 869 between the bit line 860 and word line 2 870, but, relative to FIG. 8A, with the MRAM element 862 inverted, having the reference layer 861 now formed above the tunnel barrier 863 and the free layer 865 now under the tunnel barrier 863. Alternatively, the configuration of MRAM cell 862 may be used for the Layer 1 cell and the configuration of MRAM cell 852 may be used for the Layer 2 cell.

Although the embodiment of FIG. 8B requires a different processing sequence for the forming of layers, in some embodiments it can have advantages. In particular, the directionality of the MRAM structure can make the embodiment of FIG. 8B attractive since when writing or reading in the same direction (with respect to the reference and free layers) the bit line will be biased the same for both the lower layer and the upper layer, and both word lines will be biased the same. For example, if both layer 1 and layer 2 memory cells are sensed in the P2AP direction (with respect to the reference and free layers), the bit line layer 860 will be biased such as in the P2AP direction, the bit line 860 is biased low (e.g., 0V) for both the upper and lower cell, with word line 1 850 and word line 2 870 both biased to a higher voltage level. Similarly, with respect to writing, for writing to the high resistance AP state the bit line 860 is biased low (e.g., 0V) for both the upper and lower cell, with word line 1 850 and word line 2 870 both biased to a higher voltage level. In an embodiment, the current drivers 520 in FIG. 8B are used for reading in the P2AP direction, as well as for writing to the high resistance AP. For writing to the low resistance P state, the bit line 860 is biased to the high voltage level, with word line 1 850 and word line 2 870 both biased to the low voltage level. Hence, the direction of the current in current sources 530 may be in the opposite direction as depicted in FIG. 8B (with VP being ground). In contrast, for the embodiment of FIG. 8A, the bit lines and word lines would need to have their bias levels reversed for performing any of these operations on the upper level (Layer 2) relative to the lower level (Layer 1).

To either read data from or write data to an MRAM memory cell involves passing a current through the memory cell. In embodiments where a threshold switching selector is placed in series with the MRAM element, before the current can pass through the MRAM element the threshold switching selector needs to be turned on by applying a sufficient voltage across and current through the series combination of the threshold switching selector and the MRAM element.

Figure 9:
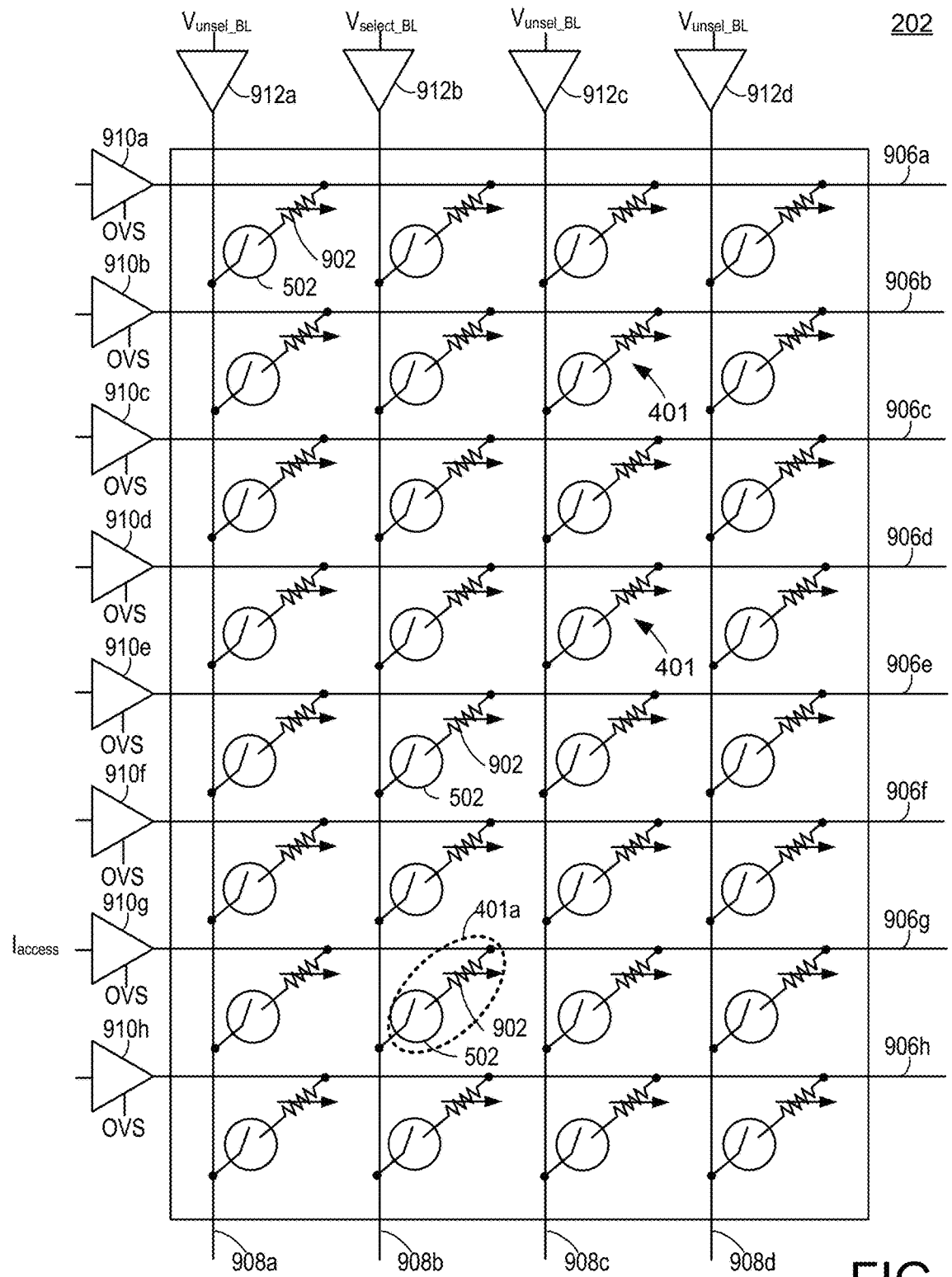
FIG. 9 depicts an embodiment of a memory array having a cross-point architecture.

FIG. 9 depicts an embodiment of a memory array 202 having a cross-point architecture. The array 202 has a set of first conductive lines 906a-906h and a set of second conductive lines 908a-908d. In one embodiment, the set of first conductive lines 906a-906h are word lines and the set of second conductive lines 908a-908b are bit lines. For ease of discussion, the set of first conductive lines 906a-906h may be referred to as word lines and the set of second conductive lines 908a-908b may be referred to as bit lines. However, the set of first conductive lines 906a-906h could be bit lines and the set of second conductive lines 908a-908b could be word lines.

The array 202 has a number of programmable resistance memory cells 401. Each memory cell 401 is connected between one of the first conductive lines 906 and one of the second conductive lines 908. Each memory cell 401 has a magnetoresistive random access memory (MRAM) element 902 in series with a threshold switching selector element 502. Hence, each memory cell ("bit") 401 may be referred to as an MRAM cell or bit. The threshold switching selector 502 is configured to become conductive with lower resistance in response to application of a voltage level exceeding a threshold voltage of the threshold switching selector 502, and remains conductive with lower resistance until the current through the switching selector 502 is reduced below the selector holding current, Ihold. The threshold switching selector element 502 may be a two terminal device. In an embodiment, the threshold switching selector element 502 comprises an OTS.

Each first conductive line 906 may be driven by one of the WL drivers 910a-910h. For example, first conductive line 906a may be driven by WL driver 910a, first conductive line 906b may be driven by WL driver 910b, etc. Each second conductive line 908 is driven by one of the BL drivers 912a-912d. For example, second conductive line 908a is driven by BL driver 912a, second conductive line 908b is driven by BL driver 912b, etc. In one embodiment, the word lines and the bit lines are driven from one end of the word line or bit line. FIG. 9A depicts such an embodiment in which the word lines and the bit lines are driven from one end. In an alternative embodiment, the bit lines and/or the word lines are driven from a midpoint. Driving a word line or bit line from a midpoint reduces the worst case IR drop.

Although a separate driver 910 is depicted connected to each word line 906, it is not required to have a separate driver 910 for each word line. A driver may be connected to the selected word line by decode circuitry that selects the WL 906 to be driven. The driver and decode circuitry may be connected to a "global node" (see global node VX in FIG. 18). However, locations of WL drivers 910a-910h in FIG. 9A may still indicate the location (e.g., end) of the word line that is driven.

For purpose of discussion, memory cell 401a is being selected for access. This could be a read or a write access. Selected memory cell 401a is at the cross-point of selected word line 906g and selected bit line 908b. The other memory cells not selected for access (i.e., are unselected memory cells). All other word lines and all other bit lines are unselected by forcing them to an unselect voltage, such as Vmid, for example 1.65V, at approximately one half the drive compliance voltage, for example 3.3V. To select a memory cell 401, a select voltage ($V_{select\_BL}$) such as near ground is provided to the selected bit line (e.g., bit line 908b) and an access current is driven (or forced) through a selected word line (e.g., word line 906g). The access current may flow between a portion of the selected word line, through the selected memory cell, and through a portion of the selected bit line. An unselect voltage ($V_{unsel\_BL}$) is provided to the unselected bit lines (e.g., bit lines 908a, 908c, 908d). In one embodiment, $V_{select\_BL}$ has a magnitude such that the threshold switching selector 502 in a selected memory cell will turn on, assuming that $I_{access}$ is applied to the selected word line. For example, $V_{select\_BL}$ may be approximately 0V. On the other hand, $V_{unsel\_BL}$ has a magnitude such that the threshold switching selector 502 in an unselected memory cell will not turn on, for example $V_{unselect-BL}$ may be approximately 1.65V if the positive power supply is 3.3V. Word line driver 910g drives an access current ($I_{access}$) through at least a portion of selected word line 906g. This access current may also flow through the selected memory cell 401a and in a portion of selected bit line 908b. Such a selected WL may, for example, be driven high by 15 µA to read or 30 µA to write by a current source with compliance voltage of, for example, 3.3V.

The term "select voltage", as used throughout this document in the context of applying the select voltage to a select second conductive line in a cross-point memory array while providing an access current to a selected first conductive line in the cross-point memory array means a voltage that when applied to the selected second conductive line in combination with the access current driven to the selected first conductive will select the programmable resistance memory cell at the intersection of the selected first conductive line and the selected second conductive line for read access or for write access.

In an embodiment, a different overdrive voltage is applied to the word line drivers 910 for read than for write. An overdrive select signal (OVS) may be used to select the overdrive voltage. In an embodiment, the OVS controls the magnitude of a voltage that is applied to a gate of a drive transistor. In an embodiment, a lower overdrive voltage is used for read than for write. Using the lower overdrive voltage for read improves read margin by reducing transient current when the OTS turns on. And the lower overdrive voltage increases the resistance of the WL driver 910, which may decrease Ihold of the threshold selector 502 of the selected memory cell, which improves read margin against oscillating the OTS on/off.

The WL drivers 910 are configured to either source a current or sink a current. Thus, $I_{access}$ could flow in either direction through the selected word line (as well as the selected bit line). By convention used herein, when a current driver 910 is used as a current source the magnitude of the access current is positive. By convention used herein, when a current driver 910 is used as a current sink the magnitude of the access current is negative. Whether a current driver 910 sources or sinks a current, herein this will be referred to as forcing or driving the current to or through the selected word line. In one embodiment, no current other than leakage is forced through unselected word lines (e.g., 906a, 906b, 906c, 906d, 906e, 906f, and 906h). Note that herein, a "selected word line" forced with, for example for a 20 nm CD, at 15 µA for read or 30 µA for write with voltage compliance of approximately 3.3V, means that the word line is connected to a selected memory cell, such cell further determined by its connection to a "selected" bit line at approximately 0V. To write the opposite polarity, the selected word line is forced, for example, with −30 µA and the selected bit line to 3.3V. A selected word line may also be connected to unselected memory cells if the other end terminal is connected to an unselected bit line at Vmid, such as 1.65V. An "unselected word line" means that the word line is connected to only unselected memory cells. In other words, all memory cells that connect to an unselected word line are unselected memory cells, for example when the unselected WL is forced at Vmid 1.65V for VP 3.3V, for example; or when the unselected BL is forced at Vmid 1.65V, for example. Note that herein, a "selected bit line" means that the bit line at, for example, near 0V if reading and writing P2AP, or near VP (~3.3V, for example) if writing AP1P, is connected to at least one selected memory cell. An "unselected bit line" means that the bit line is connected to only unselected memory cells. In other words, all memory cells that connect to an unselected bit line are unselected memory cells, and the BL is at 1.65V for VP=3.3V for example. As noted above, a selected memory cell is a memory cell that is selected for access to read or write. A selected memory cell is connected between a selected word line and a selected bit line.

In one embodiment, the selected word line voltage is clamped to a voltage limit (voltage compliance) while driving an access current (current force) through a portion of the selected word line, through the selected memory cell, and through a portion of the selected bit line In other words, the voltage may be clamped such that it is not permitted to exceed a certain magnitude. Clamping the selected word line voltage when using a current-force read can lead to a lower bit error rate, while reducing stress on the memory cells.

In the example of FIG. 9 there are more word lines than bit lines in the cross-point array. In one embodiment, there are more bit lines than word lines in the cross-point array. In one embodiment, the number of bit lines equals the number of word lines in the cross-point array. In the example of FIG. 9 there are twice as many word lines as bit lines in the cross-point array; however, a different ratio could be used. Thereby, different tile sizes may be realized. For example, a tile may have 1024 BL by 2048 WL, which may be composed into a module of 2048×4096 cells by center driving the WL and BL between the four tiles.

In embodiments, a current-force approach is used to access memory cells in a cross-point memory array. A current-force approach helps to compensate for varying IR drops of varying word line resistance and/or varying bit line resistance or memory cells. Threshold switching selectors may be used in series with the memory cells. The threshold switching selector is connected in series with the memory element between the word line and the bit line. Hence, any voltage across the switching selector will reduce the voltage across the memory element. Typically, there will be some variation in the offset or hold voltage between the switching selectors. A current-force approach helps to mitigate offset voltage variation between threshold switching selectors to help minimize the selected cell current variation cell to cell.

Figure 10A:
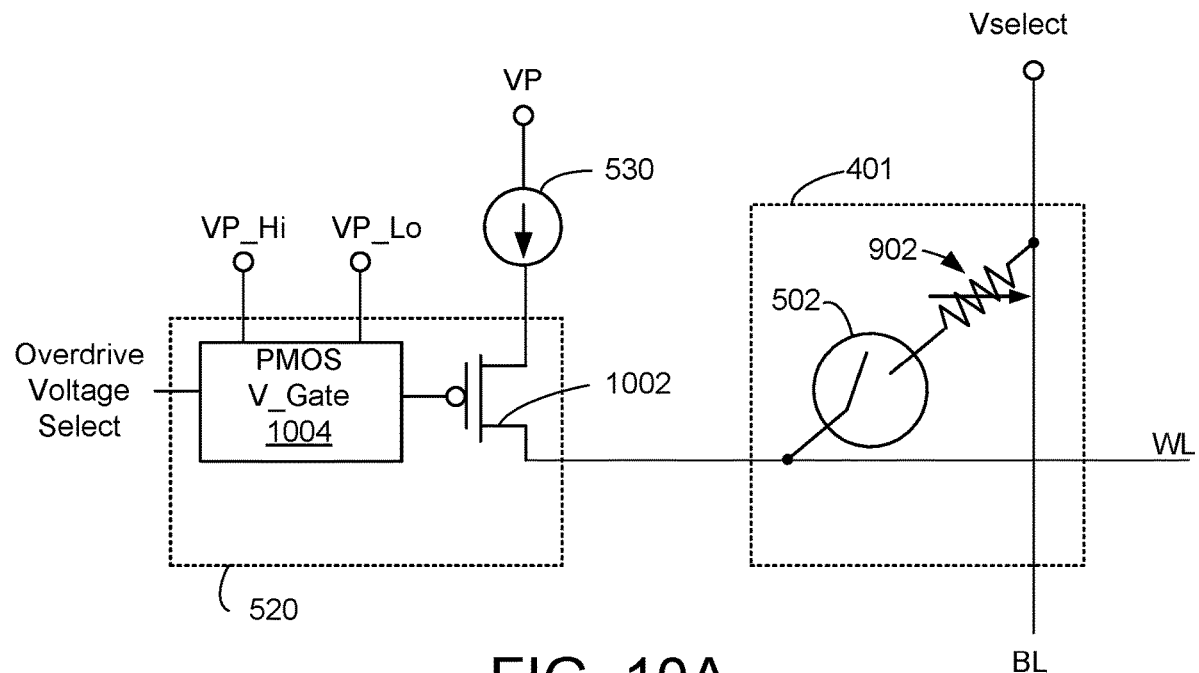
FIGS. 10A, 10B, and 10C are schematic diagrams that show embodiments of driver circuits.

FIG. 10A is a schematic diagram that shows one embodiment of a driver circuit connected to a word line that is connected to a programmable resistance memory cell 401. In one embodiment, the driver circuit 520 is part of the array drivers 224 in the row control circuitry (see 220 in FIGS. 2A, 2B). The current source 530 may also be part of the row control circuitry 220. The driver circuit 520 includes a PMOS drive transistor 1002 and a PMOS gate voltage source 1004. The PMOS gate voltage source 1004 is connected to the gate of the PMOS drive transistor 1002. The PMOS gate voltage source 1004 is capable of providing at least two different magnitudes of voltages to the gate of the PMOS drive transistor 1002. The PMOS gate voltage source 1004 may contain a series of logic gates. The PMOS gate voltage source 1004 is connected to VP_Hi and VP_Lo, which are two different voltage sources. As one example, VP_Hi is 1V for increasing select transistor resistance (such as during read) and VP_Lo is 0V for minimizing select transistor resistance (such as during write). The overdrive voltage select signal is used to select between the two different voltage sources. Hence, the overdrive voltage select signal is used to select the gate voltage of the PMOS drive transistor 1002. In an embodiment, the magnitude of the gate voltage controls the overdrive voltage of the PMOS drive transistor 1002.

The PMOS drive transistor 1002 has a source terminal connected to a current source 530, which may provide either a read current or a write current. The PMOS drive transistor 1002 has a drain terminal connected to the word line (WL) in order to pass the current from the current source 530 to the word line. FIG. 10A shows the bit line (BL) being driven by a select voltage. In one embodiment, the select voltage to the bit line is 0V and VP is about 3V. In an embodiment, the PMOS drive transistor 1002 and current source 530 operate as a pull-up transistor for the selected WL.

In an embodiment, the gate voltage is about 0V when writing the memory cell 401. Assuming a Vt of 0.7V and 0.2V across the current source 530 for the PMOS drive transistor 1002, the overdrive voltage (Von) when writing the memory cell 401 will be about 2.1V since (3V−0.2V)−0.7V=2.1V. In an embodiment, the gate voltage is about 0.5V when reading the memory cell 401. Assuming the Vt of 0.7V for the PMOS drive transistor 1002 and about 0.8V across current source 530, the overdrive voltage (Von) when reading the memory cell 401 will be about 1.0V since ((3V−0.8V)−0.7V) −0.5V=1.0V. Thus, the overdrive voltage of the PMOS drive transistor 1002 is lower when driving the read current to the word line than when driving the write current to the word line. Therefore, the resistance of the PMOS drive transistor 1002 is higher when driving the read current to the selected word line than when driving the write to the selected word line. The higher resistance of the PMOS drive transistor 1002 when reading the memory cell may decrease Ihold of the threshold switching selector 502, which improves read margin.

Figure 10B:
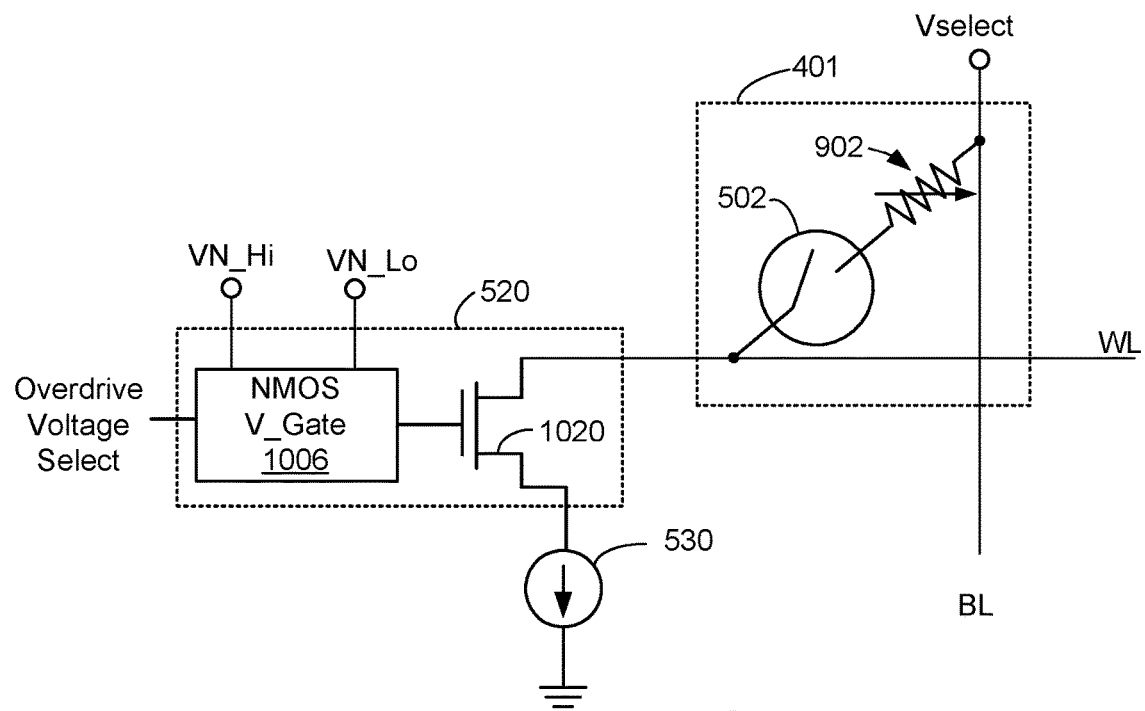

FIG. 10B is a schematic diagram that shows one embodiment of a driver circuit connected to a word line that is connected to a programmable resistance memory cell 401. In one embodiment, the driver circuit 520 is part of the array drivers 224 in the row control circuitry 220 (see FIG. 2A or 2B). The driver circuit 520 includes an NMOS drive transistor 1020 and an NMOS gate voltage source 1006 The NMOS gate voltage source 1006 is connected to the gate of the NMOS drive transistor 1020. The NMOS gate voltage source 1006 is similar to the PMOS gate voltage source 1004 depicted in FIG. 10A, although the magnitudes of the voltages applied to the gate of the NMOS drive transistor 1020 may be different than those described with respect to the PMOS drive transistor 1002. The NMOS gate voltage source 1006 is connected to VN_Hi and VN_Lo, which are two different voltage sources. As one example, VN_Hi is 3V and VN_Lo is 2.5V. The overdrive voltage select signal is used to select between the two different voltage sources.

The NMOS drive transistor 1020 has a source terminal connected to a current source 530, which may provide either a read current or a write current. The NMOS drive transistor 1020 has a drain terminal connected to the word line (WL) in order to pass the current from the current source 530 to the word line. FIG. 10B shows the bit line (BL) being driven by a select voltage. In one embodiment, the select voltage is 3V and the current source 530 is grounded. In an embodiment, the NMOS drive transistor 1020 operates as a pull-down transistor. Thus, the current flows from the bit line, through the memory cell, and through the word line—if described as a current with positive magnitude. However, the current may be described herein as a current of, for example, −15 µA driven from the NMOS drive transistor 1020 to the word line. Thus, by convention used herein, it will be stated that the NMOS drive transistor 1020 drives the current from current source 530 to the word line.

In an embodiment, the gate voltage of the NMOS drive transistor 1020 is about 3V when writing the memory cell 401. Assuming a Vt of 0.7V for the NMOS drive transistor 1020 and 0.2V across the current source 530, the overdrive voltage (Von) will be about 3V−0.7V−0.2V=2.1V when writing the memory cell 401. In an embodiment, the gate voltage of the NMOS drive transistor 1020 is about 2.5V when driving the read current to the word line. Assuming the Vt of 0.7V for the of the NMOS drive transistor 1020 and 0.8V across the current source 530, the overdrive voltage (Von) will be about 2.5V−0.8V−0.7V=1V when reading the memory cell 401. Thus, the overdrive voltage of the NMOS drive transistor 1020 is lower when driving the read current to the word line than when driving the write current to the word line. Therefore, the resistance of the NMOS drive transistor 1020 is higher when driving the read current to the word line than when driving the write current to the word line. The higher resistance of the NMOS drive transistor 1020 when reading the memory cell may decrease Ihold of the threshold switching selector 502, which improves read margin.

Figure 10C:
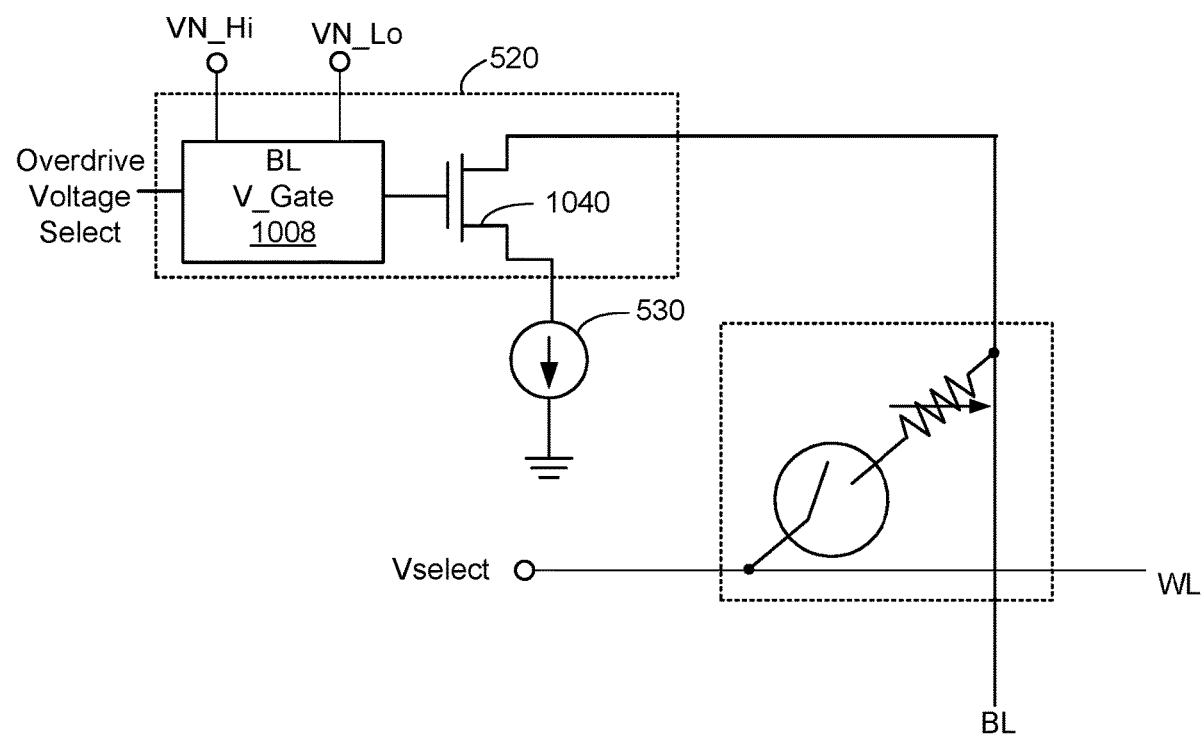

While FIGS. 10A and 10B depict embodiments in which the current drivers are connected to the word line through a decode select transistor, the current drivers could alternatively be connected to the bit line through a select transistor. FIG. 10C is a schematic diagram that shows one embodiment of a driver circuit connected to a bit line that is connected to a programmable resistance memory cell 401. In one embodiment, the driver circuit 520 and current source 530 are part of the driver circuitry 214 in the column control circuitry 210 (see FIGS. 2A, 2B). The driver circuit 520 includes an NMOS drive transistor 1040 and a BL gate voltage source 1008. The BL gate voltage source 1008 is connected to the gate of the NMOS drive transistor 1040. The BL gate voltage source 1008 is connected to VN_Hi and VN_Lo, which are two different voltage sources. As one example, VN_Hi is 3V and VN_Lo is 2.5V. The overdrive voltage select signal is used to select between the two different voltage sources.

The NMOS drive transistor 1040 has a source terminal connected to a current source 530, which may provide either a read current or a write current. The NMOS drive transistor 1040 has a drain terminal connected to the bit line (BL) in order to pass the current from the current source 530 to the bit line. FIG. 10C shows the word line (WL) being driven by a select voltage. In one embodiment, the select voltage is 3V and the current source 530 is grounded. In an embodiment, the NMOS drive transistor 1040 and current source 530 operate as a pull-down transistor for the selected BL.

In an embodiment, the gate voltage of the NMOS drive transistor 1040 is about 3V when writing the memory cell 401. Assuming a Vt of 0.7V for the NMOS drive transistor 1040 and 0.2V across the current source 530, the overdrive voltage (Von) will be about 3V−0.7V−0.2V=2.1V when writing the memory cell 401. In an embodiment, the gate voltage of the NMOS drive transistor 1040 is about 2V when reading the memory cell 401. Assuming the Vt of 0.7V for the of the NMOS drive transistor 1040 and 0.8V across the current source 530, the overdrive voltage (Von) will be about 2.5V−0.8V−0.7V=1V when driving the read current to the bit line. Thus, the overdrive voltage of the NMOS drive transistor 1040 is lower when driving the read current to the bit line than when driving the write current to the bit line. Therefore, the resistance of the NMOS drive transistor 1040 is higher when driving the read current to the bit line than when driving the write current to the bit line. The higher resistance of the NMOS drive transistor 1040 when reading the memory cell may decrease Ihold of the threshold switching selector 502, which improves read margin.

Figure 11:
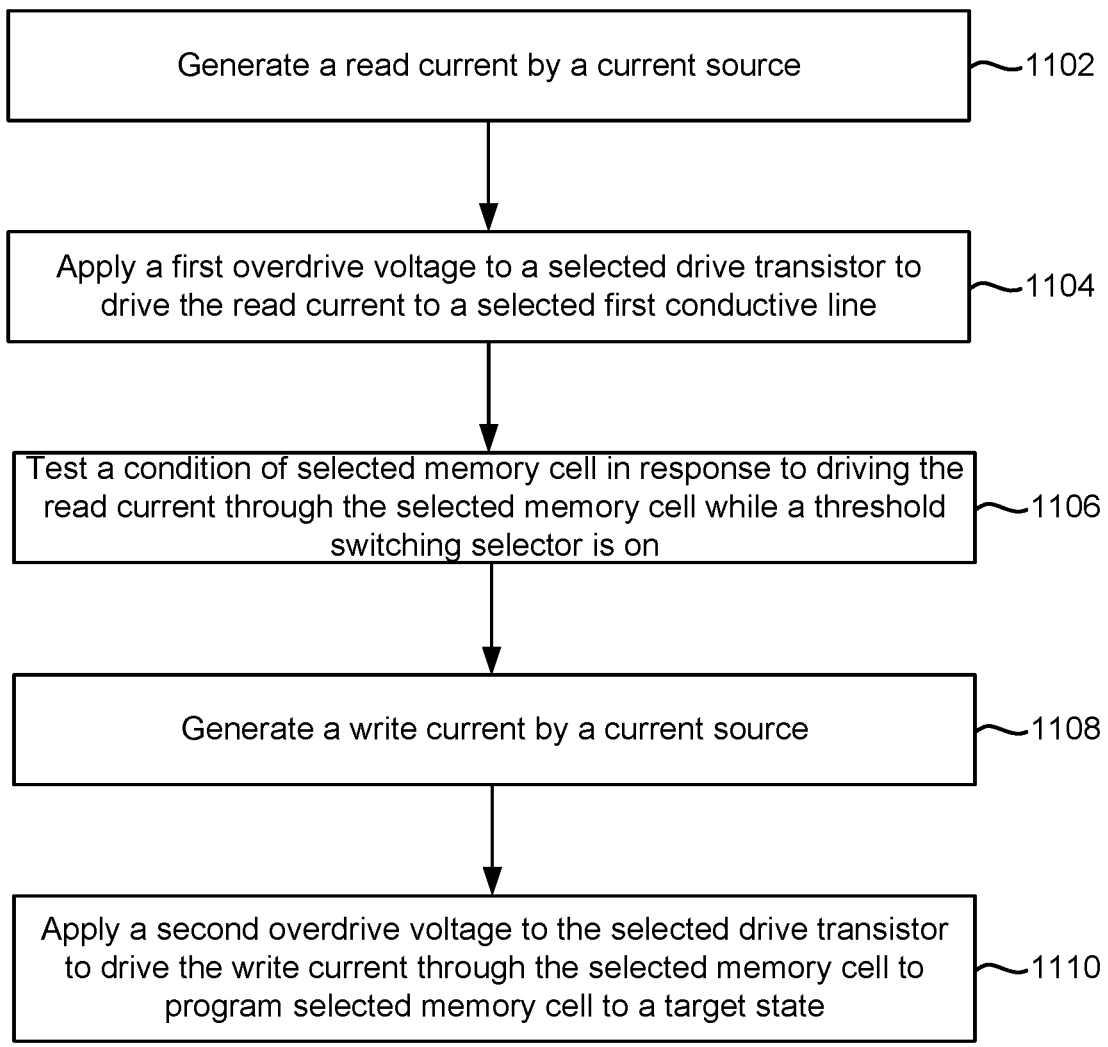
FIG. 11 is a flowchart of one embodiment of a process of operating programmable resistance memory cells in a cross-point array.

FIG. 11 is a flowchart of one embodiment of a process 1100 of operating programmable resistance memory cells in a cross-point array. The cross-point array has Process 1100 describes reading and writing a programmable resistance memory cell that has a programmable resistance memory element in series with a threshold switching selector. In one embodiment, process 1100 is performed during an SRR. In one embodiment, process 1100 includes separate read and write operations. Process 1100 describes the read operation as occurring prior to the write operation; however, the read operation may occur after the write operation. Process 1100 improves read margin when reading the memory cell.

Step 1102 includes generating a read current by a current source. In an embodiment, current source 530 generates and provides the read current to a drive transistor of a current driver 520.

Step 1104 includes applying a first overdrive voltage to a selected drive transistor to drive the read current to a selected first conductive line. A selected programmable resistance memory cell is connected between the selected first conductive line and a selected second conductive line. The read current may charge up a voltage on the selected first conductive line to turn on a threshold switching selector in the selected memory cell. The read current may pass through a portion of the selected first conductive line, through the selected memory cell, and through a portion of the selected second conductive line while the threshold switching selector is on.

Step 1106 includes testing a condition of the selected memory cell in response to the read current passing through the selected memory cell while the two terminal selector is on. In an embodiment, a voltage across the selected memory cell is measured in response to the read current passing through the selected memory cell while the threshold switching selector is on.

Step 1108 includes generating a write current by a current source. In an embodiment, current source 530 generates and provides the write current to a drive transistor of a current driver 520.

Step 1110 includes applying a second overdrive voltage to the selected drive transistor to drive the write current through the selected programmable resistance memory cell to program the selected memory cell to a target state. The write current passes through the portion of the selected first conductive line, through the selected memory cell, and through the portion of the selected second conductive line while the threshold switching selector is on. In one embodiment, step 1110 programs the selected memory cell to a known state during an SRR, which does not necessarily change the state of the memory cell. In one embodiment, step 1110 programs the selected memory cell back to its original state during an SRR, which will change the state of the memory cell. In one embodiment, step 1110 programs the selected memory cell back to the target state during a write operation that is independent of a referenced read operation of steps 1102-1106.

The first overdrive voltage used when driving the read current in step 1104 has a lower magnitude than the second overdrive voltage used when driving the write current in step 1108. The lower overdrive voltage results in a higher resistance of the selected drive transistor when reading, relative to the resistance when writing. The higher resistance of the selected drive transistor improves read margin by lowering Ihold of the threshold switching selector.

Figure 12A:
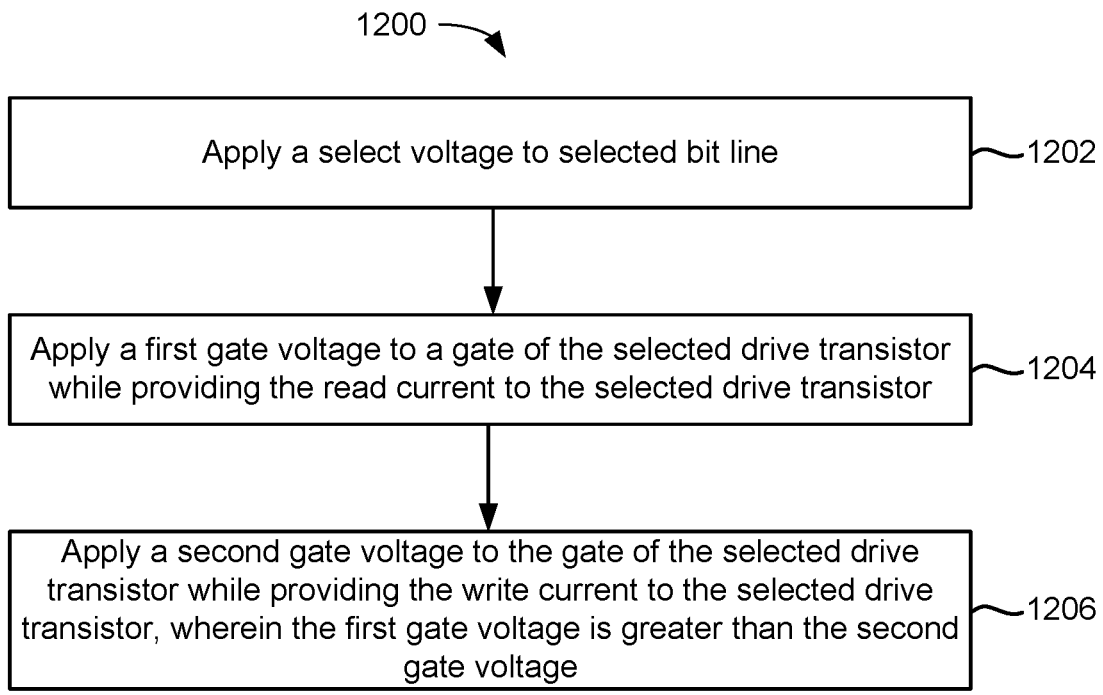
FIG. 12A is a flowchart of one embodiment of a process of providing overdrive voltages to a PMOS drive transistor when operating a programmable resistance memory cell in a cross-point array.

FIG. 12A is a flowchart of one embodiment of a process 1200 of providing overdrive voltages to a drive transistor when operating a programmable resistance memory cell in a cross-point array. Process 1200 may be used in steps 1104 and 1110 of process 1100. In one embodiment, process 1200 is used to operate the current driver 520 depicted in FIG. 10A.

Step 1202 includes applying a select voltage to a selected bit line. In one embodiment, the selected bit line is grounded. In an embodiment, a voltage driver is used to ground the bit line. In an embodiment, the voltage VP in FIG. 10A may be about 3V.

Step 1204 includes applying a first gate voltage to a gate of a selected drive transistor while providing a read current to the selected drive transistor. In an embodiment, the gate of PMOS drive transistor 1002 receives the gate voltage. In an embodiment, the first gate voltage is about 1V. In an embodiment, this results in an overdrive voltage (Von) for the PMOS drive transistor 1002 of about 1.3V, assuming a Vt of about 0.7V. Step 1204 may be performed during one embodiment of step 1104 of process 1100.

Step 1206 includes applying a second gate voltage to the gate of the selected drive transistor while providing a write current to the selected drive transistor. The first gate voltage is greater in magnitude than the second gate voltage. In an embodiment, the gate of PMOS drive transistor 1002 receives a gate voltage of about 0V. In an embodiment, this results in an overdrive voltage (Von) for the PMOS drive transistor 1002 of about 2.3V. The lower overdrive voltage (e.g., 1.3V) when reading results in a higher resistance of the PMOS drive transistor 1002, relative to the resistance when writing. The higher resistance of the PMOS drive transistor 1002 improves read margin by lowering Ihold of the threshold switching selector. Step 1206 may be performed during one embodiment of step 1110 of process 1100.

Figure 12B:
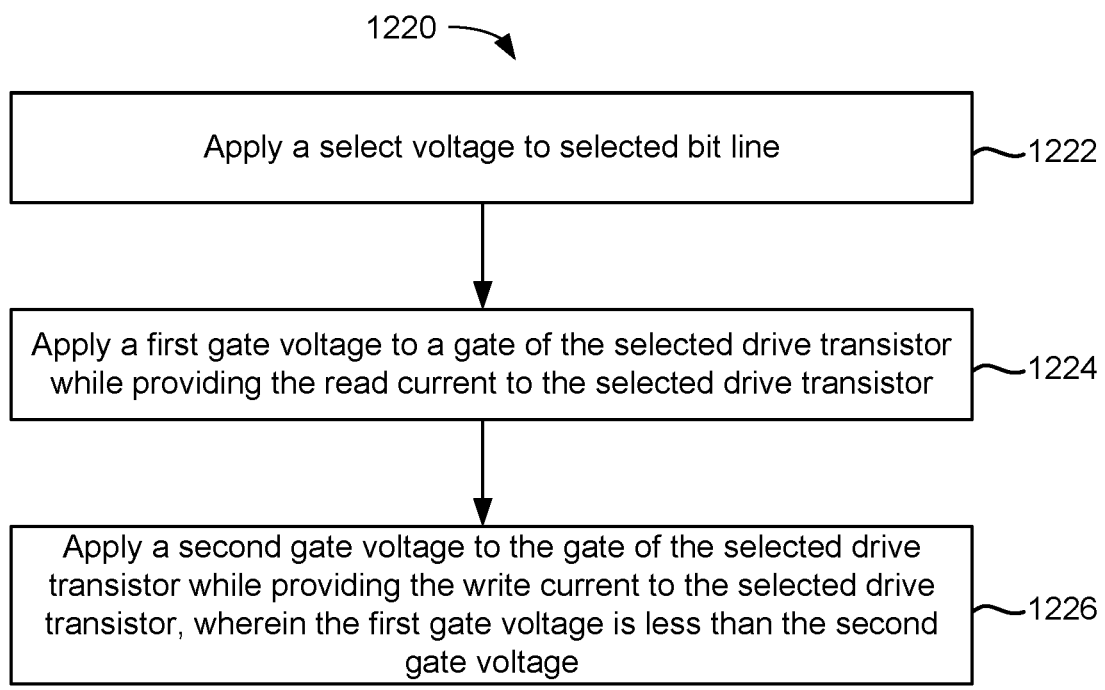
FIG. 12B is a flowchart of one embodiment of a process of providing overdrive voltages to an NMOS drive transistor when operating a programmable resistance memory cell in a cross-point array.

FIG. 12B is a flowchart of one embodiment of a process 1220 of providing overdrive voltages to a drive transistor when operating a programmable resistance memory cell in a cross-point array. Process 1220 may be used in steps 1104 and 1108 of process 1100. In one embodiment, process 1220 is used to operate the current driver 520 depicted in FIG. 10B.

Step 1222 includes applying a select voltage to a selected bit line. In one embodiment, about 3V is applied to the selected bit line. In an embodiment, a voltage driver is used to apply the select voltage to the bit line. In an embodiment, current source 530 in FIG. 10B may be grounded.

Step 1224 includes applying a first gate voltage to a gate of a selected drive transistor while providing a read current to the selected drive transistor. In an embodiment, the gate of NMOS drive transistor 1020 receives the gate voltage. In an embodiment, the first gate voltage is about 2V. In an embodiment, this results in an overdrive voltage (Von) for the NMOS drive transistor 1020 of about 1.3V, assuming a Vt of about 0.7V. Step 1224 may be performed during one embodiment of step 1104 of process 1100.

Step 1226 includes applying a second gate voltage to the gate of the selected drive transistor while providing a write current to the selected drive transistor. The first gate voltage is lower in magnitude than the second gate voltage. In an embodiment, the gate of NMOS drive transistor 1020 receives a gate voltage of about 3V. In an embodiment, this results in an overdrive voltage (Von) for the NMOS drive transistor 1020 of about 2.3V. The lower overdrive voltage (e.g., 1.3V) when reading results in a higher resistance of the NMOS drive transistor 1020, relative to the resistance when writing. The higher resistance of the NMOS drive transistor 1020 improves read margin by lowering Ihold of the threshold switching selector. Step 1226 may be performed during one embodiment of step 1110 of process 1100.

Figure 13A:
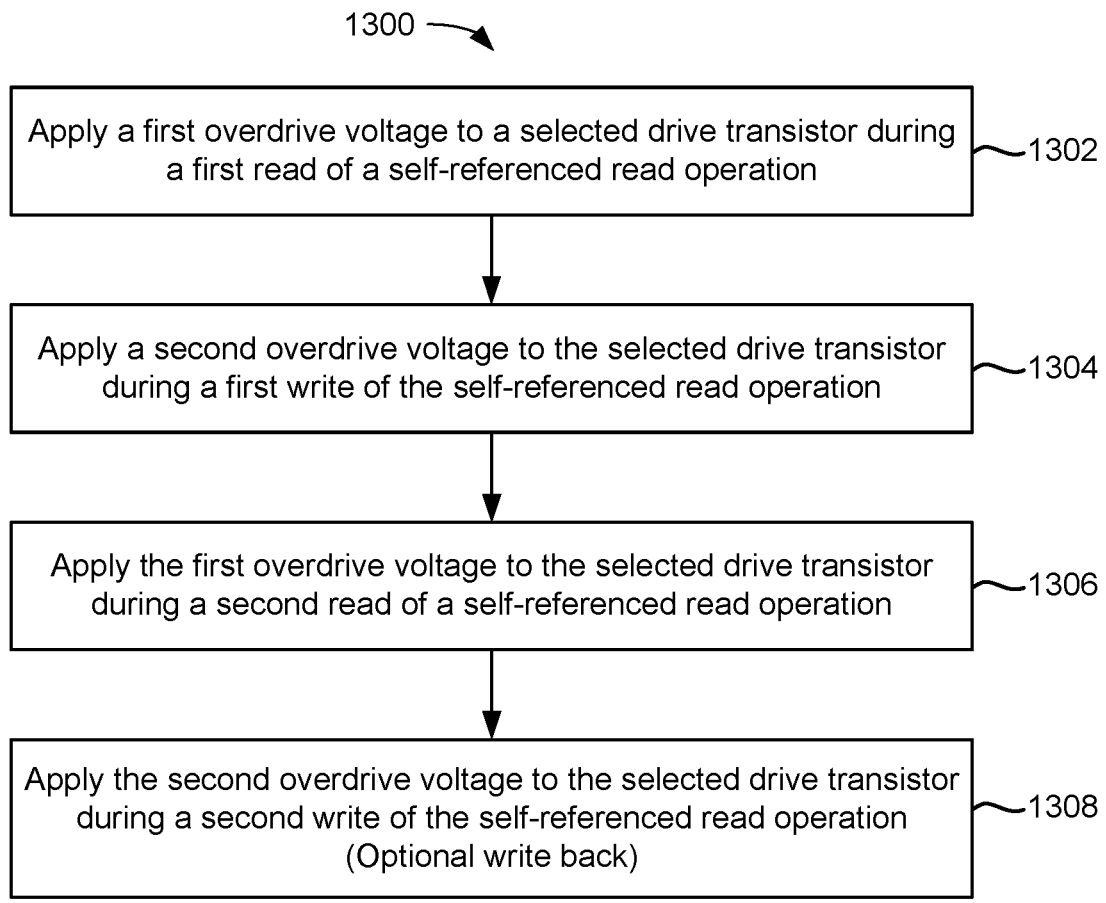
FIG. 13A is a flowchart of one embodiment of a process of providing overdrive voltages to a drive transistor when operating a programmable resistance memory cell in a cross-point array, in which a read occurs in an SRR.

FIG. 13A is a flowchart of one embodiment of a process 1300 of providing overdrive voltages to a drive transistor when operating a programmable resistance memory cell in a cross-point array. Process 1300 may be used in steps 1104 and 1110 of process 1100. Process 1300 is used during an SRR.

Step 1302 includes applying a first overdrive voltage to a selected drive transistor during a first read of a self-referenced read operation. Step 1302 may result in turning on a threshold switching selector of the selected memory cell and keeping the threshold switching selector on while a read current is driven through the selected memory cell. Step 1302 may be performed during one embodiment of step 1104 of process 1100.

Step 1304 includes applying a second overdrive voltage to the selected drive transistor during a first write of the self-referenced read operation. This write may be referred to as a destructive write. Step 1304 results in driving the write current through the selected memory cell while the threshold switching selector remains on. Step 1304 may be performed during one embodiment of step 1110 of process 1100.

Step 1306 includes applying the first overdrive voltage to the selected drive transistor during a second read of the self-referenced read operation. Step 1306 results in driving the read current through the selected memory cell while the threshold switching selector remains on. Step 1306 may be performed during one embodiment of step 1104 of process 1100.

Optional step 1308 includes applying the second overdrive voltage to the selected drive transistor during a second write of the self-referenced read operation. This second write may be referred to as a write-back, as this is used to write the memory cell back to its original state if needed. Step 1308 results in driving the write current through the selected memory cell while the threshold switching selector remains on. Step 1308 may be performed during one embodiment of step 1110 of process 1100.

The second overdrive voltage used when driving the write current in steps 1304 and 1308 has a greater magnitude than the first overdrive voltage used when driving the read current in steps 1302 and 1306. The lower overdrive voltage used when reading results in a higher resistance of the selected drive transistor, relative to the resistance when writing. The higher resistance of the selected drive transistor improves read margin by lowering Ihold of the threshold switching selector.

Figure 13B:
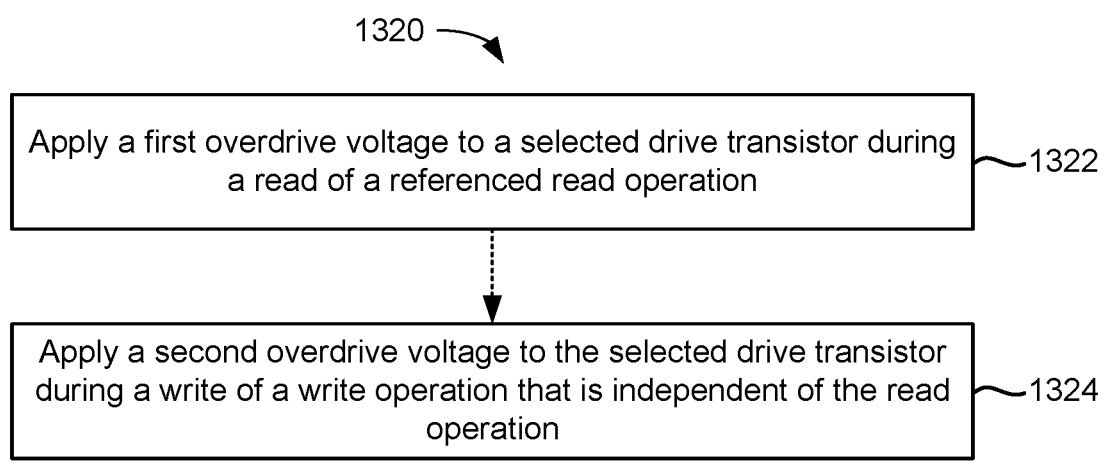
FIG. 13B is a flowchart of one embodiment of a process of providing overdrive voltages to a drive transistor when operating a programmable resistance memory cell in a cross-point array, in which a read occurs in a referenced read.

FIG. 13B is a flowchart of one embodiment of a process 1320 of providing overdrive voltages to a drive transistor when operating a programmable resistance memory cell in a cross-point array. Process 1300 may be used in steps 1104 and 1110 of process 1100. Process 1320 is used for separate read and write operations.

Step 1322 includes applying a first overdrive voltage to a selected drive transistor during a read of a referenced read operation. Step 1322 may result in turning on a threshold switching selector of the selected memory cell and keeping the threshold switching selector on while a read current is driven through the selected memory cell. Step 1322 may be performed during one embodiment of step 1104 of process 1100.

Step 1324 includes applying a second overdrive voltage to the selected drive transistor during a write operation that is independent of the referenced read operation. Step 1324 results in driving the write current through the selected memory cell while the threshold switching selector is on. Step 1324 may be performed during one embodiment of step 1110 of process 1100. A dashed arrow is depicted between steps 1322 and 1324 to indicate that these are separate memory operations.

The first overdrive voltage used when driving the read current in step 1322 has a lower magnitude than the second overdrive voltage used when driving the write current in step 1324. The lower overdrive voltage used when reading results in a higher resistance of the selected drive transistor, relative to the resistance when writing. The higher resistance of the selected drive transistor improves read margin by lowering Ihold of the threshold switching selector.

In one embodiment, one or more word lines that neighbor the selected word line are floated during a read of programmable resistance memory cells in a cross-point array. Floating the word lines results in a reduction in capacitance, which lowers Ihold of the threshold switching selector in the selected memory cell. Therefore, read margin is improved.

Figure 14:
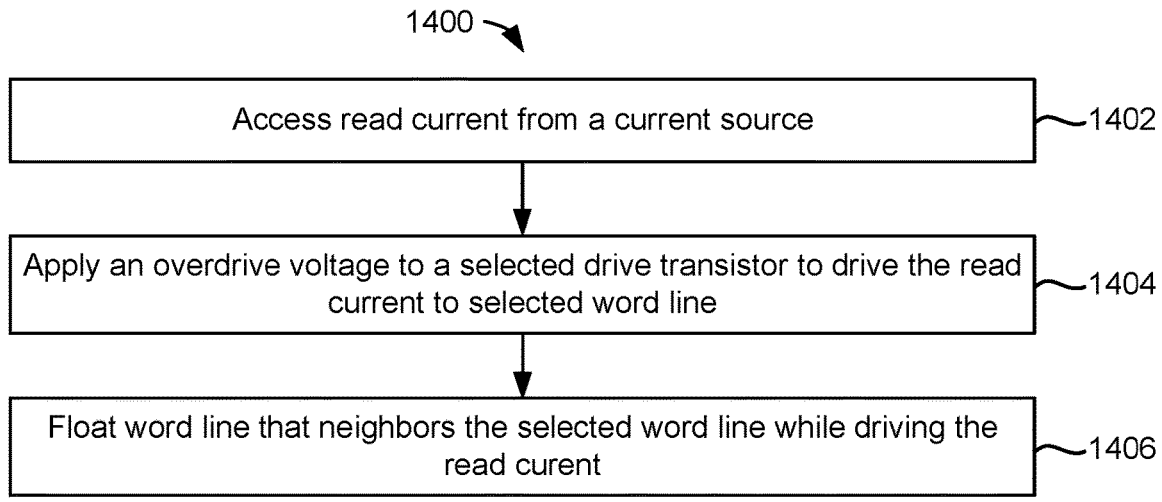
FIG. 14 is a flowchart of one embodiment of a process of floating a word line during a read of a programmable resistance memory cell in a cross-point array.

FIG. 14 is a flowchart of one embodiment of a process 1400 of floating a word line during a read of a programmable resistance memory cell in a cross-point array. In one embodiment, the process 1400 is performed in combination with process 1100. However, process 1400 may be performed independent of process 1100.

Step 1402 includes accessing a read current from a current source. In an embodiment, current source 530 provides the read current to a drive transistor of a current driver 520.

Step 1404 includes applying an overdrive voltage to a selected drive transistor to drive the read current to the selected first conductive line. The selected programmable resistance memory cell is connected between the selected first conductive line and a selected second conductive line. The read current may charge up a voltage on the selected first conductive line to turn on a threshold switching selector in the selected memory cell. The read current may pass through a portion of the selected first conductive line, through the selected memory cell, and through a portion of the selected second conductive line while the threshold switching selector is on. Note that steps 1402 and 1404 may correspond to steps 1102 and 1104, respectively in process 1100.

Step 1406 includes floating an unselected word line that neighbors the selected word line. For example, with reference to FIG. 9, if word line 906*g* is the selected word line then unselected word line 906*f* and/or 906*h* may be floating. In one embodiment, only one of these neighbors is floated. In one embodiment, both of these neighbors are floated. In one embodiment, there is a dummy word line that is at the outer edge of the cross-point array, which is floated in the event that the selected word line is adjacent to the dummy word line. In step 1406, other unselected word lines that are not neighbors to the selected word line may be driving to a voltage that is about midway between the selected word line voltage and the selected bit line voltage. For example, if the selected bit line voltage is 0V and the selected word line is being driven towards about 3V (the current driven selected word line might not reach 3V), these other unselected word lines could be driven to about 1.5V (VMID). In one embodiment, floating a neighbor unselected word line is accomplished by turning off a transistor that would otherwise connect the neighbor unselected word line to VMID.

Figure 15:
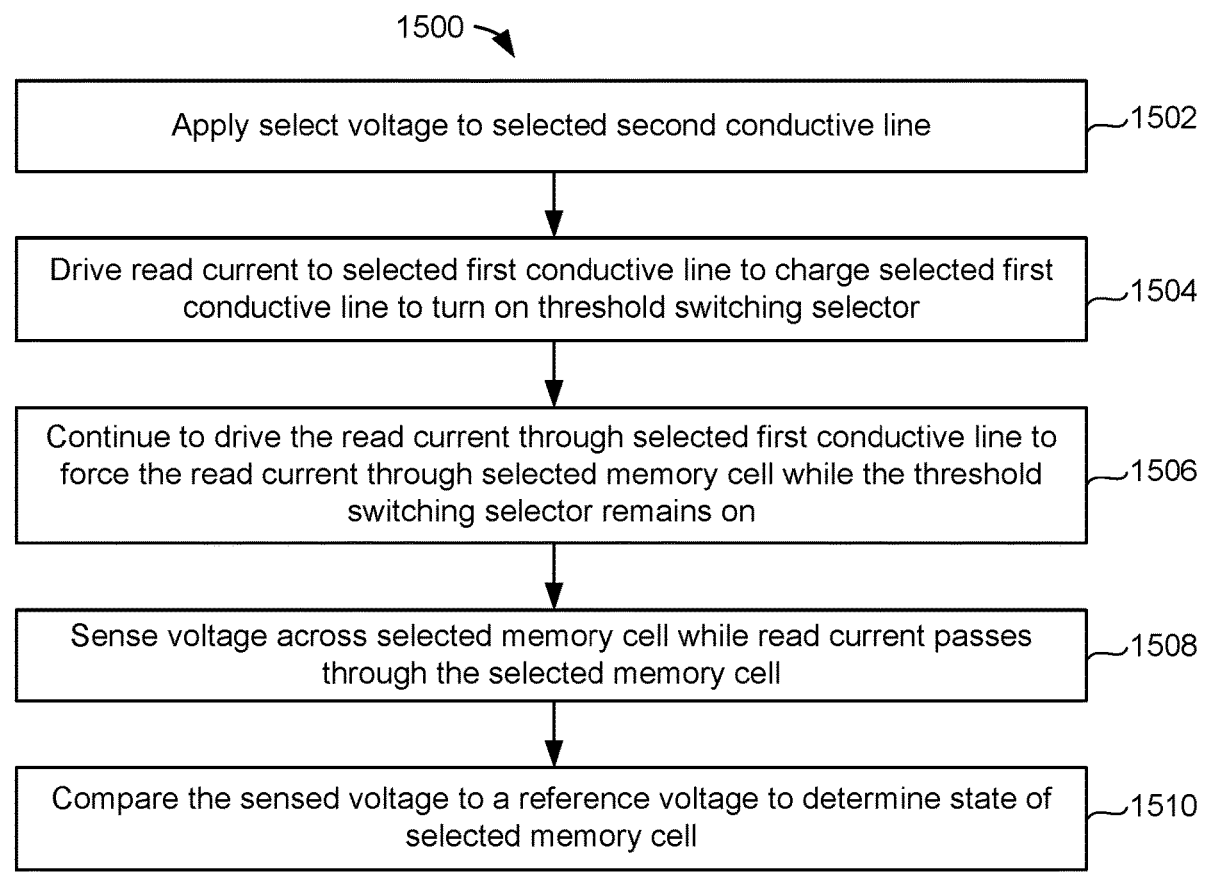
FIG. 15 is a flowchart depicting one embodiment of a process of current-force referenced read.

FIG. 15 is a flowchart depicting one embodiment of a process 1500 of current-force referenced read. Process 1500 provides further details when the read in any of processes 1100, 1200, 1220, 1320, or 1400 is a referenced read. Process 1500 describes reading one memory cell. The process may be performed in parallel on the different memory cells in the group. The group may store an ECC codeword. Step 1502 includes applying a select voltage to a selected second conductive line. With reference to FIG. 9, Vselect is provided to the selected bit line. Unselect voltages are provided to the unselected bit lines.

Step 1504 includes driving a read current to a selected first conductive line to charge up the selected first conductive line to turn on the threshold switching selector in the selected memory cell. With reference to FIG. 9, $I_{access}$ is driven into the selected word line 1206g. A select voltage is applied to the selected bit line. Read currents are not provided to the unselected word lines.

Step 1506 includes continuing to drive the read current to the selected first conductive line to force the read current through the selected memory cell while the threshold switching selector remains on. With reference to FIG. 9, $I_{access}$ is driven into the selected word line 1206g. Read currents are not provided to the unselected word lines. The read current may flow through a portion of the selected word line, through the selected memory cell, and through a portion of the selected bit line. In particular, the read current may flow through the portion of the selected word line from where the word line is driven (by a current driver) to the selected memory cell. The read current may flow through the portion of the selected bit line from the selected memory cell to where the bit line is driven by the voltage driver.

Step 1508 includes sensing a voltage generated by the selected memory cell while the read current passes through the selected memory cell. In an embodiment, the voltage between the selected word line and the selected bit line at the selected bit is sensed, either directly or on a global node that includes the drive circuitry. The sensed voltage is between ground and the current source driving current into the array decode circuitry.

Step 1510 includes comparing the sensed voltage to a reference voltage to determine a state of the memory cell. The magnitude of the reference voltage is independent of the physical state (e.g., resistance) of the memory cell. A common reference voltage may be used for different memory cells in the array. However, in some embodiments, the magnitude of the reference voltage may be based on a factor such as the location of the memory cell in the array. Therefore, the reference voltage is not required to have the same magnitude for all memory cells in the array.

Figure 16:
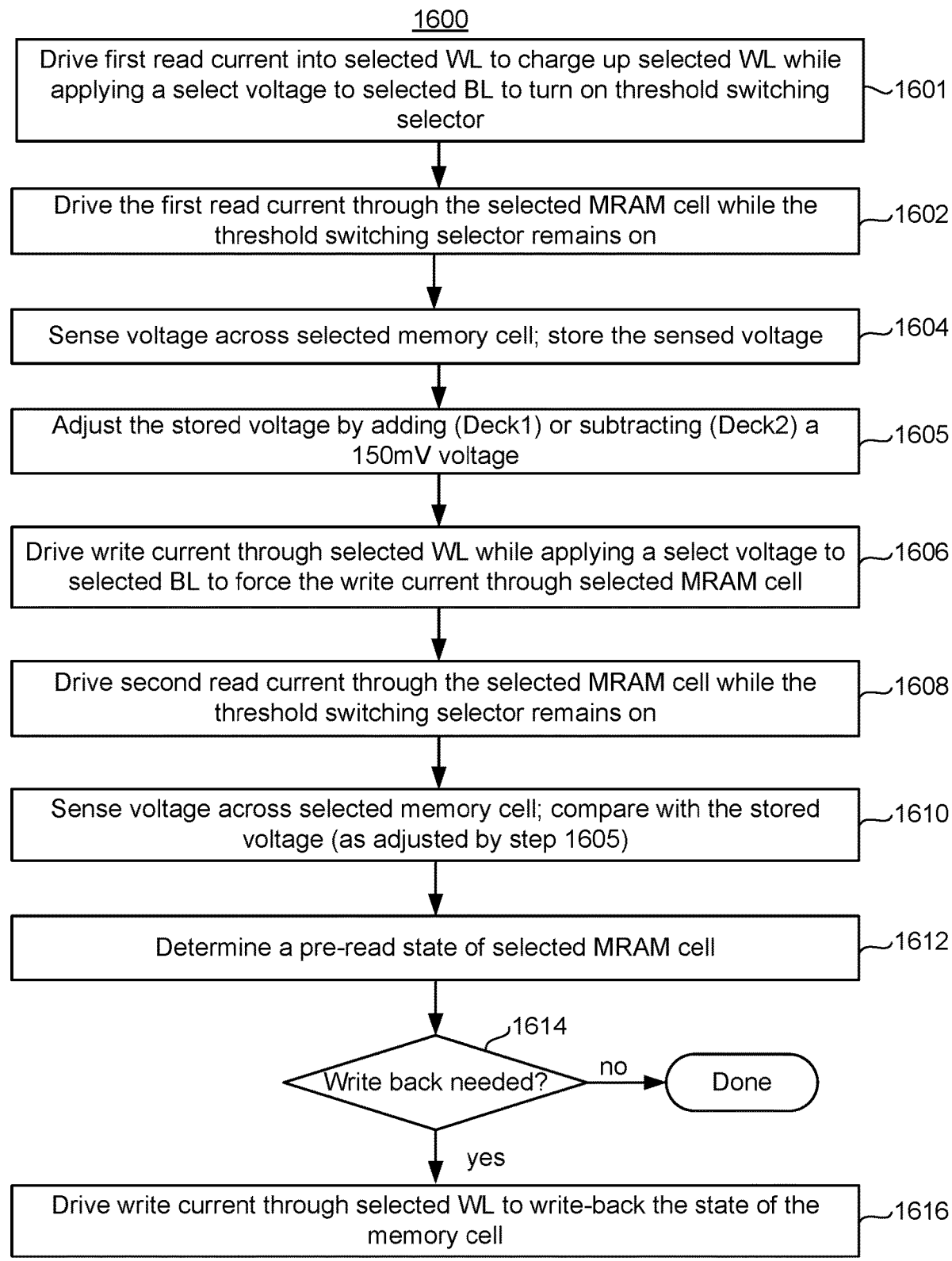
FIG. 16 is a flowchart depicting one embodiment of a process of current-force SRR.
Figure 17A:
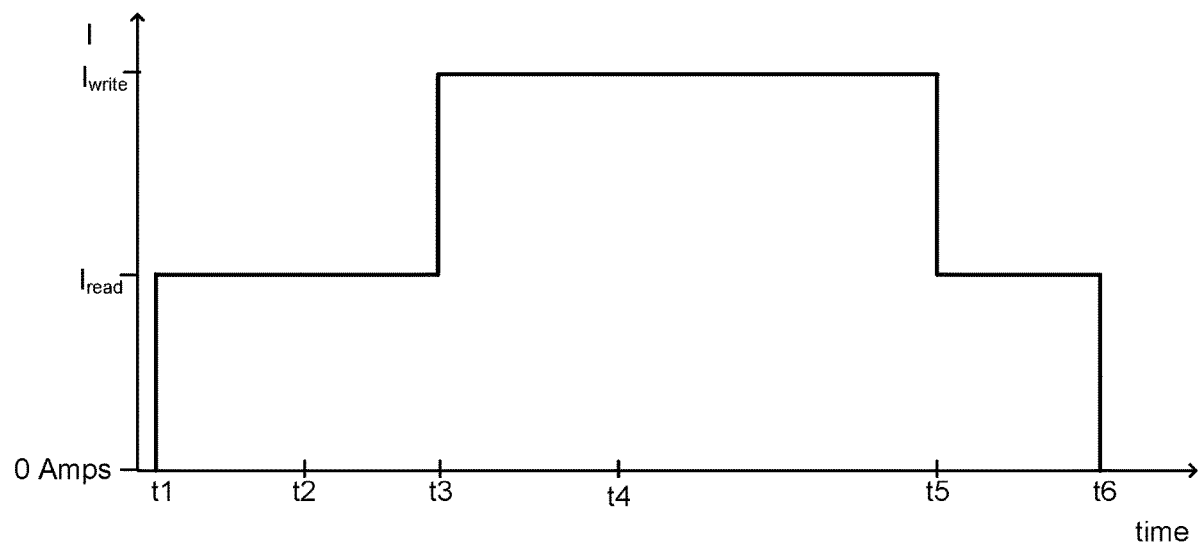
FIG. 17A depicts current versus time for an accessed bit current that is driven through a selected word line during an embodiment of current-force SRR.
Figure 17B:
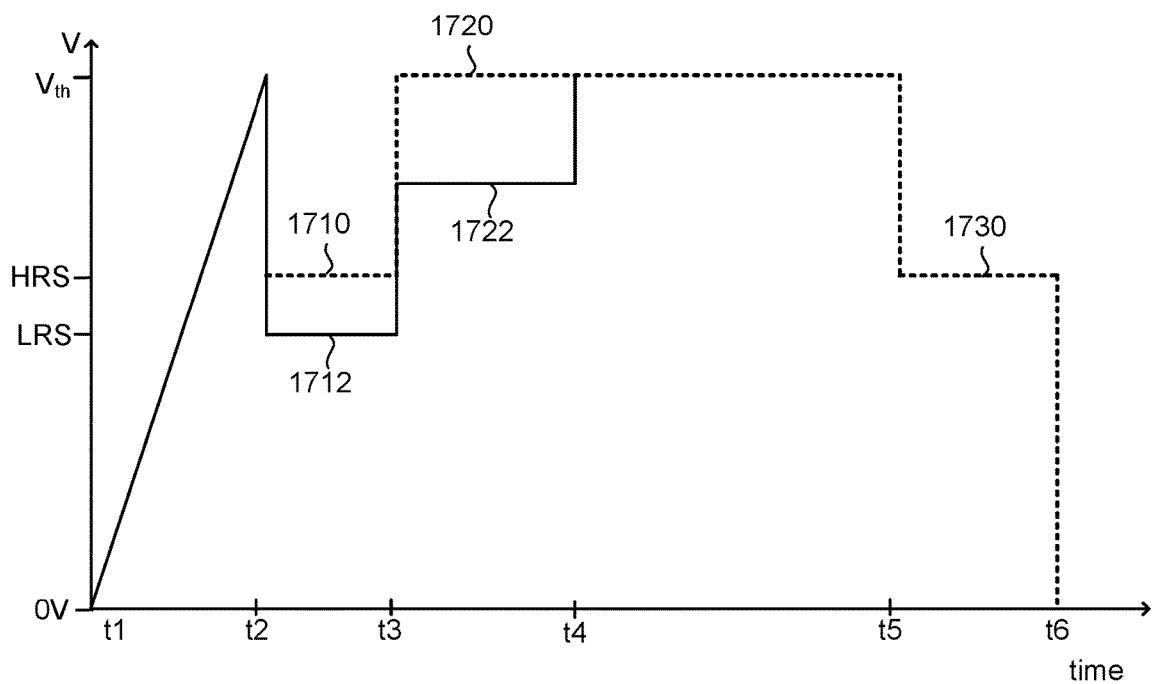
FIG. 17B depicts voltage versus time for the voltage across a selected MRAM cell during an embodiment of current-force SRR.

FIG. 16 is a flowchart depicting one embodiment of a process 1600 of current-force SRR. The SRR may be referred to as a destructive SRR, which means that the original state of the memory cell may be changed during the SRR. Process 1600 provides further details when the read in any of processes 1100, 1200, 1220, 1300, or 1400 is an SRR. Process 1600 describes reading one memory cell, and may be performed in parallel on the memory cells in the codeword group (which may reside in different tiles or groups of tiles). In one embodiment, the process 1600 is performed by a control circuit in the memory die 292. In one embodiment, the process 1600 is performed by a control circuit in the control die 290. In one embodiment, the process 1600 is performed by a control circuit (e.g., host processor 122) in the host 122. Process 1600 will be discussed with reference to FIGS. 17A and 17B. FIG. 17A depicts current versus time for the access current that is driven through a selected word line during an embodiment of current-force SRR. FIG. 17B depicts voltage versus time for the voltage across a selected MRAM cell during an embodiment of current-force SRR.

Step 1601 includes driving a first read current into the selected word line to charge up the selected word line while applying a select voltage to a selected bit line in order to turn on the threshold switching selector of the selected MRAM cell. FIGS. 17A and 17B will now be discussed with respect to one MRAM cell 401 to further elaborate on step 1601. With reference to FIG. 17A, the current is increased to $I_{read}$ at time t1. With reference to FIG. 17B, the voltage across the memory cell 401 increases from t1 to t2. The threshold switching selector 502 is off between t1 and t2. Between t1 and t2, the current causes the word line voltage to increase. The current also supports any leakage in the path. Once the voltage across threshold switching selector 502 reaches the threshold voltage $V_{th}$ of the threshold switching selector 502, it will turn on and switch to a low resistance state (at t2). Thus, the voltage across the series combination of the threshold switching selector 502 and the resistive MRAM element 902 ramps up between t1 and t2 as the threshold switching selector is in an off state.

Recall that in various embodiments described herein, a first overdrive voltage is applied to a drive transistor to drive a read current to a selected word line. In an embodiment, the first overdrive voltage is applied to the drive transistor between t1 and t2 while the threshold switching selector 502 is off. Thus, the first overdrive voltage is applied to the drive transistor between t1 and t2 while the read current is charging the voltage on the selected word line.

Step 1602 includes driving the first read current through the selected MRAM cell while the threshold switching selector remains on. With reference to FIG. 9, $I_{access}$ is driven by current driver 910g through selected first conductive line 906g to drive $I_{access}$ through memory cell 401a using a current of, for example, 15 ua. With reference to FIG. 9, $V_{select\_BL}$ is applied by voltage driver 912b to second conductive line 908b. In one embodiment, for example, $I_{access}$ is 15 μA and $V_{select\_BL}$ is 0V. In another embodiment, the current is −15 ua and $V_{select\_BL}$ is 3.3V for 20 nm CD MRAM with RA 10 that may have low resistance state of about 25K Ohm and high resistance state of about 50K Ohm.

FIGS. 17A and 17B will now be discussed with respect to one MRAM cell 401 to further elaborate on step 1602. With reference to FIG. 17A, the current remains at $I_{read}$ between t2 and t3. With reference to FIG. 17B, the threshold switching selector 502 remains on between t2 and t3 (in a low resistance state). Once the threshold switching selector 502 is in the on state (at t2), the $I_{read}$ current will flow through the selected memory cell 401. As the access current is held fixed at $I_{read}$, the voltage across the memory cell will drop to a level dependent upon the series resistance of the MRAM element 902 and the on-state resistance of the threshold switching selector 502. For a binary embodiment in which a memory cell only stores two states, the memory cell will have a high resistance, AP-state, for example 50K Ohm, and a low resistance, P-state, for ex example 25K Ohm. The resultant voltage across the series connected MRAM element 902 and threshold switching selector 502 in response to the $I_{read}$ current for the high resistance state (HRS) and low resistance state (LRS) are respectively shown as lines 1710 and 1712. Although the discussion here is in the context of an MRAM based memory cell being placed in series with the threshold switching selector, this read technique can similarly be applied to other programmable resistance memory cells, such as PCM or ReRAM devices.

In various embodiments described herein, a first overdrive voltage is applied to a drive transistor to drive a read current through the selected memory cell. In an embodiment, the first overdrive voltage is applied to the drive transistor between t2 and t3 while the threshold switching selector 502 remains on. Thus, the first overdrive voltage is applied to the drive transistor between t2 and t3 while the read current is driven through the selected MRAM cell.

However, increasing the resistance of the drive transistor can impact the word line voltage, which impacts the voltage of the high resistance state (HRS) and low resistance state (LRS), which are shown as lines 1710 and 1712 in FIG. 17B. Increasing the resistance of the drive transistor could shift up the word line voltage, which means that the voltage of both the high resistance state (HRS) and low resistance state (LRS) would be shifted up. The drive transistor is limited in how far it can pull-up the word line voltage (assuming the example of the drive transistor as a pull-up transistor). If the voltage of the high resistance state (HRS) and low resistance state (LRS) shift up too far then saturation occurs, meaning the voltage difference between HRS and LRS will decrease if the drive transistor is not able to provide a large enough voltage to the selected word line. Therefore, this saturation effect should be considered when determining a suitable overdrive voltage for the drive transistor. In other words, if the overdrive voltage of the drive transistor is too low, this could adversely affect the read operation.

Returning again to FIG. 16, step 1604 includes sensing a voltage across the selected memory cell. Step 1604 may also include storing the sensed voltage on, for example, a capacitor. Step 1605 includes adjusting the stored voltage by adding (Deck1) or subtracting (Deck2) a 150 mV voltage. In one embodiment, Deck1 and Deck2 are two different layers (see 418, 420 in FIG. 4D).

Step 1606 includes driving a write current through the selected word line while applying a select voltage to the selected bit line to force the write current through the selected MRAM cell. With reference to FIG. 9, $I_{access}$ is driven by current driver 910g through selected first conductive line 906g to force $I_{access}$ through memory cell 401a. With reference to FIG. 9, $V_{select\_BL}$ is applied by voltage driver 912b to second conductive line 908b. In one embodiment, $I_{access}$ to write is 30 µA and $V_{select\_BL}$ is 0V. In another embodiment, $I_{access}$ to write is −30 µA and $V_{select\_BL}$ is 3.3V FIGS. 17A and 17B will now be discussed with respect to one MRAM cell 401 to further elaborate on step 1606. With reference to FIG. 17A, the access current is increased to $I_{write}$ at time t3 and is held at $I_{write}$ until t5. With reference to FIG. 17B, at t3 the voltage across the MRAM cell 401 increases at t3. If the MRAM cell 401 was in the HRS (line 1710), then the voltage across the MRAM cell will increase to the level indicated by line 1720 at t3 and stay there until t5. Recall that the HRS is the AP-state. Thus, this MRAM cell will stay in the AP-state.

If the MRAM cell 401 was in the LRS (line 1712), then the voltage across the MRAM cell will increase to the level indicated by line 1722 at t3. Recall that the LRS is the P-state. If the MRAM cell 401 was in the P-state, it will switch to the AP-state. FIG. 17B shows line 1722 increases at t4 to meet with line 1720. This represents the MRAM cell has switched from the P-state (LRS) to the AP-state (HRS).

Recall that in various embodiments described herein, a second overdrive voltage is applied to a drive transistor to drive a write current through the selected memory cell. In an embodiment, the second overdrive voltage is applied to the drive transistor between t3 and t5 while the threshold switching selector 502 remains on. Thus, the second overdrive voltage is applied to the drive transistor between t3 and t5 while the write current is driven through the selected MRAM cell. As described in, for example, process 1100 the second overdrive voltage used when driving the write current through the MRAM cell has a higher magnitude than the first overdrive voltage used when driving the read current through the MRAM cell. Using the higher overdrive voltage when the write current is driven through the selected MRAM cell improves the write operation.

Returning again to FIG. 16, step 1608 includes driving a second read current through the selected word line while the threshold switching selector remains on. Step 1608 includes applying the select voltage to the selected bit line while driving the read current to the selected word line in order to force the second access current through the selected MRAM cell. In one embodiment, the second access current has the same direction and substantially the same magnitude as the first access current. With reference to FIG. 9, $I_{access}$ is driven by current driver 910g through selected first conductive line 906g to force $I_{access}$ through memory cell 401a. With reference to FIG. 9, $V_{select}$ is applied by voltage driver 912b to second conductive line 908b. In one embodiment, $I_{access}$ is 15 µA and $V_{select}$ is 0V.

FIGS. 17A and 17B will now be discussed with respect to one MRAM cell 401 to further elaborate on step 1608. With reference to FIG. 17A, the access current is decreased from $I_{write}$ to $I_{read}$ at time t5 and is held at $I_{read}$ until t6. With reference to FIG. 17B, the voltage across the memory cell 401 decreases at t5 to the level indicated by 1730 and holds at that level until t6. Note that line 1730 is at the HRS level. Also recall that regardless of the initial state of the MRAM cell, the MRAM cell was placed into the HRS state (AP-state) in step 1608.

Recall that in various embodiments described herein, a first overdrive voltage is applied to a drive transistor to drive a read current through a selected memory cell. In an embodiment, the first overdrive voltage is applied to the drive transistor between t5 and t6 while the threshold switching selector 502 remains on. Thus, the first overdrive voltage is applied to the drive transistor between t5 and t6 while the read current is driven through the selected MRAM cell. As described in, for example, process 1100 the first overdrive voltage used when driving the read current has a lower magnitude than the second overdrive voltage used when driving the write current. The lower overdrive voltage results in a higher resistance of the selected drive transistor when reading, relative to the resistance when writing. The higher resistance of the selected drive transistor improves read margin by lowering Ihold of the threshold switching selector 502.

Returning again to FIG. 16, step 1610 includes sensing the voltage across the selected memory cell. Step 1610 also includes comparing the voltage sensed in step 1610 with the stored voltage (as adjusted in step 1605).

Step 1612 includes determining a pre-read state of the selected MRAM cell. Step 1612 is based on a comparison of a stored voltage from driving the first read current through the selected memory cell (as adjusted by step 1605) to the voltage from forcing the second read current through the selected memory cell.

FIGS. 17A and 17B will now be discussed with respect to one MRAM cell 401 to further elaborate on step 1612. The first voltage on the selected word line from applying the first read current will be the voltage between t2 and t3. Hence, the first voltage is either the HRS level 1710 or the LRS level 1712. Note that this first voltage may be stored in step 1604 by, for example, charging a sense capacitor using the word line voltage. However, this voltage is adjusted as described in step 1605. The second voltage on the selected word line from applying the second read current will be the voltage between t5 and t6. This second voltage will typically be at about the HRS level 1710. However, the second voltage could be slightly different from the HRS level 1710. Comparing the first (adjusted) voltage with the second voltage may thus be used to determine whether the MRAM cell was at the HRS level 1710 or the LRS level 1712 between t2 and t3. To facilitate comparison, the level generated by the Read1 current to the AP-state may be stored and adjusted positive by about half the voltage difference between HRS and LRS, for example 150 mV. Alternatively, the level may be adjusted negative if the Read1 current is to the P-state. These choices may be reversed depending on MRAM cell orientation as will be apparent to one reasonably skilled in the art.

Returning again to FIG. 16, after step 1612 a determination is made whether a write back is needed (step 1614). As noted above, process 1600 is a destructive SRR in which the original state of the memory cell may be lost during step 1606. The write back is used to restore the original state of the memory cell, if needed. Hence, step 1616 is performed if the write back is needed. Step 1616 includes driving a write current through the selected word line to write back the original state of the memory cell, if needed. Recall that step 1606 placed all MRAM cells in the AP-state. Hence, all MRAM cells that were originally in the P-state are written back to the P-state, in step 1616. All MRAM cells that were originally in the AP-state are left in the AP-state, in step 1616. Note that as described above, the ECC engine can begin to decode and correct the data in step 1612. Hence, the data can be decoded, corrected, and provided to a requestor prior to the write back finishing in step 1616.

Figure 18:
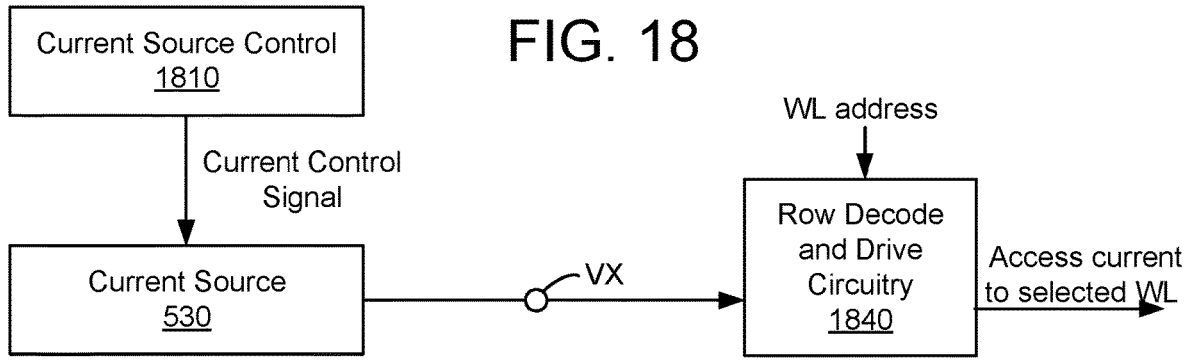
FIG. 18 is a block diagram of components for forcing a current to a word line.

FIG. 18 is a block diagram of components for driving a current to a word line in order to force a current through a memory cell. The current source generator 1810 generates and outputs a current control signal, which is provided to the current source 530. In an embodiment, the current control signal is a high-precision voltage. The current source 530 outputs a current in response to the current control signal. The current source 530 could be used to generate a read current or a write current, which may be referred to as an access current. The access current is provided to the selected word line by way of row decode and drive circuitry 1840. Row decode and drive circuitry 1840 contains a number of current drivers 520. In an embodiment, row decode and drive circuitry 1840 includes in row decoder 222 and array drivers 224 of the row control circuitry 220.

The row decode and drive circuitry 1840 inputs a WL address, and provides the access current to the selected word line. The state machine 262 may provide the WL address to the row decode and drive circuitry 1840. In an embodiment, there are separate current sources 530 for generating the read current and the write current, with selection logic to select the appropriate current source for the memory operation. In an embodiment, there is a first current source for generating a positive write current and a second current source for generating a negative write current. Not depicted in FIG. 18 is a bit line driver, which may provide a select voltage to the selected bit line. The access current may flow through a portion of the selected word line, through the selected memory cell, and through a portion of the selected bit line (while the threshold switching selector is on). In one embodiment, the voltage at node VX is clamped, such that it does not exceed a certain magnitude. Clamping the voltage at node VX will clamp the voltage on the word line, which reduces stress on memory cells (e.g., MRAM cells) while maintaining a low bit error rate by choice of clamp voltage high enough not to reduce read margin yet low enough to reduce stress on some smaller CD MRAM bits.

Figure 19:
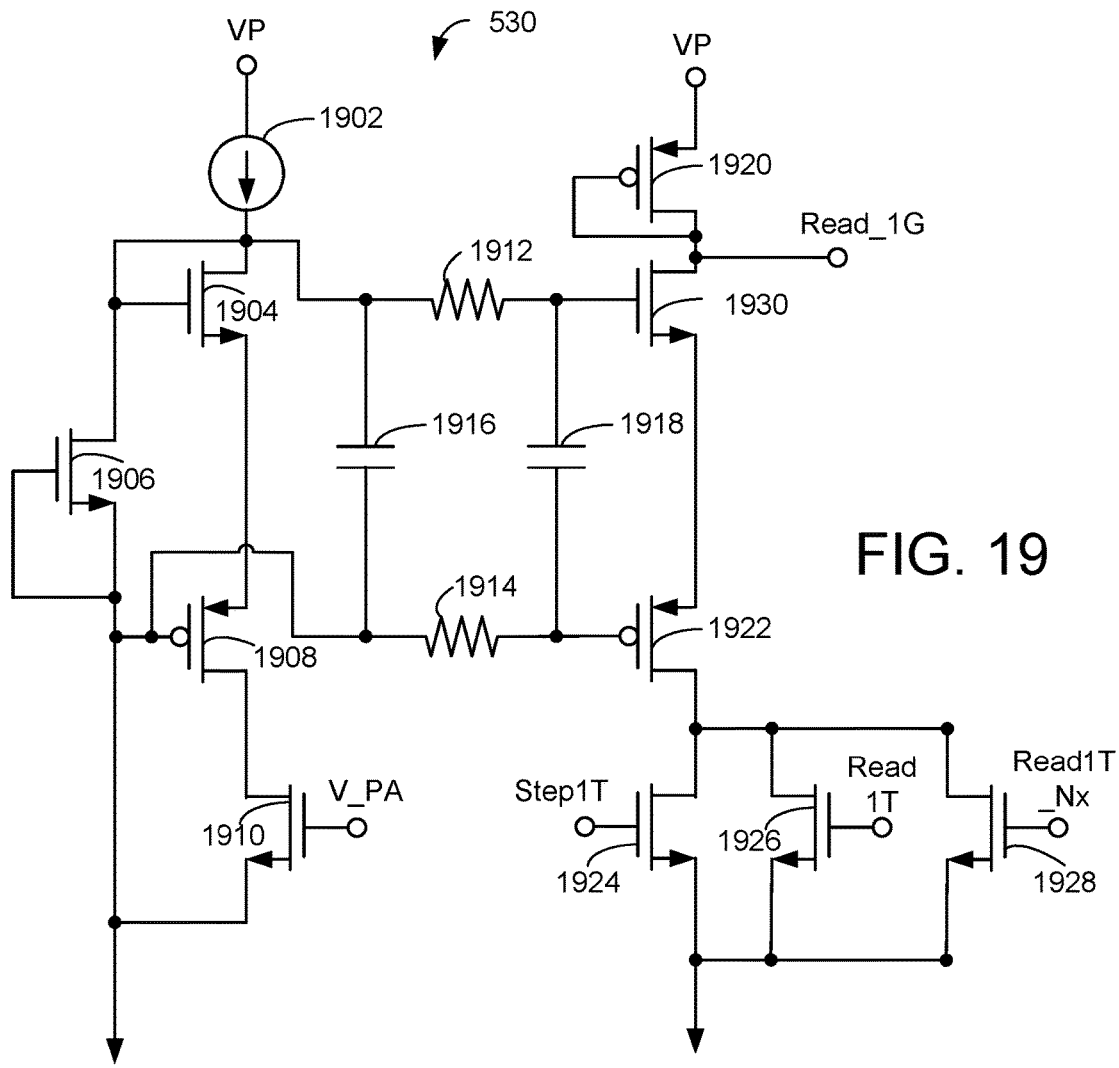
FIG. 19 is a schematic diagram of one embodiment of a current generator that reduces variation in tile to tile current despite varying distances from reference and power supplies.

FIG. 19 is a schematic diagram of one embodiment of the current source generator 530. The current source generator 530 outputs voltage Read_1G (between transistors 1920 and 1930), which is provided to the current source 530. In some embodiments, Read_1G may be provided to several types of current sources, such as a read current source, a positive current write source, and a negative current write source.

The gates of transistors 1930 and 1922 are provided voltages by resistors 1912 and 1914, respectively. Those resistor voltages are generated by the left-side circuitry, which includes current source 1902, transistor 1904, transistor 1906, transistor 1908, and transistor 1910, as well as capacitors 1916 and 1918. The current source 1902 may be about 5 micro-Amperes. The right-side circuitry includes transistors 1920, 1930, 1922, 1924, 1926, and 1928. In some embodiments, the left-side circuitry is used for an entire bank, with a separate version of the right-side circuitry being used for each tile. The current source 1902, for example 5ua, may generate a voltage approximately 2Vt above ground on the drain of transistor 1904 that is distributed to the tiles. V_PA into the gate of transistor 1910 may be high (e.g., VP) to activate the circuit, or it may open the circuit if the gate of transistor 1910 is taken to ground so current is eliminated when the circuit is unused. The gate of transistor 1904 may be distributed to the tiles and drive only transistor gates and no source or drains to eliminate drops to the tiles and render the resulting current in the tiles relatively the same for each. In turn, the two distributed voltages at approximately 1.5V and 0V are connected in each tile to generators on the right. That is, the gate of transistor 1930 will be approximately 1.5V, and the gate of transistor 1922 approximately 0V. In turn, those mirror circuits may be turned on by either StepIT, ReadIT, or ReadIT_NX high at VP. The result is that the current of current source 1902 is driven into transistor 1920 drain and the gate of transistor 1920 will be at VP-Vt, or approximately 2.5V if VP is 3.3V.

In view of the foregoing, it can be seen that, according to a first embodiment, an apparatus, comprising a cross-point memory array comprising a plurality of first conductive lines, a plurality of second conductive lines, and a plurality of programmable resistance memory cells. Each respective memory cell is connected between one of the first conductive lines and one of the second conductive lines. Each memory cell comprises a programmable resistance memory element and a two terminal selector connected in series with the memory element. The apparatus has a driver circuit coupled to a selected first conductive line. The driver circuit comprising a drive transistor configured to receive a read current and to drive the read current to the selected first conductive line and to receive a write current and to drive the write current to the selected first conductive line. The apparatus has a control circuit in communication with the driver circuit and the cross-point memory array. The control circuit is configured to apply a first overdrive voltage to the drive transistor to cause the drive transistor to drive the read current to a selected first conductive line connected to a selected memory cell. The control circuit is configured to test a condition of the selected memory cell in response to the read current passing through the selected memory cell while the two terminal selector of the selected memory cell is on. The control circuit is configured to apply a second overdrive voltage to the selected drive transistor to cause the selected drive transistor to drive the write current to the selected first conductive line to program the selected memory cell to a target state, wherein the first overdrive voltage has a lower magnitude than the second overdrive voltage.

In a second embodiment, in furtherance of the first embodiment, the control circuit is further configured to float one or more of the first conductive lines that neighbor the selected first conductive line while the drive transistor drives the read current to the selected first conductive line.

In a third embodiment, in furtherance of the first or second embodiments, the programmable resistance memory element comprises a magnetoresistive random access memory (MRAM) element.

In a fourth embodiment, in furtherance of the first or second embodiments, the programmable resistance memory element comprises a phase change memory element.

In a fifth embodiment, in furtherance of any of the first to fourth embodiments, the two terminal selector comprises an Ovonic Threshold Switch (OTS).

In a sixth embodiment, in furtherance of any of the first to fifth embodiments, the drive transistor is a pull-up transistor. The control circuit is configured to apply a select voltage to a selected second conductive line connected to the selected memory cell while the drive transistor drives the read current to the selected first conductive line. The control circuit is configured to apply a first gate voltage to a gate of the drive transistor to cause the drive transistor to drive the read current to the selected first conductive line, wherein the selected first conductive line is driven to a voltage above the select voltage applied to the selected second conductive line. The control circuit is configured to apply a select voltage to the selected second conductive line while the drive transistor drives the write current to the selected first conductive line. The control circuit is configured to apply a second gate voltage to the gate of the drive transistor to cause the drive transistor to drive the write current to the selected first conductive line, wherein the selected first conductive line is driven to a voltage above the select voltage applied to the selected second conductive line, wherein the first gate voltage has a greater magnitude than the second gate voltage.

In a seventh embodiment, in furtherance of any of the first to fifth embodiments, the drive transistor is a pull-down transistor. The control circuit is configured to apply a select voltage to a selected second conductive line connected to the selected memory cell while the drive transistor drives the read current to the selected first conductive line. The control circuit is configured to apply a first gate voltage to a gate of the drive transistor to cause the drive transistor to drive the read current to the selected first conductive line, wherein the selected first conductive line is driven to a voltage below the select voltage applied to the selected second conductive line. The control circuit is configured to apply a select voltage to the selected second conductive line while the drive transistor drives the write current to the selected first conductive line. The control circuit is configured to apply a second gate voltage to the gate of the drive transistor to cause the drive transistor to drive the write current to the selected first conductive line, wherein the selected first conductive line is driven to a voltage below the select voltage applied to the selected second conductive line, wherein the first gate voltage has a lower magnitude than the second gate voltage.

In an eighth embodiment, in furtherance of any of the first to seventh embodiments, the control circuit is configured to apply the first overdrive voltage to the drive transistor to cause the drive transistor to drive the read current to the selected first conductive line during a read of a self-referenced read operation. The control circuit is configured to apply the second overdrive voltage to the drive transistor to cause the drive transistor to drive the write current to the selected first conductive line during a write of the self-referenced read operation when the two terminal selector is on.

In a ninth embodiment, in furtherance of any of the first to seventh embodiments, the control circuit is configured to apply the first overdrive voltage to the drive transistor to cause the drive transistor to drive the read current to the selected first conductive line during a read of a referenced read operation. The control circuit is configured to apply the second overdrive voltage to the drive transistor to cause the drive transistor to drive the write current to the selected first conductive line during a write of a write operation that is independent of the referenced read operation.

In a tenth aspect, in furtherance of either of the first to ninth embodiments, the control circuit is configured to apply the first overdrive voltage to the drive transistor to cause the drive transistor to drive the read current to the selected first conductive line to charge the selected first conductive line to a voltage that turns on the two terminal selector of the selected memory cell. The control circuit is configured to continue to apply the first overdrive voltage to the drive transistor to cause the drive transistor to drive the read current through a portion of the selected first conductive line, through the selected memory cell, and through a portion of the selected second conductive line while the two terminal selector of the selected memory cell remains on.

A further aspect includes a method of operating a cross-point memory array. The method comprises applying a first overdrive voltage having a first magnitude to a selected drive transistor to drive a read current to a selected word line to charge the selected word line to a voltage that turns on a threshold switching selector of a selected magnetoresistive random access memory (MRAM) cell in the cross-point memory array. The selected MRAM cell is connected between the selected word line and a selected bit line. The method comprises applying continuing to apply the first overdrive voltage to the selected drive transistor to pass the read current through a portion of the selected word line, through the selected MRAM cell, and through a portion of a selected bit line while the threshold switching selector remains on. The method comprises testing a condition of the selected MRAM cell in response to the passing the read current through the selected MRAM cell. The method comprises applying a second overdrive voltage having a second magnitude to the selected drive transistor to pass a write current through the portion of the selected word line, through the selected MRAM cell, and through the portion of the selected bit line while the threshold switching selector is on to program the MRAM cell to a target state. The second magnitude is greater than the first magnitude.

A further aspect includes a memory system, comprising a cross-point memory array comprising a plurality of first conductive lines, a plurality of second conductive lines, and a plurality of magnetoresistive random access memory (MRAM) cells, each respective MRAM cell connected between one of the first conductive lines and one of the second conductive lines. Each MRAM cell comprises an MRAM element and a threshold switching selector connected in series with the MRAM element. The memory system comprises current generation circuitry configured to generate a read current and a write current. The memory system comprises a plurality of current drivers. Each current driver is in communication with an associated first conductive line. Each current driver is configured to receive a read current from the current generation circuitry and to drive the read current into the associated first conductive line. Each current driver is configured to receive a write current from the current generation circuitry and to drive the write current into the associated first conductive line. The memory system comprises a control circuit in communication with the plurality of current drivers. The control circuit is configured to apply a first signal to a selected current driver to cause the selected current driver to drive the read current to a selected first conductive line during a self-referenced read (SRR) of a selected MRAM cell. The control circuit is configured to measure a voltage across the selected MRAM cell in response to the read current passing through the selected MRAM cell while the threshold switching selector of the selected MRAM cell is on during the SRR. The control circuit is configured apply a second signal to the selected current driver to cause the selected current driver to drive the write current to the selected first conductive line during the SRR, wherein the first signal causes the selected current driver to have a first resistance and the second signal causes the selected current driver to have a second resistance that is lower than the first resistance.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
a cross-point memory array comprising a plurality of first conductive lines, a plurality of second conductive lines, and a plurality of programmable resistance memory cells, each respective memory cell connected between one of the first conductive lines and one of the second conductive lines, wherein each memory cell comprises a programmable resistance memory element and a two terminal selector connected in series with the memory element;
one or more current sources configured to generate a read current and a write current;
decode and drive circuitry configured to select one of the first conductive lines among the plurality of first conductive lines, the decode and drive circuitry comprising a drive transistor configured to receive the read current and to drive the read current to the selected first conductive line and to receive the write current and to drive the write current to the selected first conductive line; and
a control circuit in communication with the one or more current sources, the decode and drive circuitry and the cross-point memory array, the control circuit configured to:
apply a first overdrive voltage to the drive transistor to cause the drive transistor to drive the read current to the selected first conductive line connected to a selected memory cell;
test a condition of the selected memory cell in response to the read current passing through the selected memory cell while the two terminal selector of the selected memory cell is on; and
apply a second overdrive voltage to the drive transistor to cause the drive transistor to drive the write current to the selected first conductive line to program the selected memory cell to a target state, wherein the first overdrive voltage has a lower magnitude than the second overdrive voltage.

2. The apparatus of claim 1, wherein the control circuit is further configured to:
float one or more of the first conductive lines that neighbor the selected first conductive line while the drive transistor drives the read current to the selected first conductive line.

3. The apparatus of claim 1, wherein the programmable resistance memory element comprises a magnetoresistive random access memory (MRAM) element.

4. The apparatus of claim 1, wherein the programmable resistance memory element comprises a phase change memory element.

5. The apparatus of claim 1, wherein the two terminal selector comprises an Ovonic Threshold Switch (OTS).

6. The apparatus of claim 1, wherein:
the drive transistor is a pull-up transistor; and
the control circuit is configured to apply a select voltage to a selected second conductive line among the plurality of second conductive lines connected to the selected memory cell while the drive transistor drives the read current to the selected first conductive line;
applying the first overdrive voltage comprises applying a first gate voltage to a gate of the drive transistor to cause the drive transistor to drive the read current to the selected first conductive line, wherein the selected first conductive line is driven to a voltage above the select voltage applied to the selected second conductive line;

the control circuit is configured to apply the select voltage to the selected second conductive line while the drive transistor drives the write current to the selected first conductive line; and applying the second overdrive voltage comprises applying a second gate voltage to the gate of the drive transistor to cause the drive transistor to drive the write current to the selected first conductive line, wherein the selected first conductive line is driven to a voltage above the select voltage applied to the selected second conductive line, wherein the first gate voltage has a greater magnitude than the second gate voltage.

7. The apparatus of claim 1, wherein:

the drive transistor is a pull-down transistor; and the control circuit is configured to apply a select voltage to a selected second conductive line connected to the selected memory cell while the drive transistor drives the read current to the selected first conductive line;

applying the first overdrive voltage comprises applying a first gate voltage to a gate of the drive transistor to cause the drive transistor to drive the read current to the selected first conductive line, wherein the selected first conductive line is driven to a voltage below the select voltage applied to the selected second conductive line;

the control circuit is configured to apply the select voltage to the selected second conductive line while the drive transistor drives the write current to the selected first conductive line; and applying the second overdrive voltage comprises applying a second gate voltage to the gate of the drive transistor to cause the drive transistor to drive the write current to the selected first conductive line, wherein the selected first conductive line is driven to a voltage below the select voltage applied to the selected second conductive line, wherein the first gate voltage has a lower magnitude than the second gate voltage.

8. The apparatus of claim 1, wherein the control circuit is configured to:

apply the first overdrive voltage to the drive transistor to cause the drive transistor to drive the read current to the selected first conductive line during a read of a self-referenced read operation; and apply the second overdrive voltage to the drive transistor to cause the drive transistor to drive the write current to the selected first conductive line during a write of the self-referenced read operation when the two terminal selector is on.

9. The apparatus of claim 1, wherein the control circuit is configured to:

apply the first overdrive voltage to the drive transistor to cause the drive transistor to drive the read current to the selected first conductive line during a read of a referenced read operation; and apply the second overdrive voltage to the drive transistor to cause the drive transistor to drive the write current to the selected first conductive line during a write of a write operation that is independent of the referenced read operation.

10. The apparatus of claim 1, wherein the control circuit is configured to:

apply the first overdrive voltage to the drive transistor to cause the drive transistor to drive the read current to the selected first conductive line to charge the selected first conductive line to a voltage that turns on the two terminal selector of the selected memory cell; and continue to apply the first overdrive voltage to the drive transistor to cause the drive transistor to drive the read current through a portion of the selected first conductive line, through the selected memory cell, and through a portion of a selected second conductive line while the two terminal selector of the selected memory cell remains on.

11. A method of operating a cross-point memory array, the method comprising:

generating a fixed magnitude read current;

providing an address to decode and drive circuitry to select a word line in the cross-point memory array for a read of a selected magnetoresistive random access memory (MRAM) cell connected between the selected word and a selected bit line;

receiving the fixed magnitude read current at a selected drive transistor in the decode and drive circuitry;

applying a first overdrive voltage having a first magnitude to the selected drive transistor to pass the received fixed magnitude read current to the selected word line to charge the selected word line to a voltage that turns on a threshold switching selector of the selected MRAM cell;

continuing to apply the first overdrive voltage to the selected drive transistor to pass the fixed magnitude read current through a portion of the selected word line, through the selected MRAM cell, and through a portion of a selected bit line while the threshold switching selector remains on;

testing a condition of the selected MRAM cell in response to passing the read current through the selected MRAM cell;

generating a fixed magnitude write current;

providing the address to the decode and drive circuitry to select the word line for a write of the selected MRAM cell;

receiving the fixed magnitude write current at the selected drive transistor; and applying a second overdrive voltage having a second magnitude to the selected drive transistor to pass the received write current through the portion of the selected word line, through the selected MRAM cell, and through the portion of the selected bit line while the threshold switching selector is on to program the MRAM cell to a target state, wherein the second magnitude is greater than the first magnitude.

12. The method of claim 11, wherein threshold switching selector comprises an Ovonic Threshold Switch (OTS).

13. The method of claim 11, further comprising:

floating an unselected word line that is a neighbor to the selected word line while applying the first overdrive voltage to the selected drive transistor.

14. The method of claim 11, wherein:

continuing to apply the first overdrive voltage to the selected drive transistor to pass the read current through the portion of the selected word line, through the selected MRAM cell, and through the portion of the selected bit line is performed during a first read of a self-referenced read operation; and applying the second overdrive voltage to the selected drive transistor to pass the write current through the portion of the selected word line, through the selected MRAM cell, and through the portion of the selected bit line is performed during a first write of the self-referenced read operation.

15. The method of claim 11, wherein:
continuing to apply the first overdrive voltage to the selected drive transistor to pass the read current through the portion of the selected word line, through the selected MRAM cell, and through the portion of the selected bit line is performed during a referenced read operation; and
applying the second overdrive voltage to the selected drive transistor to pass the write current through the portion of the selected word line, through the selected MRAM cell, and through the portion of the selected bit line is performed during a write operation that is independent of the referenced read operation.

16. A memory system, comprising:
a cross-point memory array comprising a plurality of first conductive lines, a plurality of second conductive lines, and a plurality of magnetoresistive random access memory (MRAM) cells, each respective MRAM cell connected between one of the first conductive lines and one of the second conductive lines, wherein each MRAM cell comprises an MRAM element and a threshold switching selector connected in series with the MRAM element;
current generation circuitry configured to generate a read current and a write current;
decode and drive circuitry having a plurality of current drivers, each current driver in communication with a respective associated first conductive line, each current driver configured to receive a read current from the current generation circuitry and to drive the read current into the respective associated first conductive line, each current driver configured to receive a write current from the current generation circuitry and to drive the write current into the respective associated first conductive line; and
a control circuit in communication with the decode and drive circuitry, the control circuit configured to:
provide an address to the decode and drive circuitry to select a first conductive line of the plurality of first conductive lines;
apply a first signal to a selected current driver of the plurality of current drivers to cause the selected current driver to drive the read current to the selected first conductive line during a self-referenced read (SRR) of a selected MRAM cell connected to the selected first conductive line;
measure a voltage across the selected MRAM cell in response to the read current passing through the selected memory cell while the threshold switching selector of the selected MRAM cell is on during the SRR; and
apply a second signal to the selected current driver to cause the selected current driver to drive the write current to the selected first conductive line during the SRR, wherein the first signal causes the selected current driver to have a first resistance and the second signal causes the selected current driver to have a second resistance that is lower than the first resistance.

17. The memory system of claim 16, wherein the control circuit is further configured to:
float a first conductive line that is a neighbor to the selected first conductive line while driving the read current to the selected first conductive line.

18. The memory system of claim 16, wherein the threshold switching selector comprises an Ovonic Threshold Switch (OTS).

19. The memory system of claim 16, wherein each current driver comprises:
a drive transistor configured to pass the read current from the current generation circuitry to a respective associated selected first conductive line and to pass the write current from the current generation circuitry to the respective associated selected first conductive line, wherein the control circuit is configured to:
apply a first overdrive voltage to a selected drive transistor to cause the selected drive transistor to drive the read current to the selected first conductive line, wherein the first overdrive voltage causes the selected drive transistor to have the first resistance; and
apply a second overdrive voltage to the selected drive transistor to cause the selected drive transistor to drive the write current to the selected first conductive line, wherein the second overdrive voltage causes the selected drive transistor to have the second resistance that is lower than the first resistance.

20. The memory system of claim 16, wherein the control circuit is configured to:
apply the first signal to the selected current driver to cause the selected current driver to drive the read current to the selected first conductive line to charge the selected first conductive line to a voltage that turns on the threshold switching selector of the selected MRAM cell; and
continue to apply the first signal to the selected current driver to cause the selected current driver to drive the read current through a portion of the selected first conductive line, through the selected MRAM cell, and through a portion of a selected second conductive line while the threshold switching selector of the selected MRAM cell remains on.

* * * * *